(12) United States Patent
Martin et al.

(10) Patent No.: US 8,252,164 B2
(45) Date of Patent: Aug. 28, 2012

(54) METHODS FOR NANOWIRE ALIGNMENT AND DEPOSITION

(75) Inventors: Samuel Martin, Cupertino, CA (US); Xiangfeng Duan, Mountain View, CA (US); Katsumasa Fujii, Yamatokoriyama (JP); James M. Hamilton, Sunnyvale, CA (US); Hiroshi Iwata, Nara (JP); Francisco Leon, Palo Alto, CA (US); Jeffrey Miller, Los Altos Hills, CA (US); Tetsu Negishi, Sunnyvale, CA (US); Hiroshi Ohki, Tokyo (JP); J. Wallace Parce, Palo Alto, CA (US); Cheri X. Y. Pereira, Fremont, CA (US); Paul John Schuele, Washougal, WA (US); Akihide Shibata, Santa Clara, CA (US); David P. Stumbo, Belmont, CA (US); Yasunobu Okada, Gifu (JP)

(73) Assignees: Nanosys, Inc., Palo Alto, CA (US); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/113,680

(22) Filed: May 23, 2011

(65) Prior Publication Data

US 2011/0284380 A1    Nov. 24, 2011

Related U.S. Application Data

(62) Division of application No. 11/979,949, filed on Nov. 9, 2007, now Pat. No. 7,968,474.

(51) Int. Cl.
*C25D 13/02* (2006.01)
(52) U.S. Cl. .......................... 204/622; 204/477; 977/883
(58) Field of Classification Search .............. 257/9, 401, 257/E21.003, E21.536; 438/800; 977/701, 977/707, 708, 742, 762, 857, 882, 883, 948; 204/477, 622
See application file for complete search history.

(56) References Cited

U.S. PATENT DOCUMENTS

| 3,873,359 A | 3/1975 | Lando |
| 3,873,360 A | 3/1975 | Lando |

(Continued)

FOREIGN PATENT DOCUMENTS

EP    1087413    3/2001

(Continued)

OTHER PUBLICATIONS

First Non-Final Office Action for U.S. Appl. No. 11/979,949, Martin et al., filed Sep. 9, 2007, mailed Sep. 11, 2009.

(Continued)

*Primary Examiner* — Julio J Maldonado
*Assistant Examiner* — Daniel Shook
(74) *Attorney, Agent, or Firm* — Sterne, Kessler, Goldstein & Fox P.L.L.C.

(57) ABSTRACT

The present invention provides methods and systems for nanowire alignment and deposition. Energizing (e.g., an alternating current electric field) is used to align and associate nanowires with electrodes. By modulating the energizing, the nanowires are coupled to the electrodes such that they remain in place during subsequent wash and drying steps. The invention also provides methods for transferring nanowires from one substrate to another in order to prepare various device substrates. The present invention also provides methods for monitoring and controlling the number of nanowires deposited at a particular electrode pair, as well as methods for manipulating nanowires in solution.

36 Claims, 37 Drawing Sheets

U.S. PATENT DOCUMENTS

| | | | |
|---|---|---|---|
| 3,900,614 A | 8/1975 | Lando |
| 4,673,474 A | 6/1987 | Ogawa |
| 4,939,556 A | 7/1990 | Eguchi et al. |
| 5,023,139 A | 6/1991 | Birnboim et al. |
| 5,089,545 A | 2/1992 | Pol |
| 5,252,835 A | 10/1993 | Lieber et al. |
| 5,274,602 A | 12/1993 | Glenn |
| 5,453,970 A | 9/1995 | Rust et al. |
| 5,475,341 A | 12/1995 | Reed |
| 5,512,131 A | 4/1996 | Kumar et al. |
| 5,524,092 A | 6/1996 | Park |
| 5,537,075 A | 7/1996 | Miyazaki |
| 5,539,214 A | 7/1996 | Lynch et al. |
| 5,581,091 A | 12/1996 | Moskovits et al. |
| 5,589,692 A | 12/1996 | Reed |
| 5,607,876 A | 3/1997 | Biegelsen et al. |
| 5,620,850 A | 4/1997 | Bamdad et al. |
| 5,640,343 A | 6/1997 | Gallagher et al. |
| 5,690,807 A | 11/1997 | Clark, Jr. et al. |
| 5,726,524 A | 3/1998 | Debe |
| 5,739,057 A | 4/1998 | Tiwari et al. |
| 5,747,180 A | 5/1998 | Miller et al. |
| 5,751,018 A | 5/1998 | Alivisatos et al. |
| 5,751,156 A | 5/1998 | Muller et al. |
| 5,776,748 A | 7/1998 | Singhvi et al. |
| 5,824,470 A | 10/1998 | Baldeschwieler et al. |
| 5,830,538 A | 11/1998 | Gates et al. |
| 5,840,435 A | 11/1998 | Lieber et al. |
| 5,847,565 A | 12/1998 | Narayanan |
| 5,858,862 A | 1/1999 | Westwater et al. |
| 5,864,823 A | 1/1999 | Levitan |
| 5,897,945 A | 4/1999 | Lieber et al. |
| 5,900,160 A | 5/1999 | Whitesides et al. |
| 5,903,010 A | 5/1999 | Flory et al. |
| 5,908,692 A | 6/1999 | Hamers et al. |
| 5,916,642 A | 6/1999 | Chang |
| 5,942,443 A | 8/1999 | Parce et al. |
| 5,990,479 A | 11/1999 | Weiss et al. |
| 5,997,832 A | 12/1999 | Lieber et al. |
| 6,036,774 A | 3/2000 | Lieber et al. |
| 6,038,060 A | 3/2000 | Crowley |
| 6,048,616 A | 4/2000 | Gallagher et al. |
| 6,060,121 A | 5/2000 | Hidber et al. |
| 6,060,724 A | 5/2000 | Flory et al. |
| 6,069,380 A | 5/2000 | Chou et al. |
| 6,123,819 A | 9/2000 | Peeters |
| 6,128,214 A | 10/2000 | Kuekes et al. |
| 6,136,156 A | 10/2000 | El-Shall et al. |
| 6,143,184 A | 11/2000 | Martin et al. |
| 6,149,819 A | 11/2000 | Martin et al. |
| 6,159,742 A | 12/2000 | Lieber et al. |
| 6,180,239 B1 | 1/2001 | Whitesides et al. |
| 6,187,165 B1 | 2/2001 | Chien et al. |
| 6,190,634 B1 | 2/2001 | Lieber et al. |
| 6,203,864 B1 | 3/2001 | Zhang et al. |
| 6,207,392 B1 | 3/2001 | Weiss et al. |
| 6,211,464 B1 | 4/2001 | Mochizuki et al. |
| 6,225,198 B1 | 5/2001 | Alivisatos et al. |
| 6,231,744 B1 | 5/2001 | Ying et al. |
| 6,256,767 B1 | 7/2001 | Kuekes et al. |
| 6,270,074 B1 | 8/2001 | Rasmussen et al. |
| 6,278,231 B1 | 8/2001 | Iwasaki et al. |
| 6,286,226 B1 | 9/2001 | Jin |
| 6,287,765 B1 | 9/2001 | Cucciotti |
| 6,306,736 B1 | 10/2001 | Alivisatos et al. |
| 6,314,019 B1 | 11/2001 | Keukes et al. |
| 6,325,904 B1 | 12/2001 | Peeters |
| 6,333,200 B1 | 12/2001 | Kaler et al. |
| 6,340,822 B1 | 1/2002 | Brown et al. |
| 6,346,189 B1 | 2/2002 | Dai et al. |
| 6,355,198 B1 | 3/2002 | Kim et al. |
| 6,358,643 B1 | 3/2002 | Katz et al. |
| 6,359,288 B1 | 3/2002 | Ying et al. |
| 6,413,489 B1 | 7/2002 | Ying et al. |
| 6,437,329 B1 | 8/2002 | Yedur et al. |
| 6,459,095 B1 | 10/2002 | Heath et al. |
| 6,465,132 B1 | 10/2002 | Jin |
| 6,468,657 B1 | 10/2002 | Hou et al. |
| 6,468,677 B1 | 10/2002 | Benton et al. |
| 6,503,375 B1 | 1/2003 | Maydan et al. |
| 6,528,020 B1 | 3/2003 | Dai et al. |
| 6,536,106 B1 * | 3/2003 | Jackson et al. ............ 29/872 |
| 6,538,367 B1 | 3/2003 | Choi et al. |
| 6,559,468 B1 | 5/2003 | Kuekes et al. |
| 6,586,095 B2 | 7/2003 | Wang et al. |
| 6,628,053 B1 | 9/2003 | Den et al. |
| 6,687,987 B2 | 2/2004 | Mayer et al. |
| 6,716,409 B2 | 4/2004 | Hafner et al. |
| 6,720,728 B2 | 4/2004 | Den et al. |
| 6,741,019 B1 | 5/2004 | Filas et al. |
| 6,743,408 B2 | 6/2004 | Lieber et al. |
| 6,756,025 B2 | 6/2004 | Colbert et al. |
| 6,756,795 B2 | 6/2004 | Hunt et al. |
| 6,762,056 B1 | 7/2004 | Peeters |
| 6,781,166 B2 | 8/2004 | Lieber et al. |
| 6,787,769 B2 | 9/2004 | Nakayama et al. |
| 6,803,840 B2 | 10/2004 | Hunt et al. |
| 6,808,746 B1 | 10/2004 | Dai et al. |
| 6,815,706 B2 | 11/2004 | Li et al. |
| 6,846,565 B2 | 1/2005 | Korgel et al. |
| 6,846,682 B2 | 1/2005 | Heath et al. |
| 6,872,645 B2 | 3/2005 | Duan et al. |
| 6,878,871 B2 | 4/2005 | Scher et al. |
| 6,882,051 B2 | 4/2005 | Majumdar et al. |
| 6,882,767 B2 | 4/2005 | Yang et al. |
| 6,900,479 B2 | 5/2005 | DeHon et al. |
| 6,902,720 B2 | 6/2005 | McGimpsey |
| 6,903,015 B2 | 6/2005 | Matsui et al. |
| 6,936,761 B2 | 8/2005 | Pichler |
| 6,946,197 B2 | 9/2005 | Yadav et al. |
| 6,958,216 B2 | 10/2005 | Kelley et al. |
| 6,962,823 B2 | 11/2005 | Empedocles et al. |
| 6,963,077 B2 | 11/2005 | DeHon et al. |
| 6,974,706 B1 | 12/2005 | Melker et al. |
| 6,996,147 B2 | 2/2006 | Majumdar et al. |
| 7,039,619 B2 | 5/2006 | Nugent |
| 7,048,903 B2 | 5/2006 | Colbert et al. |
| 7,051,945 B2 | 5/2006 | Empedocles et al. |
| 7,052,861 B2 | 5/2006 | Massey et al. |
| 7,057,881 B2 | 6/2006 | Chow et al. |
| 7,064,372 B2 | 6/2006 | Duan et al. |
| 7,067,328 B2 | 6/2006 | Dubrow et al. |
| 7,067,867 B2 | 6/2006 | Duan et al. |
| 7,068,898 B2 | 6/2006 | Buretea et al. |
| 7,073,157 B2 | 7/2006 | DeHon et al. |
| 7,087,833 B2 | 8/2006 | Scher et al. |
| 7,091,120 B2 | 8/2006 | Buretea et al. |
| 7,105,428 B2 | 9/2006 | Pan et al. |
| 7,115,971 B2 | 10/2006 | Stumbo et al. |
| 7,129,554 B2 | 10/2006 | Lieber et al. |
| 7,132,275 B2 | 11/2006 | Reich et al. |
| 7,135,728 B2 | 11/2006 | Duan et al. |
| 7,151,209 B2 | 12/2006 | Empedocles et al. |
| 7,163,659 B2 | 1/2007 | Stasiak et al. |
| 7,172,953 B2 | 2/2007 | Lieber et al. |
| 7,186,355 B2 | 3/2007 | Swager |
| 7,189,435 B2 | 3/2007 | Tuominen et al. |
| 7,190,049 B2 | 3/2007 | Tuominen et al. |
| 7,211,464 B2 | 5/2007 | Lieber et al. |
| 7,232,460 B2 | 6/2007 | Van Erlach et al. |
| 7,254,151 B2 | 8/2007 | Lieber et al. |
| 7,256,466 B2 | 8/2007 | Lieber et al. |
| 7,301,199 B2 | 11/2007 | Lieber et al. |
| 7,303,875 B1 | 12/2007 | Bock et al. |
| 7,323,143 B2 | 1/2008 | Anderson et al. |
| 7,385,262 B2 | 1/2008 | O'Keeffe et al. |
| 7,339,184 B2 | 3/2008 | Romano et al. |
| 7,344,961 B2 | 3/2008 | Romano et al. |
| 7,381,316 B1 * | 6/2008 | Lee et al. ............ 204/483 |
| 7,385,267 B2 | 6/2008 | Lieber et al. |
| 7,449,757 B2 | 11/2008 | Bradley et al. |
| 7,857,956 B2 | 12/2010 | Burke et al. |
| 7,951,698 B2 | 5/2011 | Moon et al. |
| 7,968,474 B2 | 6/2011 | Martin et al. |
| 2002/0005876 A1 | 1/2002 | Grimes et al. |
| 2002/0013031 A1 | 1/2002 | Chen et al. |
| 2002/0084502 A1 | 7/2002 | Jang et al. |

| | | | |
|---|---|---|---|
| 2002/0130311 A1 | 9/2002 | Lieber et al. | |
| 2002/0146714 A1 | 10/2002 | Lieber et al. | |
| 2002/0179434 A1 | 12/2002 | Dai et al. | |
| 2003/0048619 A1 | 3/2003 | Kaler et al. | |
| 2003/0073071 A1 | 4/2003 | Fritz et al. | |
| 2003/0113713 A1 | 6/2003 | Glezer et al. | |
| 2003/0113940 A1 | 6/2003 | Erlanger et al. | |
| 2003/0124717 A1 | 7/2003 | Awano et al. | |
| 2003/0134267 A1 | 7/2003 | Kang et al. | |
| 2003/0134433 A1 | 7/2003 | Gabriel et al. | |
| 2003/0189202 A1 | 10/2003 | Li et al. | |
| 2004/0026684 A1 | 2/2004 | Empedocles | |
| 2004/0067530 A1 | 4/2004 | Gruner | |
| 2004/0112964 A1 | 6/2004 | Empedocies et al. | |
| 2004/0136866 A1 | 7/2004 | Pontis et al. | |
| 2004/0146560 A1 | 7/2004 | Whiteford et al. | |
| 2004/0157414 A1 | 8/2004 | Gole et al. | |
| 2004/0188721 A1 | 9/2004 | Lieber et al. | |
| 2005/0029678 A1 | 2/2005 | Hanrath et al. | |
| 2005/0037374 A1 | 2/2005 | Melker et al. | |
| 2005/0064731 A1 | 3/2005 | Park et al. | |
| 2005/0072213 A1 | 4/2005 | Besnard et al. | |
| 2005/0079533 A1 | 4/2005 | Samuelson et al. | |
| 2005/0079659 A1 | 4/2005 | Duan et al. | |
| 2005/0100960 A1 | 5/2005 | Dai et al. | |
| 2005/0101026 A1 | 5/2005 | Sailor et al. | |
| 2005/0109989 A1 | 5/2005 | Whiteford et al. | |
| 2005/0161662 A1 | 7/2005 | Majumdar et al. | |
| 2005/0201149 A1 | 9/2005 | Duan et al. | |
| 2005/0202615 A1 | 9/2005 | Duan et al. | |
| 2005/0249667 A1 | 11/2005 | Tuszynski et al. | |
| 2005/0253137 A1 | 11/2005 | Whang et al. | |
| 2005/0256816 A1 | 11/2005 | Nugent | |
| 2005/0287717 A1 | 12/2005 | Heald et al. | |
| 2006/0054936 A1 | 3/2006 | Lieber et al. | |
| 2006/0105513 A1 | 5/2006 | Afzali-Ardakani et al. | |
| 2006/0160246 A1 | 7/2006 | Massey et al. | |
| 2006/0175601 A1 | 8/2006 | Lieber et al. | |
| 2006/0188774 A1 | 8/2006 | Niu et al. | |
| 2006/0237749 A1 | 10/2006 | Lieber et al. | |
| 2006/0239688 A1 | 10/2006 | Hillis et al. | |
| 2006/0269927 A1 | 11/2006 | Lieber et al. | |
| 2007/0026645 A1 | 2/2007 | Lieber et al. | |
| 2007/0032023 A1 | 2/2007 | Lieber et al. | |
| 2007/0032051 A1 | 2/2007 | Lieber et al. | |
| 2007/0032052 A1 | 2/2007 | Lieber et al. | |
| 2007/0045667 A1 | 3/2007 | Lieber et al. | |
| 2007/0048492 A1 | 3/2007 | Lieber et al. | |
| 2007/0161237 A1 | 7/2007 | Lieber et al. | |
| 2007/0252136 A1 | 11/2007 | Lieber et al. | |
| 2007/0264623 A1 | 11/2007 | Wang et al. | |
| 2007/0281156 A1 | 12/2007 | Lieber et al. | |
| 2008/0116491 A1 | 5/2008 | Lieber et al. | |

FOREIGN PATENT DOCUMENTS

| | | | |
|---|---|---|---|
| JP | 11-11917 | 1/1999 | |
| JP | 2000-31462 | 1/2000 | |
| WO | WO 91/06036 | 5/1991 | |
| WO | WO 95/02709 | 1/1995 | |
| WO | WO 96/29629 | 9/1996 | |
| WO | WO 97/33737 | 9/1997 | |
| WO | WO 97/34025 | 9/1997 | |
| WO | WO 98/39250 | 9/1998 | |
| WO | WO 98/42620 | 10/1998 | |
| WO | WO 98/48456 | 10/1998 | |
| WO | WO 99/63347 | 12/1999 | |
| WO | WO 00/09443 | 2/2000 | |
| WO | WO 00/17101 | 3/2000 | |
| WO | WO 00/19494 | 4/2000 | |
| WO | WO 00/51186 | 8/2000 | |
| WO | WO 01/01208 | 1/2001 | |
| WO | WO 01/03208 | 1/2001 | |
| WO | WO 01/44796 | 6/2001 | |
| WO | WO 02/17362 | 2/2002 | |
| WO | WO 02/31183 | 4/2002 | |
| WO | WO 02/48701 | 6/2002 | |
| WO | WO 02/080280 | 10/2002 | |
| WO | WO 02/086480 | 10/2002 | |
| WO | WO 03/005450 | 1/2003 | |
| WO | WO 03/016901 | 2/2003 | |
| WO | WO 03/053851 | 7/2003 | |
| WO | WO 03/054931 | 7/2003 | |
| WO | WO 03/063208 | 7/2003 | |
| WO | WO 2004/003535 | 1/2004 | |
| WO | WO 2004/010552 | 1/2004 | |
| WO | WO 2004/032190 | 4/2004 | |
| WO | WO 2004/032193 | 4/2004 | |
| WO | WO 2004/034025 | 4/2004 | |
| WO | WO 2004/038767 | 5/2004 | |
| WO | WO 2005/114282 | 2/2005 | |
| WO | WO 2005/030636 A2 | 7/2005 | |
| WO | WO 2005/089165 | 9/2005 | |
| WO | WO 2005/093831 | 10/2005 | |
| WO | WO 2005/094440 | 10/2005 | |
| WO | WO 2006/107312 | 10/2006 | |
| WO | WO 2006/132659 | 12/2006 | |
| WO | WO 2007/044034 | 4/2007 | |

OTHER PUBLICATIONS

Second Non-Final Office Action for U.S. Appl. No. 11/979,949, Martin et al., filed Sep. 9, 2007, mailed Feb. 16, 2010.

Third Non-Final Office Action for U.S. Appl. No. 11/979,949, Martin et al., filed Sep. 9, 2007, mailed Aug. 2, 2010.

Final Office Action for U.S. Appl. No. 11/979,949, Martin et al., filed Sep. 9, 2007, mailed Dec. 30, 2010.

Kong, J., et al., "Chemical vapor deposition of methane for single-walled carbon nanotubes," *Chem. Phys. Lett.* 292:567-574, North Holland (1998).

Kong, J., et al., "Nanotube Molecular Wires as Chemical Sensors," *Science* 287:622-625, American Association for the Advancement of Science (2000).

Yamamoto Kunitoshi, "Orientation and Purification of Carbon Nanotubes using AC Electrophoresis," *Journal of Physics D: Applied Physics*, L34-L36, IOP Publishing Ltd. (1998).

Beckman, R., et al., "Bridging Dimensions: Demultiplexing ultrahigh-density nanowire circuits," *Science* 310:465-468, American Association for the Advancement of Science (Oct. 2005).

Björk, et al., "One-dimensional steeplechase for electrons realized," *Nano Lett.* 2:87-89, American Chemical Society (2002).

Cao, et al., "Growth and properties of semiconductor core/shell nanocrystals with InAs cores," *J. Am. Chem. Soc. 122*:9692-9702, American Chemical Society (2000).

Castellanos, et al., "Electrohydrodynamics and dielectrophoresis in microsystems: scaling laws," *J. Phys. D. Appl. Phys.* 36:2584-2597, Insitute of Physics and the Physical Society (2003).

Cui et al., "Doping and electrical transport in silicon nanowires," *J. Phys. chem. B 104*:5213-5216, American Chemical Society (2000).

Cui, et al., "Diameter-controlled synthesis of single-crystal silicon nanowires," *Appl. Phys. Lett.* 78:2214-2216, American Institute of Physics (2001).

Dabbousi, et al., "(CdSe)ZnS core-Shell quantum dots: Synthesis and characterization of a size series of highly luminescent nanocrysallites," *J. Phys. Chem. B 101*: 9463-9475, American Chemical Society (1997).

Duan, et al., "General synthesis of compound semiconductor nanowires," *Adv. Mater. 12*:298-302, VCH Publishers (2000).

Fan, et al., "Manipulation of nanowires in suspension by ac electric fields," *Appl. Phys. Lett.* 85:4175-4177, American Institute of Physics (2004).

Gudiksen, et al., "Diameter-selective synthesis of semiconductor nanowires," *J. Am. Chem. Soc. 122*:8801-8802, American Chemical Society (2000).

Gudiksen, et al., "Synthetic control of the diameter and length of single crystal semiconductor nanowires," *J. Phys. Chem. B 105*:4062-4064, American Chemical Society (2001).

Gudiksen, et al., "growth of nanowire superlattice structures for nanoscale photonics and electronics," *Nature 415*:617-620, Nature Publishing Group (2002).

Guru, B.S. and Hiziroğlu, H.R., eds., "Chapter 10: Waveguides and cavity resonators" in *Electromagnetic Field theory Fundamentals*, PWS Publishing Company, Boston, MA, pp. 433-472 (1998).

Hamers, R.J., et al., "Electrically directed assembly and detection of nanowire bridges in aqueous media," *Nanotechnology 17*:S280-286, IOP Publishing (May 2006).

Hu, Z., et al., "Electric-filed-driven accumulation and alignment of CdSe and CdTe Nanorods in Nanoscale Devices," *Nano Lett. 6*:2585-2591, American Chemical Society (Nov. 2006).

Jun, et al., "Controlled synthesis of multi-armed CdS nanorod architectures using monosurfactant system," *J. Am. Chem. Soc. 123*:5150-5151, American Chemical Society (2001).

Liu, et al., "Sol-Gel Synthesis of Free-Standing Ferroelectric Lead Zirconate Titanate Nanoparticles," *J. Am. Chem. Soc. 123*:4344-4345, American Chemical Society (2001).

Lu, S., et al., "Controlled deposition of nanotubes on opposing electrodes," *Nanotechnology 16*:1765-1770, IOP Publishing (Jul. 2005).

Manna et al., "Synthesis of Soluble and Processable Rod-,Arrow-, Teardrop-, and Tetrapod-Shaped CdSe Nanocrystals" *J. Am. Chem. Soc. 122*:12700-12706, American Chemical Society (2000).

Manna, et al., "Epitazial growth and photochemical annealing of graded CdS/ZnS shells on colloidal CdSe nanorods," *J. Am. Chem. Soc. 124*:7136-7145, American Chemical Society (2002).

Morales, et al., "A laser ablation method for the synthesis of crystalline semiconductor nanowires," *Science 279*:208-211, American Association for the Advancement of Science (1998).

Peng, et al., "Epitaxial growth of highly luminescent CdSe/CdS core/shell nanocrystals with photostability and electronic accessibility," *J. Am. Chem. Soc. 119*:7019-7029, American Chemical Society (1997).

Peng, et al., "Shape Control of CdSe Nanocrystals," *Nature 404*:59-61, Nature Publishing Group (2000).

Puntes, et al., "Colloidal nanocrystal shape and size control: The case of cobalt," *Science 291*: 2115-2117, American Association for the Advancement of Science (2001).

Smith, et al., "Electric-field assisted assembly and alignment of metallic nanowires," *Appl. Phys. Lett. 77*:1399-1401, American Institute of Physics (2000).

Urban, et al., "Synthesis of single-crystalline perovskite nanowires composed of barium titanate and strontium titanate," *J. Am. Chem. Soc. 124*:1186-1187, American Chemical Society (2002).

Wu, et al., "Block-by-block growth of single-crystalline Si/SiGe superlattice nanowires," *Nano Lett. 2*:83-86, American Chemical Society (2002).

Yun, et al., "Ferroelectric Properties of Individual Barium, Titanate Nanowires Investigated by Scanned Probe Microscopy," *Nanoletters 2*:447-450 (2002).

Agarwal, et al., "Lasing in single Cadmium Sulfide Nanowire Optical Cavities," *Nano-Lett. 5*: 917-920, American Chemical Society (2005).

Chen, J., et al., "Large On-Off Ratios and Negative Differential Resistance in a Molecular Electronic Device," *Science 286*:1550-1551, American Association for the Advancement of Science (1999).

Chen, R., et al., "Noncovalent Functionalization of carbon nanotubes for highly specific electronic biosensors," *Pro. Natl. Acad. Sci. U.S.A. 100*: 4984-4989, National Academy of Sciences (2003).

Cheung, C.L., et al., "Diameter Controlled Synthesis of Carbon Nanotubes," *J. Phys. Chem. B 106*:2429-2433, American Chemical Society (2002).

Choi, K.J., et al., "Enhancement of Ferroelectricity in Strained BaTiO3 Thin Films," *Science 306*:1005-1009, American Chemical Society (2004).

Chung, S., et al., "Silicon nanowire devices," *Appl. Phys. Lett. 76*:2068-2070, American Institute of Physics (2000).

Collier, C.P., et al., "Electronically Configurable Molecular-Based Logic Gates,"*Science 285*:391-394, American Association for the Advancement of Science (1999).

Cui, V., et al. "Doping and Electrical Transport in Silicon Nanowires,"*J. Phys. Chem. B. 104*:5213-5216; American Chemical Society (2000).

Cui, V., et al., "Diameter-controlled synthesis of single-crystal silicon nanowires," *Appl. Phys. Lett. 78*:2214-2216, American Institute of Physics (2001).

Cui, Y., et al., "Functional Nanoscale Electronic Devices Assembled Using Silicon Nanowire Building Blocks," *Science 291*:851-853, American Association for the Advancement of Science (2001).

Cui, Y., et al., "Nanowire Nanosensors for Highly Sensitive and Selective Detection of Biological and Chemical Species," *Science 293*:1289-1292, American Chemical Society (2001).

Duan, X., et al., "Synthesis and optical properties of gallium arsenide nanowires," *Appl. Phys. Lett. 76*:1116-1118, American Institute of Physics (2000).

Duan, X., et al., "Indium phosphide nanowires as building blocks for nanoscale electronic and optoelectronic devices," *Nature 409*:66-69, Nature Publishing Group (2001).

Duan, X., et al., "General Synthesis of Compound Semiconductor Nanowires" *Adv. Mater. 12*:298-302, Wiley (2000).

Duan, X., et al., "High-performance thin-film transistors using semiconductor nanowires and nanoribbons," *Nature 425*:274-278, Nature Publishing Group (2003).

Duan, X., et al., "Laser-Assisted Catalytic Growth of Single Crystal GaN Nanowires," *J. Am. Chem. Soc. 122*:188-189, American Chemical Society (2000).

Duan, X., et al., "Nonvolatile Memory and Programmable Logic from Molecule-Gated Nanowires," *Nano Lett. 2*:487-490, American Chemical Society (2002).

Duan, X., et al., "Single-nanowire electrically driven lasers," *Nature 421*:241-245, Nature Publishing Group (2003).

Esfarjani, K., et al., "Electronic and transport properties of N-P doped nanotubes", *Appl. Phys. Lett. 74*:79-81, American Institute of Physics (1999).

Fan, D., et al., "Precision Transport and Positioning of Nanowires by Electric Fields," *2007 MRS Fall Meeting*, Abstract JJ5.3, Materials Research Society (Nov. 2007).

Friedman R., et al., "High-speed integrated nanowire circuits," *Nature 434*:1085, Nature Publishing Group (2005).

Givargizov, E.I., et al., "Fundamental Aspects of VLS Growth," *J. Crystal Growth 31*:20-30, North-Holland (1975).

Gradečak, F., et al., "GaN nanowire lasers with low lasing thresholds," *Appl. Phys. Lett. 87*:R173111, American Insitute of Physics (2005).

Gudiksen, M.S., et al., "Diameter-Selective Synthesis of Semiconductor Nanowires," *J. Am. Chem. Soc. 122*:8801-8802, American Chemical Society (2000).

Gudiksen, M.S., et al., "Growth of nanowire superlattice structures for nanoscale photonics and electronics," *Nature 415*:617-620, Nature Publishing Group (2002)

Gudiksen, M.S., et al., "Size-Dependent Photoluminescence from Single Indium Phosphide Nanowires," *J. Phys. Chem. B*, 106:4036-4039, American Chemical Society (2002)

Gudiksen, M.S., et al., "Synthetic Control of the Diameter and Length of Single Crystal Semiconductor Nanowires," *J. Phys. Chem. B 105*:4062-4064, American Chemical Society (2001).

Guo, L., et al., "A Silicon Single-Electron Transistor Memory Operating at Room Temperature," *Science 275*:649-651, Science Publishing Group (1997).

Guo, L., et al., "Nanoscale silicon field effect transistors fabricated using imprint lithography," *Appl. Phys. Lett. 71*:1881-1883, American Chemical Society (1997)

Hahm, J., and Lieber, C., "Direct Ultrasensitive Electrical Detection of DNA and DNA Sequence Variations Using Nanowire Nanosensors," *Nano. Lett. 4*:51-54, American Chemical Society (2003).

Haraguchi, K., et al., "GaAs p-n junction formed in quantum wire crystals," *Appl. Phys. Lett. 60*:745-747, American Institute of Physics (1992)

Haraguchi, K., et al., "Polarization dependence of light emitted from GaAs p-n junctions in quantum wire crystals," *J. Appl. Phys. 75*:4220-4225, American Institute of Physics (1994).

Heath, J., et al., "A liquid solution synthesis of single crystal germanium quantum wires," *Chem. Phys. Lett. 208*:263-265, North Holland (1993).

Hiruma, K., et al., "GaAs free-standing quantum-size wires," *J. Appl. Phys. 74*:3162-3171, American Institute of Physics (1993).

Hiruma, K., et al., "Self-organized growth of GaAs/InAs heterostructure nanocylinders by organometallic vapor phase epitaxy," *J. Crystal Growth 163*:226-231, North-Holland (1996).

Holmes, J., et al., "Control of Thickness and Orientation of Solution-Grown Silicon Nanowires," *Science 287*:1471-1473, American Association for the Advancement of Science (2000).

Hsu, S.T., et al., "MFMox Ferroelectric Memory Transistor," *Non-Volatile Memory Technology Symposium* 24-27, Electron Devices Society (2004).

Hu, J., et al., "Chemistry and Physics in One Dimension: Synthesis and Properties of Nanowires and Nanotubes," *Acc. Chem. Res.* 32:435-445, American Chemical Society (1999).

Hu, J., et al., "Controlled growth and electrical properties of heterojunctions of carbon nanotubes and silicon nanowires," *Nature* 399:48-51, Nature Publishing Group (1999).

Hu, S., et al., "Serpentine Superlattice nanowire-Array Lasers," *Quant. Elect.* 31:1380-1388, Turpion (1995).

Huang, M., et al., "Room-Temperature Ultraviolet Nanowires Nanolasers," *Science* 292:1897-1898, American Association for the Advancement of Science (2001).

Huang, Y., et al., "Directed Assembly of One-dimensional Nanostructures into Functional Networks," *Science* 291:630-633, American Association for the Advancement of Science (2001).

Huang, Y., et al., "Gallium Nitride Nanowire Nanodevices," *Nano. Lett.* 2:101-104, American Chemical Society (2002).

Huang, Y., et al., "Logic Gates and Computation from Assembled Nanowire Building Blocks," *Science* 294:1313-1317, American Association for the Advancement of Science (2001).

Javey, A., et al., "Ballistic carbon nanotube field-effect transistors," *Nature* 424:654-657, Nature Publishing Group (2003).

Jin, S., et al., "Scalable Interconnection and Integration of Nanowire Devices without Registration," *Nano. Lett.* 4:915-919, American Chemical Society (2004).

Johnson, J.C., et al., "Single gallium nitride nanowire lasers," *Nat. Mater.* 1:106-110, Nature Publsing Group (2002).

Johnson, J.E., et al., "Single Nanowire Lasers," *J. Phys. Chem.* 105:11387-11390, American Chemical Society (2001).

Joselevich, E., et al., "Vertorial Growth of Metallic and Semiconducting Single-Wall Carbon Nanotubes," *Nano. Lett.* 2:1137-1141, American Chemical Society (2002).

Kanjanachvchal, S., et al., "Coulomb blockade in strained-Si nanowires on leaky virtual substrates," *Semi. Sci. Technol.* 16:72-76, IOP Publishing Limited (2001).

Kong, J., et al., "Synthesis of individual single-walled carbon nanotubes on patterned silicon wafers," *Nature* 395:878-881, Nature Publishing Group (1998).

Lahound, L., et al., "Epitaxial core-shell and core-multishell nanowire heterostructures," *Nature* 420:57-61, Nature Publishing Group (2002).

Lahound, L.J., et al., "Semiconductor nanowire heterostructures" *Phil. Trans. R. Soc. Lond.* 362:1247-1260, Royal Society (2004).

Law, M., et al., "Nanoribbon Waveguides for Subwavelength Photonics Integration," *Science* 305:1269-1273, Association of the Advancement of Science (2004).

Leff, D.V., et al., "Thermodynamic Control of Gold Nanocrystal Size: Experiment and Theory," *J. Phys. Chem.* 99:7036-7041, American Chemical Society (1995).

Lei, B., et al., "Nanowire Transistors with ferroelectric gate dielectrics: Enhanced performance and memory effect," *Appl. Phys. Lett.* 84:4553-4555, American Institute of Physics (2004).

Lieber, C., "Nanoscale Science and Technology: Building a Big Future from Small things," *MRS Bull.* 28:219-223, Materials Research Society (2003).

Lieber, C., "Nanowire Superlattices," *Nano Lett.* 2:81-82, American Chemical Society (2002).

Lu, W., et al., "One-dimensional hole gas in germanium/silicon nanowire heterostructures," *Proc. Natl. Acad. Sci. U.S.A.* 102:10046-10051, National Academy of Sciences (2005).

Martel, R., et al., "Single- and multi-wall carbon nanotube field-effect transistors," *Appl. Phys. Lett.* 73:2447-2449, American Institute of Physics (1998).

Mayer, T., et al., "Electric-field Directed Assembly of Nanowires for Heterogeneous Integration of On-chip Electronic Systems," *2007 MRS Fall Meeting*, Abstract JJ5.1, Materials Research Society (Nov. 2007).

McAlpine, M., "Nanoimprint Lithography for Hybrid Plastic Electronics," *Nano Lett.* 3:443-445, American Chemical Society (2003).

McAlpine M., et al., "High-Preformance Nanowire Electronics and Photonics on Glass and Plastic Substrates," *Nano Lett* 3:1531-1535, American Chemical Society (2003).

McAlpine, M.C., et al., "High-Preformance Nanowire Electronics and Photonics and Nanoscale Patterning on Flexible Plastic Substrates," *Proc IEEE* 93:1357-1363, IEEE Service Center (2005).

Menon, V.P. and Martin, C.R., "Fabrication and Evaluation of Nanoelectrode Ensembles," *Anal. Chem.* 67:1920-1928, American Chemical Society (1995).

Mizutani, T. and Ohno, Y., "Fabrication and characterization of carbon nanotube FETs," *Proc. SPIE* 5732:28-36, The International Society for Optical Engineering (2005).

Morales, A., and Lieber, M., et al., "A Laser Ablation Method for the Synthesis of Crystalline Semiconductor Nanowires," *Science* 279:208-211, American Association for the Advancement of Science (1998).

Musin, R. N., "Structural and electronic properties of epitaxial core-shell nanowire heterostructures," *Phys. Rev. B* 71:155318, The American Physical Society (2005).

Nosho, Y., "n-type carbon nanotube field-effect transistors fabricated by using Ca contact electrodes," *Appl. Phys. Lett.* 86:73105, American Insitute of Physics (2005).

Padeste, C., et al., "Modular Amperometric Immunosensor Devices" $8^{th}$ *Int'l Conf. Solid State Act. Euro. IX* 357:487-490, Found. Sensors & Actuator Techol (1995).

Papadakis, S.T., et al., "Controlled, Accurate Dielectrophoretic Assembly of Metallic Nanowires into Ordered Arrays," *2007 MRS Fall Meeting*, Abstract JJ5.2, Materials Research Society (Nov. 2007).

Patolsky, F. and Lieer, C., "Nanowire nanosensors," *Mat. Today* 1369:20-28, Elsevier Science (2005).

Patolsky, F., et al., "Electrical detection of single viruses," *Proc. Natl. Acad, Sci. U.S.A.* 101:14017-14022, National Academy of Sciences (2004).

Pavesi, L., et al., "Optical gain in silicon nanocrystals," *Nature* 408:440-444, Nature Publishing Group (2000)

Phanindra Sai S., et al., "Electric Field Directed Growth of Molecular Wires of Charge Transfer Molecules on Prefabricated Metal Electrodes," *2007 MRS Fall Meeting*, Abstract JJ5.3, Materials Research Society (Nov. 2007).

Qi, P., et al., "Toward Large Arrays of Multiplex Functionalized Carbon Nanotube Sensors for Highly Sensitive and Selective Molecular Detection," *Nano Lett.* 3:347-351, American Chemical Society (2003).

Rueckes, T., et al., "Carbon Nanotube-Based Nonvolatile Random Access Memory for Molecular Computing," *Science* 298:94-97, American Association for the Advancement of Science (2000).

Star, A., et al., "Preparation and Properties of Polymer-Wrapped Single-Walled Carbon Nanotubes," *Angew. Chem. Int. Ed. Engl.* 40:1721-1725, Wiley-VCH (2001).

Takayama, S., et al., "Patterning cells and their environments using multiple laminar fluid flows in capillary networks," *Proc. Natl. Acad Sci. U.S.A.* 96:5545-5548, National Academy of Sciences (1999).

Tans, S., et al., "Room-temperature transistor based on a single carbon nanotube," *Nature* 393:49-52, Nature Publishing Group (1998).

Whang, D., et al., "Nanolithographys Using Hierarchically Assembled Nanowire Masks," *Nano. Lett.* 3:951-954, American Chemical Society (2003).

Wolf, S., and Tauber, R., "vol. 1—Process Technology," in *Silicon Processing for the VLSI ERA, $2^{nd}$ Ed.*, Lattice Press, Sunset Beach, CA, pp. 12-13 (2000).

Wong, S., et al., "Covalently funtionalized nanotubes as nanometre-sized probes in chemistry and biology," *Nature* 394:52-55, Nature Publishing Group (1998).

Wu, Y., et al., "Block-by-Block Growth of Single-Crystalline Si/SiGe Superlattice Nanowires," *Nano. Lett.* 283-86, American Chemical Society (2002).

WU, Y., et al., "Controlled Growth and Structures of Molecular-Scale Silicon Nanowires," *Nano. Lett* 4:433-436, American Chemical Society (2004).

Wu, Y., et al., "Single-crystal metallic nanowires and metal/semiconductor nanowire heterostructures," *Nature* 430:61-65, Nature Publishing Group (2004).

Xiang, J., et al., "Ge/Si nanowire heterostructures as high-preformance field-effect transistors," *Nature 441*:489-493, Nature Publishing Group (2006).

Yamada, Y., et al., "Analysis of submicron carbon nanotube field-effect transistors," *Appl. Phys. Lett. 76*:628-630, American Institute of Physics (2000).

Yang, P., et al., "Wires on water," *Nature 425*:243-244, Nature Publishing Group (2003).

Yang, P., et al., "Controlled Growth of ZnO Nanowires and Their Optical Properties," *Adv. Funct. Mater. 12*:323-331, Wiley-VCH (2002).

Yu, D.P., et al., "Nanoscale silicon wires synthesized using simple physical evaporation," *Appl. Phys. Lett. 72*:3458-3460, American Institute of Physics (1998).

Yun, W.S., et al., "Ferroelectric Properties of Individual Barium Titanate Nanowires Investigated by Scanned Probe Microscopy," *Nano Lett. 2*:447-450, American Chemical Society (2002).

Zheng, G., "Synthesis and Fabrication of High-Preformance n-Type Silicon Nanowire Transistors," *Adv. Mater. 16*:1890-1893, Wiley-VCH (2004).

Zheng, G., et al., "Multiplexed electrical detection of cancer markers with nanowire sensor arrays," *Nat. Biotechnol. 23*1294-1301, Nature Publishing Group (2005).

Zhong, Z. "Coherent Single Charge Transport in Molecular-Scale Silicon Nanowires," *Nano. Lett. 5*:1143-1146, American Chemical Society (2005).

Zhong, Z., et al., "Nanowire Crossbar Arrays as Address Decoders for Integrated Nanosystems," *Science 302*:1377-1379, American Association for the Advancement of Science (2003).

Zhong, Z., et al., "Synthesis of p-Type gallium Nitride Nanowire for Electronic and Photonic Nanodevices," *Nano Lett. 3*:343-346, American Chemical Society (2003).

Zhou, G., et al., "Growth morpholgy and micro-structural aspects of Si nanowires synthesized by laser ablation," *J. Cryst. Grow 197*:129-135, North-Holland (1999).

"IBM Creates World's Highest Preforming Nanotube Transistors," IBM News, http://www.ibm.com/news/us/en/ (2002).

International Search Report for International Application No. PCT/US01/48230, mailed on Oct. 15, 2002, European Patent Office, Rijswijk, Netherlands.

International Search Report for International Application No. PCT/US03/22753, mailed on Nov. 17, 2003, European Patent Office, Rijswijk, Netherlands.

International Search Report for International Application No. PCT/US03/22061, mailed on Jun. 22, 2004, European Patent Office, Rijswijk, Netherlands.

International Search Report for International Application No. PCT/US2005/004459, mailed on Aug. 29, 2005, European Patent Office, Rijswijk, Netherlands.

International Search Report for International Application No. PCT/US2005/020974, mailed on Feb. 6, 2006, European Patent Office, Rijswijk, Netherlands.

International Search Report for International Application No. PCT/US2005/026759, mailed on Jun. 6, 2006, European Patent Office, Rijswijk, Netherlands.

International Search Report for International Application No. PCT/US2005/034345, mailed on Feb. 19, 2007, European Patent Office, Rijswijk, Netherlands.

First Non-Final Office Action for U.S. Appl. No. 09/935,776, Lieber, et al., filed Aug. 22, 2001, mailed Sep. 2, 2003.

First Final Office Action for U.S. Appl. No. 09/935,776, Lieber, et al., filed Aug. 22, 2001, mailed Sep. 15, 2004.

Second Non-Final Office Action for U.S. Appl. No. 09/935,776, Lieber, et al., filed Aug. 22, 2001, mailed Mar. 11, 2005.

Second Final Office Action for U.S. Appl. No. 09/935,776, Lieber, et al., filed Aug. 22, 2001, mailed Aug. 30, 2005.

Third Non-Final Office Action for U.S. Appl. No. 09/935,776, Lieber, et al., filed Aug. 22, 2001, mailed May 16, 2006.

First Non-Final Office Action for U.S. Appl. No. 10/020,004, Lieber, et al., filed Dec. 11, 2001, mailed Jan. 15, 2003.

First Final Office Action for U.S. Appl. No. 10/020,004, Lieber, et al., filed Dec. 11, 2001, mailed Jun. 25, 2004.

Second Non-Final Office Action for U.S. Appl. No. 10/020,004, Lieber, et al., filed Dec. 11, 2001, mailed Mar. 14, 2005.

Second Final Office Action for U.S. Appl. No. 10/020,004, Lieber, et al., filed Dec. 11, 2001, mailed Aug. 30, 2005.

First Non-Final Office Action for U.S. Appl. No. 10/196,337, Lieber, et al., filed Jul. 16, 2001, mailed Jun. 30, 2004.

First Final Office Action for U.S. Appl. No. 10/196,337, Lieber, et al., filed Jul. 16, 2001, mailed Jan. 3, 2005.

Second Non-Final Office Action for U.S. Appl. No. 10/196,337, Lieber, et al., filed Jul. 16, 2002, mailed May 25, 2006.

Second Final Office Action for U.S. Appl. No. 10/196,337, Lieber, et al., filed Jul. 16, 2002, mailed Feb. 23, 2006.

Third Non-Final Office Action for U.S. Appl. No. 10/196,337, Lieber, et al., filed Jul. 16, 2002, mailed Nov. 2, 2006.

First Non-Final Office Action for U.S. Appl. No. 10/734,086, Lieber, et al., filed Dec. 11, 2005, mailed Apr. 7, 2006.

Second Non-Final Office Action for U.S. Appl. No. 10/734,086, Lieber, et al., filed Dec. 11, 2005, mailed Oct. 27, 2006.

Non-Final Office Action for U.S. Appl. No. 10/995,075, Whang, et al., filed Nov. 22, 2004, mailed Nov. 29, 2005.

Non-Final Office Action for U.S. Appl. No. 11/012,549, Lieber, et al., filed Dec. 15, 2004, mailed Dec. 20, 2006.

Non-Final Office Action for U.S. Appl. No. 11/582,167, Lieber, et al., filed Oct. 17, 2006, mailed on Apr. 23, 2007.

Written Opinion for International Application No. PCT/US01/48230, mailed on Mar. 10, 2003, European Patent Office, Rijswijk, Netherlands.

International Preliminary Examination Report for International Application No. PCT/US01/48230, completed on May 20, 2003, European Patent Office, Rijswijk, Netherlands.

Written Opinion for International Application No. PCT/US2005/004459, issued on Aug. 14, 2006, European Patent Office, Munich, Germany.

International Preliminary Report on Patentability for International Application No. PCT/US2005/020974, issued on Dec. 20, 2006, The International Bureau of WIPO, Geneva, Switzerland.

Written Opinion for International Application No. PCT/US2005/020974, issued on Dec. 20, 2006, European Patent Office, Munich, Germany.

Written Opinion for International Application No. PCT/US2005/026759, issued Jan. 30, 2007, European Patent Office Rijswijk, Netherlands.

Invitation to Pay Additional Fees for International Application No. PCT/US05/044212, mailed on Apr. 24, 2007, European Patent Office, Rijswijk, Netherlands.

Written Opinion for International Application No. PCT/US2005/034345, issued Dec. 6, 2007, Rijswijk, European Patent Office, Netherlands.

Patent Abstracts of Japan, English Language Abstract for Japanese Patent No. JP 11-011917 (Document FP9).

Patent Abstracts of Japan, English Language Abstract for Japanese Patent No. JP 2000-031462 (Document FP11).

Co-pending U.S. Appl. No. 11/485,893, inventors Lieber, et al., filed Jul. 13, 2006.

Co-pending U.S. Appl. No. 11/501,466, inventors Lieber, et al., filed Aug. 9, 2006.

Co-pending U.S. Appl. No. 11/543,353, inventors Lieber, et al., filed Oct. 4, 2006.

Co-pending U.S. Appl. No. 11/543,746, inventors Lieber, et al., filed Oct. 4, 2006.

Co-pending U.S. Appl. No. 11/807,186, inventors Lu, et al., filed May 25, 2007.

Co-pending U.S. Appl. No. 10/588,833, inventors Lieber, et al., filed Aug. 9, 2006.

International Search Report for International Application No. PCT/US07/23625, mailed Jul. 11, 2008, ISA/US, United States of America.

Written Opinion for International Application No. PCT/US07/23625, mailed Jul. 11, 2008, ISA/US, United States of America.

Tong, L., et al., "Subwavelength-diameter silica wires for low-loss optical wave guiding," *Nature 426*:816-819, Nature Publishing Group (2003).

Tiefenauer, L.X., et al., "Towards amperometric immunosensor devices," *Biosens. Bioelectron. 12*:213-223, Elsevier Advanced Technology (1997).

Tress, A., et al., "Crystalhne Ropes of Metallic Carbon Nanotubes" *Science 273*: 483-487, American Association for the Advancement of Science (1996).

Urban, J., et al., "Single-Crystalline Barium Titanate Nanowires," *Adv. Mat 15*:423-426, Wiley-VCH (2003).

Vossmeyer, T., et al., "Combinatorial approaches toward patterning nanocrystals," *J. Appl. Phys. 84*:3664-3670, American Institute of Physics (1998).

Wang, J., et al., "Highly Polarized Photoluminescence and Photodetection from Single Indium Phosphide Nanowires," *Science 293*:1455-1457, Association for the Advancement (2001).

Wang, N., et al., "$SiO_2$ enhanced synthesis of Si nanowires by laser ablation," *Appl. Phys. Lett. 73*:3902-3904, American Institute of Physics (1998).

Wang, W., et al., "Label-free detection of small-molecule-protein interations by using nanowire nanosensors," *Proc. Natl. Acad. Sci. 102*:3208-3212, National Academy of Sciences (2005).

Wei, Q., et al., "Synthesis of Single Crystal Bismuth-Telluride and Lead-Telluride Nanowires for New Thermoelectric Materials," *Mat. Res. Soc. Symp. Proc. 581*:219-223, Materials Research Society (2000).

Whang, D., et al., "Large-Scale Hierarchical Organization of Nanowire Arrays for Integrated Nanosystems," *Nano. Lett. 3*:1255-1259, American Chemical Society (2003).

\* cited by examiner

207/208

207/208

METHODS FOR NANOWIRE ALIGNMENT AND DEPOSITION

CROSS REFERENCE TO RELATED APPLICATIONS

The present application is a divisional of U.S. patent application Ser. No. 11/979,949 filed Nov. 9, 2007, now U.S. Pat. No. 7,968,474, and claims benefit under 35 U.S.C. 121. The disclosure of U.S. patent application Ser. No. 11/979,949 is incorporated by reference herein in its entirety.

BACKGROUND OF THE INVENTION

1. Field of the Invention

The present invention relates to nanowires, and more particularly, to nanowire deposition and alignment.

2. Background of the Invention

Nanostructures, and in particular, nanowires have the potential to facilitate a whole new generation of electronic devices. A major impediment to the emergence of this new generation of electronic devices based on nanostructures is the ability to effectively align and deposit nanowires on various substrates. Electric fields allow for alignment of nanowires suspended in suspension, but current techniques pose stringent constraints on the scalability to large area substrates.

What are needed are systems and methods for achieving a high quality nanowire deposition suitable for manufacturing large arrays of nanostructure-enabled devices.

SUMMARY OF THE INVENTION

In one embodiment, the present invention provides methods for positioning one or more nanowires. In suitable embodiments, these methods comprise providing one or more nanowires proximate to an electrode pair and then energizing the electrode pair, whereby the nanowires become associated with the electrode pair. The energizing is then modulating between the electrode pair, whereby the nanowires become coupled onto the electrode pair. In exemplary embodiments, the nanowires are provided in a suspension. In suitable embodiments, the energizing comprises generating an AC electric field between the electrode pair. The AC electric field can be generated using any method known in the art, for example, by supplying a signal to the electrode pair using a direct electrical connection or supplying an electromagnetic wave to the electrode pair. In exemplary embodiments, an AC electric field of about 10 Hz to about 5 kHz and about 0.5 V to about 3 V, is generated. Modulation of the AC field suitably comprises adjusting the frequency of the AC electric field, adjusting the amplitude of the AC electric field, or both, and in suitable embodiments, comprises increasing the frequency of the AC electric field to from about 1 kHz to about 500 kHz, increasing the amplitude of the AC electric field to from about 2 V to about 20 V, and/or increasing the frequency of the AC electric field to from about 500 Hz to about 100 kHz, followed by increasing the amplitude of the AC electric field to from about 1 V to about 4 V. In embodiments where the electric field is supplied using an electromagnetic wave, a frequency of about 1 GHz to about 5 GHz is suitably used. The electrodes of the electrode pair can be separated by a distance that is less than, or equal to, a long axis length of the nanowires, for example.

The methods of the present invention can also further comprise removing one or more uncoupled nanowires from the electrode pair, for example by flushing away uncoupled nanowires, and can also further comprise drying the one or more coupled nanowires. In additional embodiments, the methods comprise repeating the association and modulation phases of the methods. In embodiments, the methods of the present invention further comprise transferring the one or more coupled nanowires onto a substrate and/or removing the electrode pair.

Nanowires that can be positioned according to the methods of the present invention include nanowires that comprise a semiconductor core (e.g., Si) and one or more shell layers disposed about the core, for example metal shell layers such as TaAlN or WN.

In an additional embodiment, the present invention provides methods for positioning one or more nanowires on a substrate. In suitable embodiments, the methods comprise providing one or more nanowires in a suspension proximate to an electrode pair on a transfer substrate and then energizing the electrode pair, whereby the nanowires become associated with the electrode pair. The energizing is then modulated between the electrode pair, whereby the nanowires become coupled onto the electrode pair. One or more uncoupled nanowires are then removed and coupled nanowires are then transferred from the transfer substrate onto the substrate. In suitable embodiments, the energizing comprises generating an alternating current (AC) electric field between the electrode pair.

The present invention also provides methods for positioning one or more nanowires. In such methods, one or more nanowires are provided proximate to an electrode pair. The electrode pair is then energized, whereby the nanowires become associated with the electrode pair, wherein one or more metallic elements are positioned between electrodes of the electrode pairs, such that inter-nanowire distances between adjacent associated nanowires vary by less than about 50% of a standard deviation. In further embodiments, the methods further comprise modulating the energizing between the electrode pairs, whereby the nanowires become coupled onto the electrode pair, and wherein one or more metallic elements are positioned between electrodes of the electrode pairs, such that inter-nanowire distances between adjacent coupled nanowires vary by less than about 50% of a standard deviation.

The present invention also provides substrates comprising at least a first pair of electrodes and at least four nanowires coupled between the first pair of electrodes, wherein the inter-nanowire distances between adjacent coupled nanowires varies by less than about 50% of a standard deviation. In suitable embodiments, the substrates further comprise three or more metallic elements positioned between the electrodes of the first electrode pair.

The present invention also provides one or more electrode pairs comprising one or more nanowires positioned according to the methods of the present invention, as well as substrates comprising one or more nanowires positioned according to the methods of the present invention.

In a still further embodiment, the present invention provides methods for controlling the number of nanowires positioned on an electrode pair. In suitable embodiments, the methods comprise positioning one or more nanowires according to the methods of the present invention and then applying a signal to the electrode pair. The signal is monitored at the electrode pair and then the positioning stopped when the signal attains a pre-set value (for example, by reducing the electric field between the electrode pair, thereby stopping the positioning of nanowires on the electrode pair). Exemplary signals that can be monitored include, but are not limited to, impedance, voltage, capacitance, current, etc.

The present invention also provides substrates comprising an electrode pair, wherein a pre-determined number of nanowires have been positioned on the electrode pair, and wherein the number of nanowires has been controlled according to the methods of the present invention. For example, the present invention provides substrates comprising at least four electrode pairs and at least four nanowires positioned on each electrode pair, wherein each of the electrode pairs comprise substantially the same number of nanowires. In suitable embodiments, the number of nanowires positioned on each of the electrode pairs deviates by less than 30%, less than 20% or less than 10%.

The present invention also provides apparatuses and systems for positioning nanowires on a substrate. In suitable embodiments, the apparatuses and systems comprise a suspension comprising a plurality of nanowires and a substrate comprising one or more electrode pairs. The apparatuses and systems also suitably comprise a source for generating an alternating current (AC) electric field between the electrode pairs, for example a signal generator that is also used to modulate the AC electric field. In additional embodiments, the systems and apparatuses further comprise means for flowing the nanowire suspension over at least one of the electrode pairs (e.g., a fluid flow control system, suitably adapted to be coupled to an underside of the substrate), an optical imaging system for visualizing the nanowires, and one or more field electrodes for manipulating the nanowires on the substrate. The systems and apparatuses can also further comprise a signal monitoring device for determining the signal at the one or more electrode pairs and means for stopping the AC electric field when the signal attains a pre-set value.

The present invention also provides methods for depositing one or more nanowires on a substrate by heating the nanowires, such that they become deposited on the substrate. In exemplary embodiments, the nanowires are heated to about 200° C. in the presence of $H_2$ gas (forming gas) in order to deposit them on the substrate.

In a still further embodiment, systems for manipulating nanowires are provided. Such systems comprise one or more electrode sets, each electrode set comprising a first electrode having a first polarity and a second electrode having a second polarity. The systems also comprise a signal generator for generating an alternating current (AC) electric field between the first and second electrodes. Methods for manipulating nanowires utilizing such systems are also provided. For example, an electrode set is energized, and then suitably de-energized, while an adjacent electrode set is energized. This produces a delectophoretic force that manipulates the nanowires in the direction of the energizing. In additional embodiments, a removal electrode can be utilized, which when energized, manipulates nanowires in the direction of the removal electrode, thereby allowing the nanowires to be removed from electrode pairs used in association/coupling applications. Both DC and AC electric fields can be used to manipulate the nanowires.

The present invention also provides methods for separating one or more conductive nanowires from a mixture of conductive and semiconductive nanowires. While both conductive and semiconductive nanowires can be associated with electrode pairs, conductive nanowires become coupled at amplitudes that are generally lower than those required for coupling of semiconductive nanowires, thus allowing for selective removal of conductive nanowires from a solution.

In further embodiments, the systems for positioning nanowires on a substrate of the present invention can also further comprise one or more nanowire-adhering regions on the substrate. Such systems can be used in various methods for positioning one or more nanowires, for example, where uncoupled nanowires are removed by attaching to the nanowire-adhering regions.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1A:
FIG. 1A is a diagram of a single crystal semiconductor nanowire.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third, fourth, fifth, etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, equal to or less than less than about 100 nm, and has an aspect ratio (length:width) of greater than 10, preferably greater than 50, and more preferably, greater than 100. Exemplary nanowires for use in the practice of the methods and systems of the present invention are on the order of 10's of microns long (e.g., about 10, 20, 30, 40, 50 microns, etc.) and about 100 nm in diameter.

The nanowires of this invention can be substantially homogeneous in material properties, or in certain embodiments can be heterogeneous (e.g., nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g., over the central 20%, 40%, 50%, or 80% of the nanowire). A nanowire can be straight or can be e.g., curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P($BP_6$), B—Si, Si—C, Si—Ge, Si—Sn and Ge—Sn, SiC, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, (Cu, Ag)(Al, Ga, In, Tl, Fe)(S, Se, Te)$_2$, $Si_3N_4$, $Ge_3N_4$, $Al_2O_3$, (Al, Ga, In)$_2$ (S, Se, Te)$_3$, $Al_2CO$, and an appropriate combination of two or more such semiconductors.

The nanowires can also be formed from other materials such as metals such as gold, nickel, palladium, iradium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom," etc.) made herein are for purposes of illustration only, and that devices of the present invention can be spatially arranged in any orientation or manner.

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
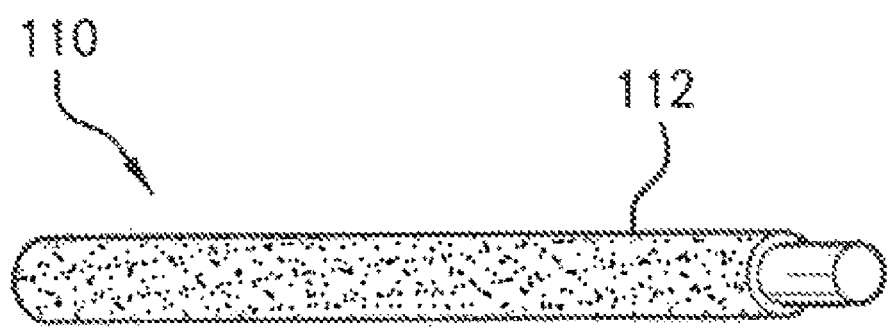
FIG. 1B is a diagram of a nanowire doped according to a core-shell (CS) structure.

FIG. 1B shows a nanowire 110 doped according to a core-shell structure. As shown in FIG. 1B, nanowire 110 has a doped surface layer 112, which can have varying thickness levels, including being only a molecular monolayer on the surface of nanowire 110.

Figure 1C:
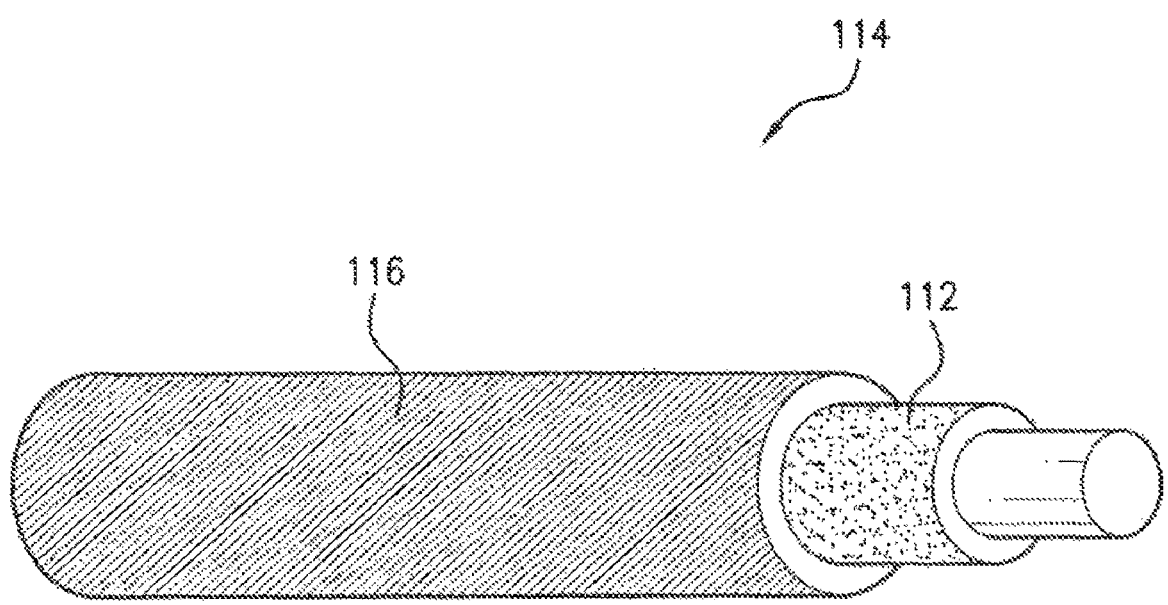
FIG. 1C is a diagram of a nanowire doped according to a core-shell-shell (CSS) structure.

FIG. 1C shows a nanowire 114 doped according to a core-shell-shell structure. As shown in FIG. 1C, nanowire 114 has a doped surface layer 112, which can have varying thickness levels including being only a molecular monolayer on the surface of nanowire 114, as well as an outer shell layer 116. Exemplary materials for use as outer shell layer 116 include, but are not limited to, TaAlN and WN.

The valence band of the insulating shell can be lower than the valence band of the core for p-type doped wires, or the conduction band of the shell can be higher than the core for n-type doped wires. Generally, the core nanostructure can be made from any metallic or semiconductor material, and the shell can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the shell can comprise a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105, 4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "*Synthesis of Soluble and Processable Rod-, Arrow-, Teardrop-, and Tetrapod-Shaped CdSe Nanocrystals*" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413, 489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019-7029; Dabbousi et al. (1997) "(CdSe)ZnS core-shell quantum dots: Synthesis and characterization of a size series of highly luminescent nanocrysallites" *J. Phys. Chem. B* 101, 9463-9475; Manna et al. (2002) "Epitaxial growth and photochemical annealing of graded CdS/ZnS shells on colloidal CdSe nanorods" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application 60/370,095 (Apr. 2, 2002) to Empedocles entitled "Nanowire heterostructures for encoding information." Similar approaches can be applied to growth of other heterostructures.

Electric Field Alignment and Deposition

Overview

Figure 2:
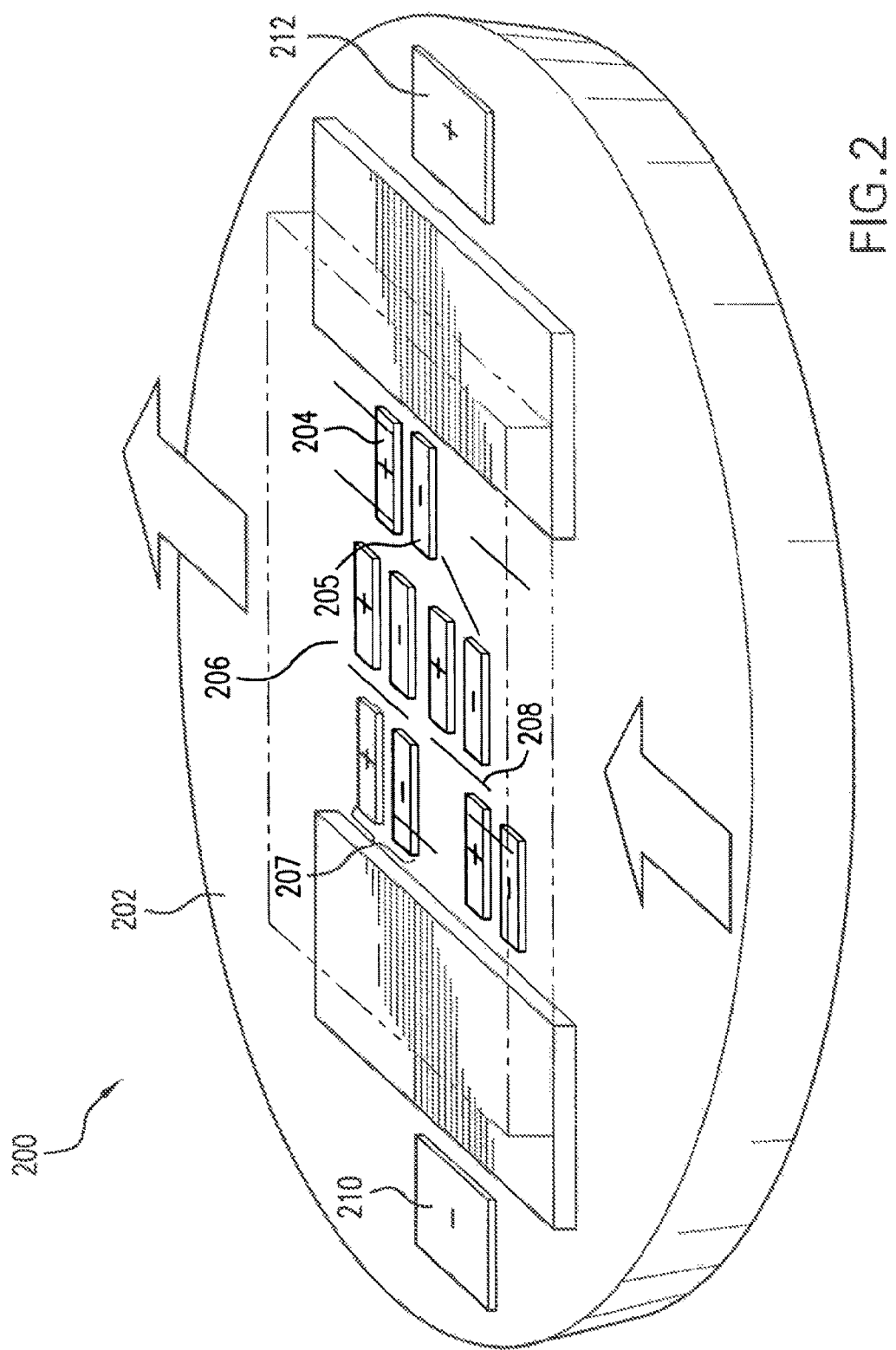
FIG. 2 shows an apparatus for aligning and depositing nanowires in accordance with one embodiment of the present invention.

In one embodiment, the present invention provides methods for aligning and depositing nanowires from a suspended state onto a substrate patterned with electrodes in the presence of an electromagnetic field, as well as apparatuses and systems for performing such alignment and deposition (see FIG. 2). Substrate and nanowire surface chemistry provide a net electric charge on both the substrate and nanowires. Through appropriate choice of electrode pattern, the nanowires are subjected to an electromagnetic field gradient that exerts a net force on the nanowires. The force enables controlled manipulation of nanowires (e.g., in suspension) to specified locations on the substrate. The electrodes also generate an alternating current (AC) field that polarizes the nanowires, resulting in a net dipole moment. The AC field subsequently exerts a torque on the dipole and enables an angular alignment parallel to the field direction. Appropriate choice of electrical parameters, e.g., frequency and amplitude, provide for nanowire alignment and capture, as well as a "pinning" or "association" of nanowires (NWs) over the electrodes. In the associated state, the nanowires are suitably aligned parallel to the electric field, but are sufficiently mobile along the electrode edges to accommodate a chronological sequence of alignment and association events without giving rise to nanowire clumping. The present invention also provides methods for "locking" or "coupling" of nanowires onto the electrodes. In the coupled state, the nanowires remain aligned, as in the previously associated state, but lose their lateral mobility along the electrode edges. The present invention also provides for an appropriate choice of fluid flow control to "flush" undesired/uncoupled/misaligned nanowires from the electrodes. A drying process provides for removal of solvent and enables an electrostatic "sticking" of the NWs on the surface.

Theoretical Discussion

The following section is included in order to provide some additional background with regard to the theory behind electric field alignment. It should be understood that the present invention is not bound or limited to the theory presented herein, and the ordinarily skilled artisan will readily recognize that additional theories in addition to those presented herein are applicable to the present invention.

Figure 3:
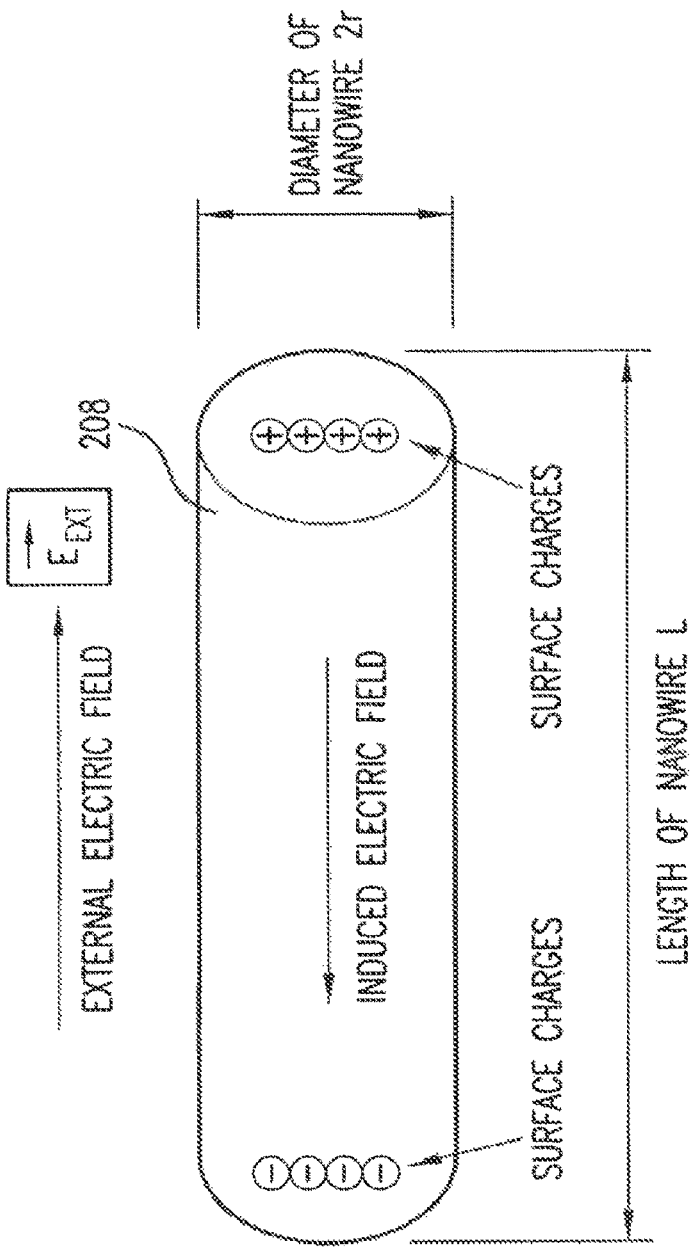
FIG. 3 is a schematic showing the effect of an electric field on the charge separation in a nanowire.

An external electric field $\vec{E}_{EXT}$ causes a charge separation in a nanowire 208 as shown schematically in FIG. 3. This charge separation can be due to mobile charges (e.g., in a conductor) or due to dipole moments (e.g., in a dielectric). The separated charges produce, within the nanowire, an induced electric field $\vec{E}_{IND}$ that is in the direction opposite to the external electric field, and has a magnitude given by:

$$\vec{E}_{IND} = -f(\in)\vec{E}_{EXT}; 0 \leq f(\in) \leq 1 \quad (0.1)$$

The function $f(\in)$ depends on the permittivity $\in$ of the material and is a measure of the polarizability of the nanowire. The upper and lower limits for the value of $f(\in)$ correspond to the limiting cases of a material compensating the external field completely and a material having no compensating induced electric field, respectively. For a material containing either mobile charge (e.g., a metal) or dipole moments (e.g., a dielectric) the induced electric field compensates the external electric field and results in a zero or reduced internal electric field. Externally the charge separation or dipole moment orientation causes an induced dipole moment. The induced dipole moment P (as used throughout, bold, underlined characters represent vectors and correspond to those characters in the equations) of the nanowire is oriented along the external E-field direction and its magnitude is proportional to the nanowire polarizability $\kappa(\omega)$, nanowire volume V and electric-field (E-field) strength $\vec{E}$:

$$\vec{P} = \kappa(\omega)V \cdot \vec{E} \quad (0.2)$$

A uniform E-field exerts a rotational torque $T_E$ on the induced dipole moment given by:

$$\vec{T}_E = \vec{P} \times \vec{E}_{EXT} \quad (0.3)$$

Figure 4:
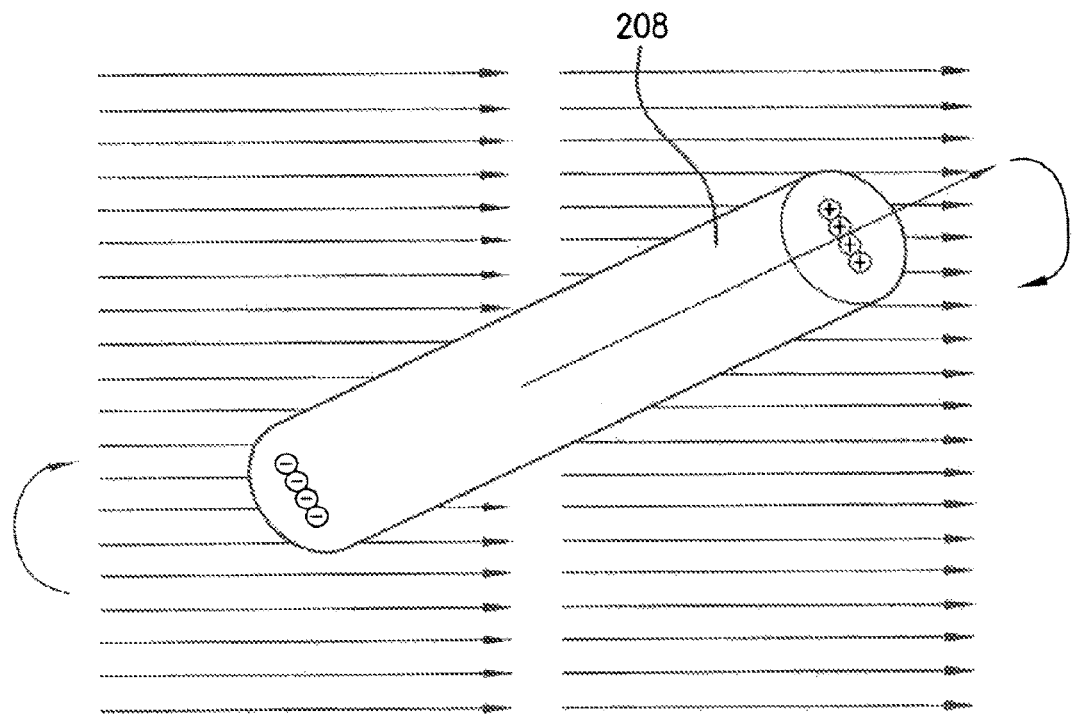
FIG. 4 is a schematic showing the rotational torque exerted on a nanowire.

The torque results in an energetically stable orientation for the nanowire 208 to be aligned parallel to the E-field direction, as shown in FIG. 4. A non-uniform E-field exerts a translational force $F_{DEP}$ (dielectrophoresis) on the induced dipole moment given by:

$$\vec{F}_{DEP} = 1/2 \text{Re}[(\vec{P} \cdot \vec{\nabla})\vec{E}^*] \quad (0.4)$$

Combining Eqs. (1.2) and (1.4), the dielectrophoretic force can be expressed as:

$$\vec{F}_{DEP} = 1/2\pi \cdot r^2 L \in_m \cdot \text{Re}\{\kappa(\omega)\} \cdot \vec{\nabla}|\vec{E}|^2 \quad (0.5)$$

The dielectrophoretic force on the nanowire 208 (see FIG. 5) depends on the gradient of the quadratic E-field magnitude, E-field frequency $\omega$, nanowire conductivity $\sigma_{NW}$, nanowire permittivity $\in_{NW}$, solvent permittivity $\in_m$ and the nanowire shape (radius r and length L). The real part of the polarization function is given by:

$$\text{Re}\{\kappa\} = \frac{\omega^2(\in_m \in_{NW} - \in_m^2) + (\sigma_m \sigma_{NW} - \sigma_m^2)}{\omega^2 \in_m^2 + \sigma_m^2} \quad (0.6)$$

The frequency dependence of the polarization function yields two distinct frequency ranges (low and high frequency limits), within which the dielectrophoretic force couples to two distinct properties of the NW (conductivity and permittivity). The cutoff frequency between the two ranges is given by the solvent or medium properties $$f_c = \frac{\sigma_m}{2\pi \in_m} \quad (0.7)$$

For $f \ll f_c$ the low frequency limit of the polarization function is given by:

$$\text{Re}\{\kappa\} = \left[\frac{\sigma_{NW}}{\sigma_m} - 1\right] \quad (0.8)$$

In this frequency range the dielectrophoretic force is proportional to the conductivity of the NW normalized to the solvent conductivity. For $f \gg f_c$ the high frequency limit of the polarization function is given by:

$$\text{Re}\{\kappa\} = \left[\frac{\in_{NW}}{\in_m} - 1\right] \quad (0.9)$$

Figure 6:
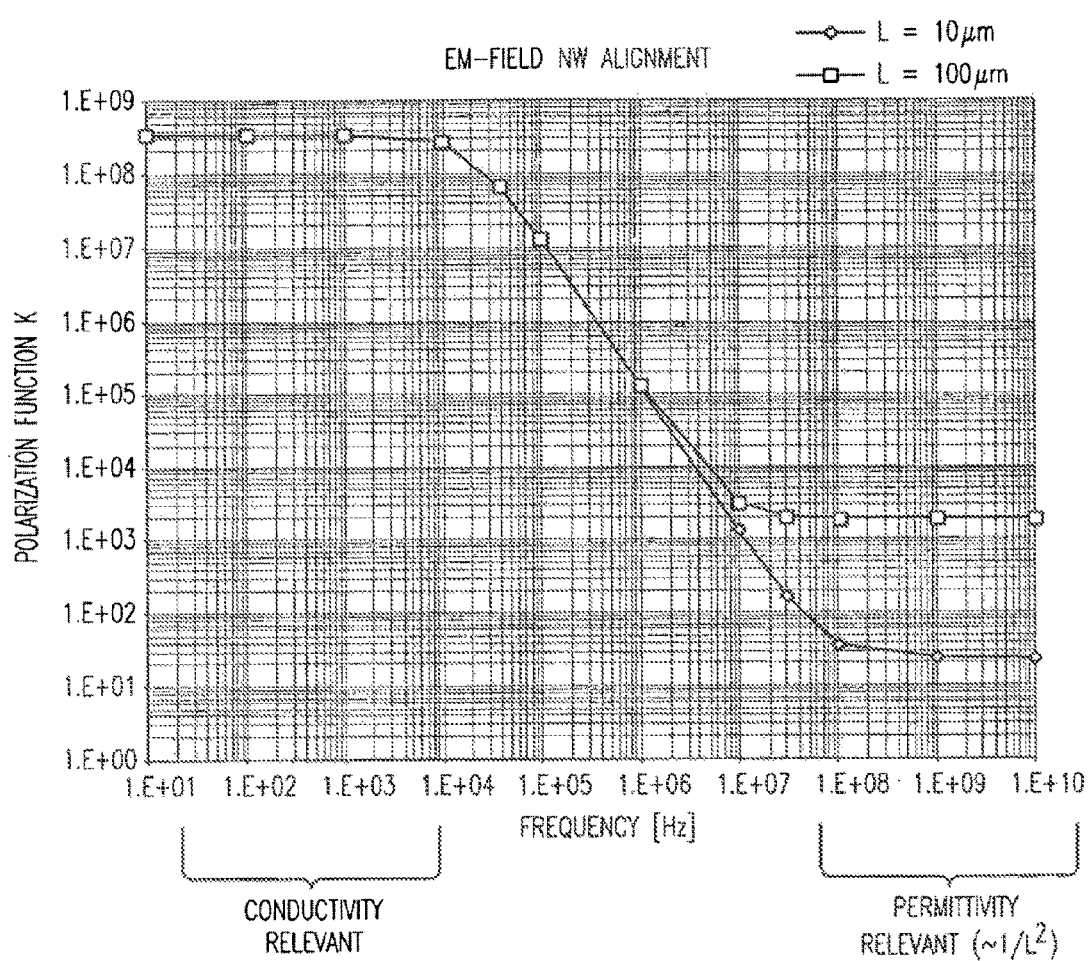
FIG. 6 is a plot showing the effect of nanowire length on the polarization function of nanowires as a function of frequency.
Figure 7:
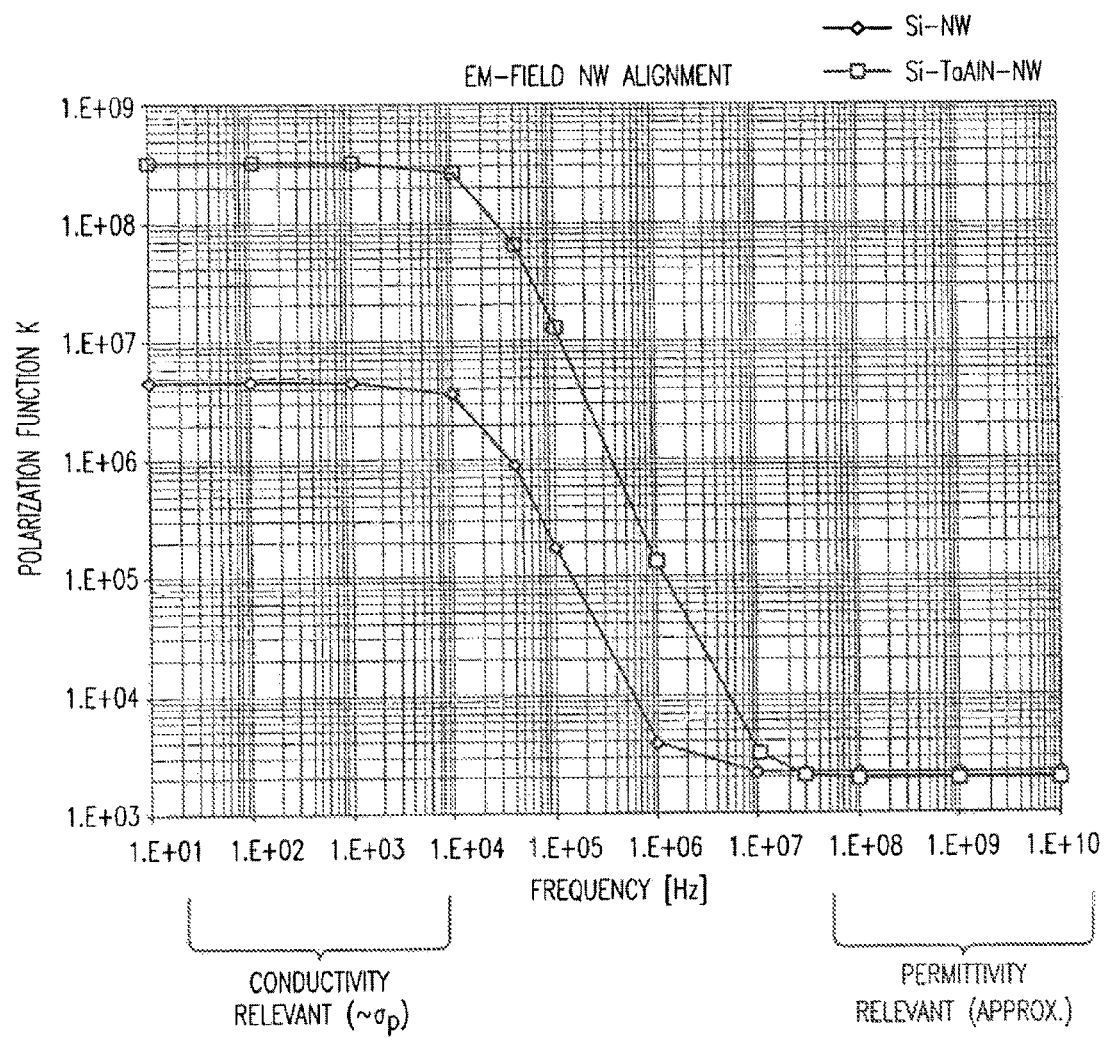
FIG. 7 is a plot showing the effect of nanowire composition on the polarization function of nanowires as a function of frequency.

In this frequency range the dielectrophoretic force is proportional to the permittivity of the NW normalized to the solvent permittivity. The general frequency dependence of the polarization function is plotted in FIG. 6 for two different NW lengths. In the low frequency range where NW conductivity is relevant, the polarization function does not depend on the NW length. However, in the high frequency range the polarization function scales $\sim 1/L^2$ due to its dependence on the NW permittivity. In FIG. 7, the general frequency dependence of the polarization function is plotted for a given NW length but for two different NW conductivities (core-shell (CS) (Si) vs. core-shell-shell (CSS) (Si—TaAlN)). In the low frequency range the polarization function scales $\sim \sigma_{NW}$ and in the high frequency range the polarization is the same due to its dependence on the NW permittivity.

Suitable Embodiments

In one embodiment, the present invention provides methods for positioning one or more nanowires. In suitable embodiments, the methods comprise providing one or more nanowires proximate to an electrode pair. Then, the electrode pair is energized, whereby the nanowires become associated with the electrode pair. The energizing of the electrode pair is then modulated, whereby the nanowires become coupled onto the electrode pair.

The term "positioning" as used throughout refers to the alignment and association, as well as the deposition or coupling, of nanowires onto a surface, for example, an electrode pair. Positioning includes nanowires that are both aligned and non-aligned. The term "aligned" as used throughout refers to nanowires that are substantially parallel or oriented in the same or substantially same direction of one another (i.e. the nanowires are aligned in the same direction, or within about 45° of one another). Suitably, the nanowires of the present invention are aligned such that they are all substantially parallel to one another and substantially perpendicular to each electrode of an electrode pair (though in additional embodiments, they can be aligned parallel to an electrode). Positioning of nanowires onto an electrode pair suitably comprises positioning the nanowires such that the nanowires span the electrode pair, that is, the wires are in contact with both electrodes of an electrode pair (though wires can also be in contact with only one electrode), with the substantial remainder of their length between the two electrodes. In embodiments in which the nanowires are longer than the distance separating two electrodes of an electrode pair, the nanowires may extend beyond the electrodes.

Methods for providing nanowires for use in the methods and systems of the present invention are well known in the art. Suitably, the nanowires are provided in a suspension, i.e., a suspension of nanowires comprising one or more nanowires, suitably a plurality of nanowires, suspended in a liquid (i.e., a nanowire "ink"). Suitably, the liquid is an aqueous media, such as water or a solution of water, ions (including salts), and other components, for example surfactants. Additional examples of liquids suitable for preparing nanowire suspensions include, but are not limited to, organic solvents, inorganic solvents, alcohols (e.g., isopropyl alcohol) (IPA), etc.

As used herein the phrase "proximate to an electrode pair" as it relates to providing the nanowires means that the nanowires are provided or positioned such that they can be acted upon by an electric field generated at the electrode pair. Suitably, this is a distance from the electrode pair such that they can be associated and coupled to the electrodes. In more specific embodiments, the nanowires are provided such that they are at distance of less than about 100 µm from the electrode pairs. For example, the nanowires are provided such that they are less than about 100 µm, less than about 100 µm, less than about 50 µm, less than about 10 µm, or less than about 1 µm, from the electrode pair.

In suitable embodiments, the present invention provides a system or apparatus for nanowire alignment and deposition. An exemplary apparatus 200 is shown in FIG. 2. Apparatus 200 suitably comprises a substrate 202 having a surface onto which one or more electrodes are positioned (e.g., patterned), suitably in an arrangement such that a positive electrode 204 and a negative electrode 205 form an electrode pair 207. Substrate 202 comprises any suitable material, for example a semiconductor wafer or dielectric material. Examples of suitable substrate materials include, but are not limited to, Si, $SiO_2$, GaAs, InP, and other semiconductor materials described herein. Exemplary materials for use as positive 204 and negative electrodes 205 include, but are not limited to, Al, Mo (Moly electrodes), Cu, Fe, Au, Ag, Pt, Cr/Au etc. Electrodes for use in the practice of the present invention can also further comprise an oxide coating or layer on their surface.

Nanowires of any material can be aligned and deposited according to the methods of the present invention. Suitably, the nanowires will comprise a semiconductor core and one or more shell layers disposed about the core (i.e., the shell layers surround the core). Examples of suitable semiconductor materials and shell materials include those described throughout. In suitable embodiments, the core comprises Si and at least one of the shell layers, suitably the outermost shell layer (i.e., the shell layer that is in contact with the external environment) comprise a metal, such as TaAlN or WN. Additional examples of metal shell layers include those described throughout. Exemplary nanowires for use in the practice of the present invention include core:shell (CS) nanowires (e.g., $SiO_2$), core:shell:shell (CSS) nanowires (e.g., $SiO_2$:metal), and core:no oxide shell:metal shell nanowires (CNOS) (e.g., Si:metal). In further embodiments, additional shells (e.g., 3, 4, 5, 6, 7, etc.) can be added to the nanowires, for example generating core:shell:shell:shell (CSSS) nanowires. In suitable embodiments, the outer shell is added so as to improve the zeta potential of the nanowire. In general, a negative zeta potential (usually high in magnitude) is desirable (though positive zeta potential can also be used), and thus, a final shell layer can be added to generate such a zeta potential. For example, an oxide layer can be added as the final shell layer of a nanowire. In suitable embodiments, the second to last outer shell can be a metal nitride, such as tungsten nitride or tantalum nitride. This shell is then oxidized to form a final outer metal-oxide or metal-oxynitride shell on the nanowire. In further embodiments, a polysilicon or an oxide of polysilicon can be added as the final shell layer to aid in controlling the zeta potential of the nanowires.

As shown in FIG. 2, in suitable embodiments, a plurality of electrode pairs 207 are patterned on substrate 202 such that they are adhered or fixed to the substrate. In other embodiments, electrode pairs 207 can simply be layered on substrate 202, but not actually affixed to the surface. Any suitable orientation or pattern of electrode pairs 207 can be used. As shown in FIG. 2, apparatus 200 can also further comprise additional pieces of material that form a flow channel 206 (e.g., two sides and a top (shown in a see-through view)). Flow channel 206 provides a mechanism for controlling the amount and location of fluid flow when a suspension of nanowires is added to the apparatus. It should be noted, however, that a flow channel is not required to perform the alignment and deposition methods of the present invention. Flow channel 206 can be prepared using any suitable material, for example a semiconductor or dielectric material, and in suitable embodiments, flow channel 206 is prepared from Polydimethylsiloxane (PDMS).

As noted above, suitably, one or more nanowires 208 are provided by providing or introducing a suspension of nanowires to the apparatus 200 (e.g., a nanowire "ink"). As represented in FIG. 2, suitably a nanowire suspension is provided by flowing nanowires 208 over (arrows represent an exemplary direction of flow, though other directions can also be used) the substrate surface 202 and the electrode pairs 207, and/or by utilizing a pressurized channel fill technique. The nanowire suspension is maintained in the channel 206 during the providing phase. As the nanowires are provided, the flow of the suspension through channel 206 and over electrode pairs 207 helps to align the nanowires, suitably in the direction of the flow (e.g., the arrows shown in FIG. 2). In suitable embodiments, channel 206 can be inverted so as to limit or eliminate gravity effects (i.e., the electrodes are on top of the channel rather than the bottom, and thus nanowires do not settle on the electrodes with gravity). Additional methods for providing nanowires to an electrode pair are well known in the art, and include, but are not limited to, spray coaters, spray painting, meniscus coater, dip-coater, bar-coater, gravure coater, Mayer rod, doctor blade, extrusion, micro-gravure, web coaters, doctor blade coaters, in-line or ink jet printers (see e.g., U.S. Pat. Nos. 6,936,761 and 6,358,643 the disclosures of each of which are incorporated herein by reference).

As nanowires are provided to an electrode pair (e.g., via the introduction of a suspension of nanowires to a channel 206), an electric field is generated between the electrode pair by energizing the electrode pair so as to associate the nanowires with the electrode pair. It should be noted that the electric field can be generated before, after, or during the period of nanowire producing/introduction. As used herein, the terms "electric field" and "electromagnetic field" are used interchangeably and refer to the force exerted on charged objects in the vicinity of an electric charge. As used herein, "energizing the electrode pair" or "energize" refer to any suitable mechanism or system for providing an electric current to the electrodes such that an electric field is generated between electrodes of an electrode pair.

Suitably, energizing the electrode pair to generate the electric field is performed by generating an alternating current (AC) electric field (though a direct current (DC) electric field can also be used) either during part or all of the alignment and deposition process. In suitable embodiments of the present invention, an electric field is generated between a pair of electrodes (i.e., two electrodes) by applying an electric current to the electrodes. For example, negative electrodes 205 can be connected via direct electrical connection (i.e., wires or other connection) to a negative electrode terminal 210, to which the negative pole of an electric source is attached. Similarly, positive electrodes 204 can be connected via direct electrical connection (i.e., wires or other connection) to a positive electrode terminal 212, to which the positive pole of an electrode source is attached. When an electric current is switched on, the negative and positive terminals then transfer charge to the electrodes positioned on the substrate, thereby generating an electric field between a pair of electrodes 207. In further embodiments, the electric field can be a pulsed electric field, for example a pulsed AC electric field.

The energizing of the electrode pair to create an electric field can also be generated by supplying an electromagnetic wave to the electrode pairs 207. As is well known in the art, waveguides of various dimensions and configurations (e.g., cylindrical, rectangular) can be suitably used to direct and supply an electromagnetic wave (see e.g., Guru, B. S. et al., "Electromagnetic Field Theory Fundamentals," Chapter 10, PWS Publishing Company, Boston, Mass. (1998)). Operation frequencies of waveguides for use in the practice of the present invention are readily determined by those of skill in the art, and suitably are in the range of about 100 MHz to 10 GHz, more suitably about 1 GHz-5 GHz, about 2-3 GHz, about 2.5 GHz, or about 2.45 GHz.

As the nanowires encounter the AC electric field generated between the various pairs of electrodes, a field gradient results, as described above and represented in FIGS. 3 and 5. A net dipole moment is produced in the nanowires and the AC field exerts a torque on the dipole, such that the nanowires align parallel to the direction of the electric filed (FIG. 3). In one embodiment then, the present invention provides methods for aligning nanowires above one or more electrode pairs. It should be noted that the alignment and deposition methods of the present invention can be utilized on any nanowire composition, including, CS, CSS and CNOS.

In suitable embodiments, the electrodes of the electrode pair are separated by a distance that is less than, or equal to, a long axis length of the nanowires. Nanowires of any length can be aligned and positioned using the methods of the present invention. Suitably, the distance between electrodes of an electrode pair are such that the nanowires extend just beyond the first edge of the electrode. That is the distance between electrodes is about equal to, and suitably less than, the length of the nanowires being deposited. As shown in FIGS. 8*a*-8*d*, 9*a*-9*b* and 10*a*-10*c*, nanowires suitably extend just beyond the first edge and into the middle of the electrode, with tens of nanometers to several microns overlapping the electrode material at the tip of the nanowire. Nanowires that are shorter than the distance between the electrodes are able to couple to only one electrode in a pair (if they couple at all), and suitably are removed during subsequent removing phases (since there is only one contact point between the electrode and the nanowire). Similarly, nanowires that are substantially longer than the distance between the electrodes of an electrode pair hang over one or more of the electrodes, and suitably are removed during subsequent removing phases (larger exposed surface area). Thus, the methods of the present invention also provide a way to preferentially select nanowires of a particular length from a suspension of a range of nanowire sizes, and align and deposit them onto an electrode pair.

It has also been determined that the methods of the present invention preferentially associate and couple nanowires that are "straight" rather than bent or crooked. Hence, the present invention also provides the added benefit of depositing preferably straight nanowires, rather than less preferred bent or crooked nanowires.

In additional embodiments, the electrodes used in the various embodiments of the present invention can be different sizes, geometries and orientations. For example, a first electrode (e.g., 204) can comprise a greater nanowire contact surface area than a second electrode (e.g., 205) of an electrode pair 207. As used herein "greater nanowire contact surface area" means that an electrode of an electrode pair has a surface area that is larger than the other electrode of the electrode pair, and hence, nanowires that are associated/coupled to the electrode pair contact a greater surface area of the first electrode. The use of an electrode with a greater nanowire contact surface area allows nanowires that are longer than the distance between the electrodes to align substantially parallel to each other, as well as nanowires that are more closely matched to the distance between electrodes of an electrode pair. Thus, buy utilizing an electrode that has a greater nanowire contact surface area than the other electrode of the pair, nanowires that may normally misalign or cross, can now be aligned in a substantially parallel fashion, thereby allowing association and coupling of a population of nanowires that comprise various lengths.

In addition to aligning the nanowires parallel to the AC field, the field gradient exerts a dielectrophoretic force on the nanowire attracting it toward the electrode pair. As represented schematically in FIG. 5, the gradient is highest at the electrode pair, and exerting an increasing attraction toward the electrodes. An electric double-layer is produced at the surface of each electrode of the pair, such that oppositely charged ions are present at the electrode. In the presence of the electric field, the ions then migrate away from the electrode and initially toward the nanowire hovering above. As ions approach the oppositely charged nanowire, the ions are repulsed by the like charge and then directed back toward the electrode resulting in a circulating pattern of ions. Liquid that is present (i.e., the nanowire suspension) is also circulated, generating an elecro-osmotic force that opposes the dielectrophoretic force attracting the nanowires to the electrodes. As the two forces reach an equilibrium (or relative equilibrium), the nanowires are held in place such that they become associated with the electrode pair. As used herein the terms "associated" and "pinned" are used to indicate that the nanowires are in such a state that the elecro-osmotic force and the dielectrophoretic force are at equilibrium, such that there is no or little net movement of the nanowires away from the electrode pair (i.e., normal or substantially normal to the substrate and the electrode pair). This is also called the "association phase" throughout.

Figure 8A:
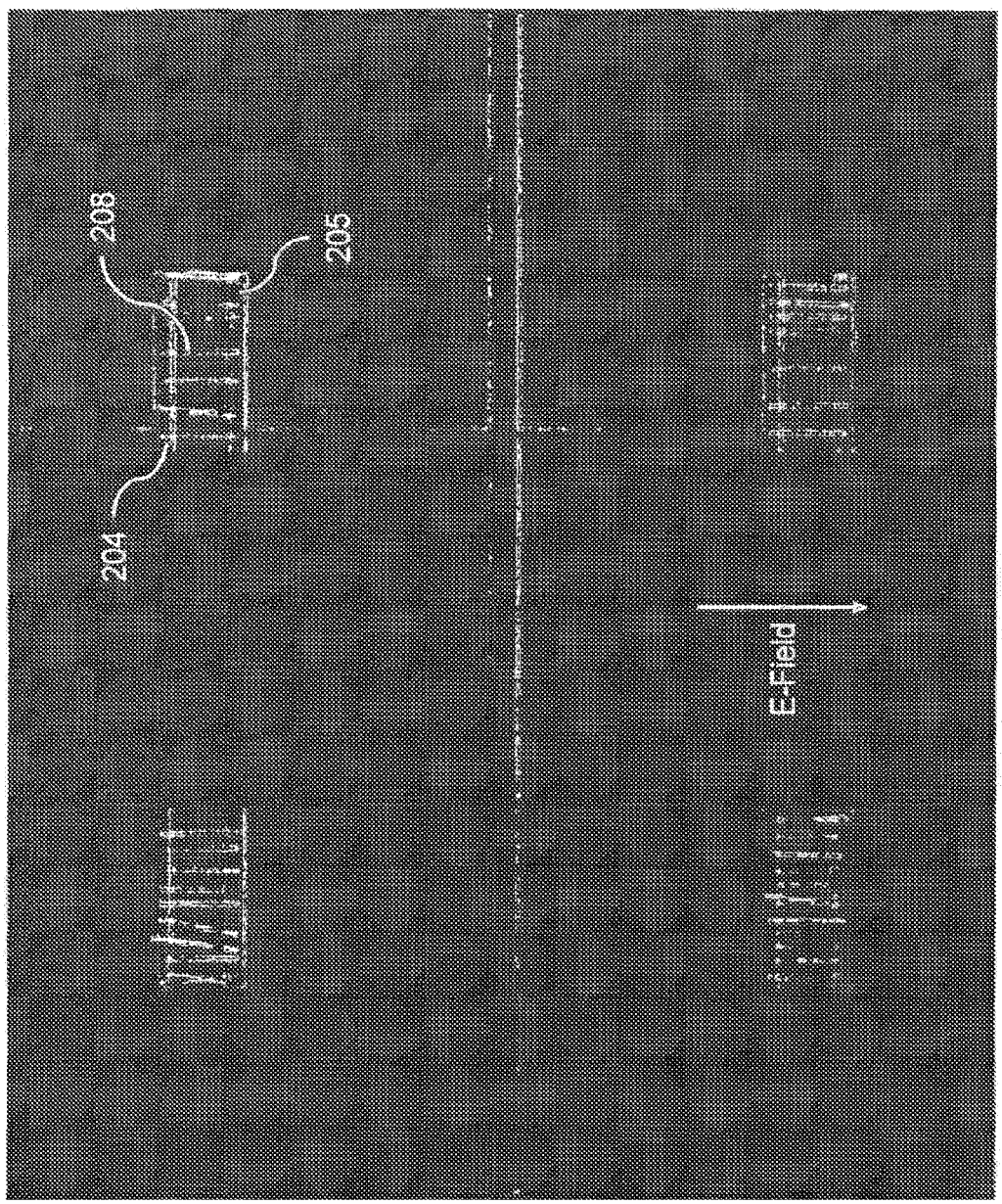
FIG. 8a is a micrograph showing the alignment and association of nanowires with electrode pairs.

In the associated, or pinned state, the nanowires are suitably aligned parallel to the electric field, but are sufficiently mobile along the electrode edges (i.e. in a plane just above the surface of the electrodes). For example, FIG. 8*a* represents a set of four electrode pairs (204 and 205), each comprising a plurality of nanowires 208 associated, or pinned, with the electrodes. The direction of the electric field is shown in FIG. 8a (the e-field can be in any direction, though it will generally be in a direction that is substantially perpendicular to the electrodes). As shown in FIG. 8a, the majority of the nanowires are aligned in a direction parallel to the e-field (i.e. across or perpendicular to the electrodes). In embodiments when a fluid suspension of nanowires is provided to the substrate and electrodes, the direction of the fluid flow will also aid in nanowire alignment. In suitable embodiments, the direction of the fluid flow will be the same as, or substantially the same as, the direction of the e-field (though the fluid flow and the e-field can be in opposite directions which still aids nanowire alignment parallel to the e-field as well as in different directions).

In the associated or pinned state, the nanowires are free to rearrange, migrate and/or align along the length of the electrodes. Nanowires that are already substantially aligned with the e-field will tend to migrate along the electrode pair until contacting, and/or being repelled by, a nearest neighbor. Nanowires that are not substantially aligned will tend to migrate such that they become aligned as they contact, and/or are repelled by, nearest neighbor nanowires and, an equilibrium between the various forces acting on the nanowires is reached. The lateral mobility (i.e., along the electrode pairs, perpendicular to the e-field direction) of the nanowires allows them to accommodate a chronological sequence of alignment and association events without giving rise to nanowire clumping. That is, as nanowires are continuously supplied to the electrode pairs (i.e., from a suspension) additional nanowires are able to associate with the electrodes, as the nanowires that are previously associated are freely mobile such that they move out of the way to accommodate additional wires.

Figure 9A:
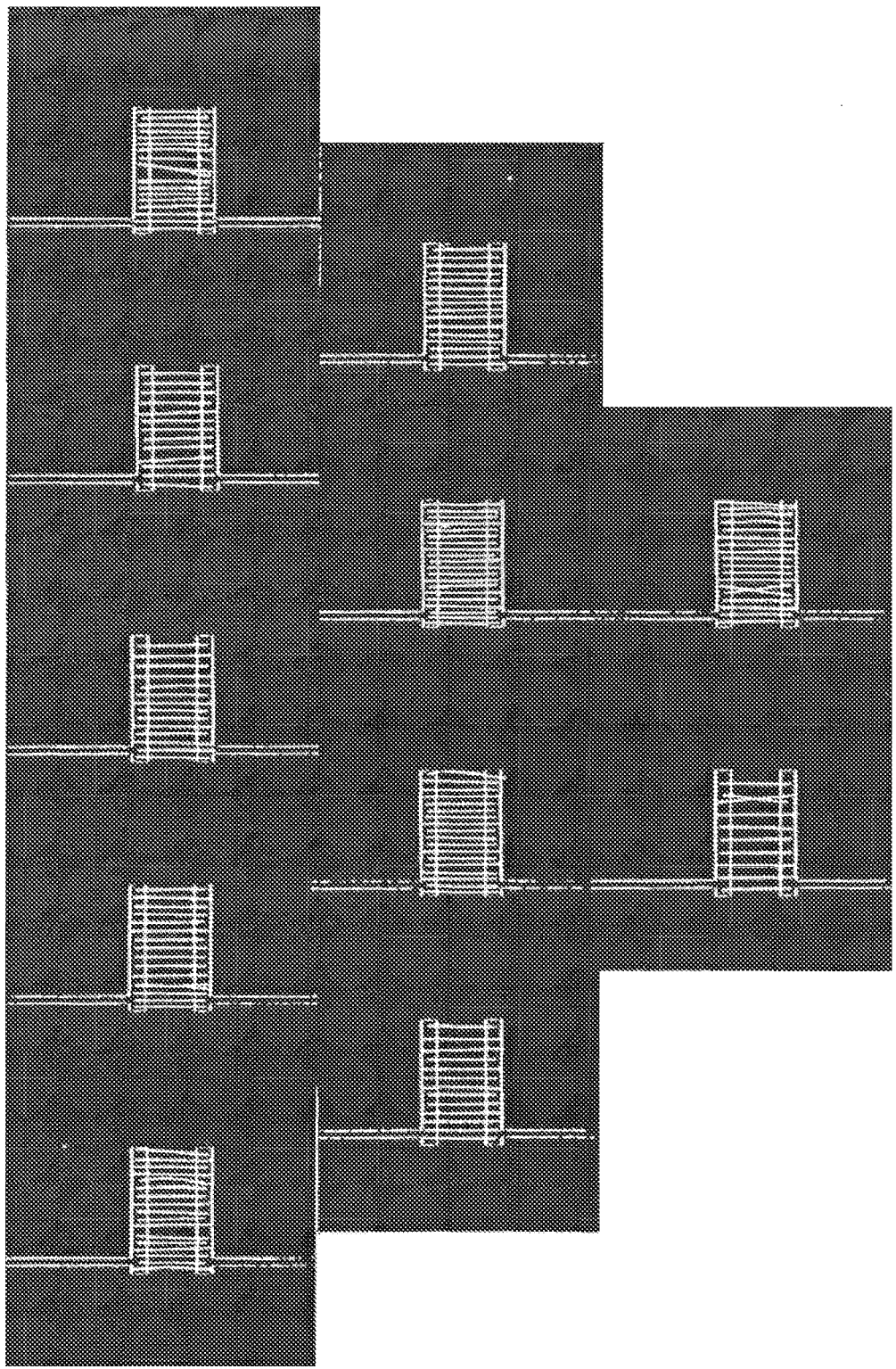
FIG. 9a is a micrograph showing 11 electrode pairs comprising aligned, coupled nanowires.
Figure 9B:
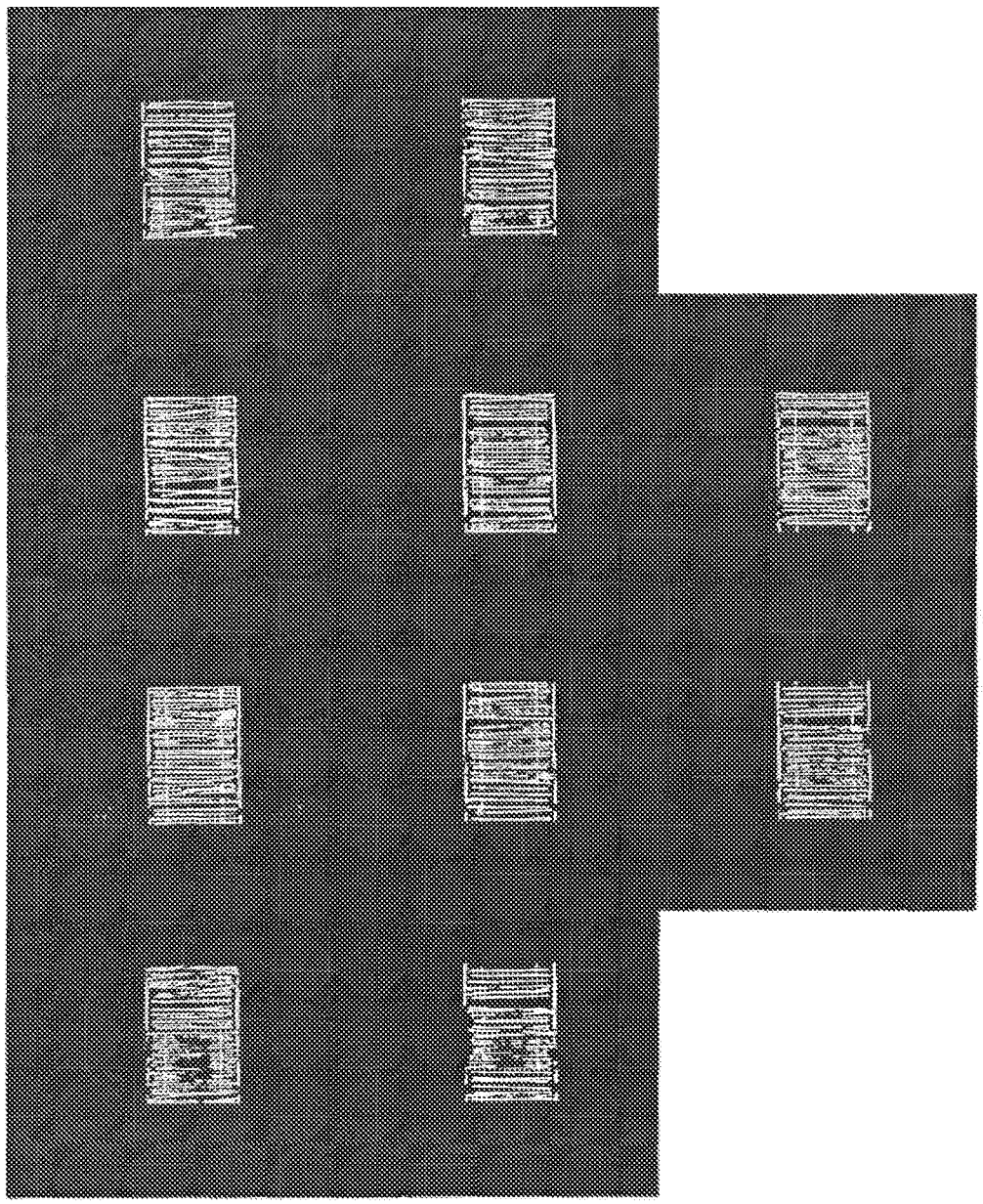
FIG. 9b is a micrograph showing 10 electrode pairs comprising a high density of aligned, coupled nanowires.

FIG. 9a shows a series of eleven electrode pairs, each of which comprises at least ten nanowires spanning the electrodes. In general, the nanowires are aligned substantially in the same direction and are all at approximately the same separation distance for a given electrode pair with little, if any, overlap or clumping of nanowires. FIG. 9b shows a series of ten electrode pairs, each of which comprises a much higher density of nanowires (at least about 20-30 nanowires per electrode pair). The density of nanowires that can be associated and ultimately coupled to the electrodes depends upon the number of nanowires provided (e.g., the concentration of nanowires in suspension) the size of the electrodes and the number of electrode pairs. Exemplary nanowire densities range from about 1 nanowire per 0.5 μm to about 1 nanowire per 100 μm, a suitable density range is about 1-5 μm per nanowire.

Suitably, association of the nanowires with an electrode pair occurs when an alternating electric current is generated at a frequency of about 5 Hz to about 5 kHz, suitably about 10 Hz to about 5 kHz, about 10 Hz to about 2 kHz, about 10 Hz to about 1 kHz, about 100 Hz, about 200 Hz, about 300 Hz, about 400 Hz, about 500 Hz, about 600 Hz, about 700 Hz, about 800 Hz, or about 900 Hz (though other frequencies can also be used). Suitably, the amplitude of the AC electric field that is generated so as to associate the nanowires with the electrode pair is about 0.1 V to about 5 V, suitably about 0.5 V to about 3 V, about 0.5 V to about 2 V, about 0.6 V, about 0.7 V, about 0.8 V, about 0.9 V, about 1.0 V, about 1.1 V, about 1.2 V, about 1.3 V, about 1.4 V, about 1.5 V, about 1.6 V, about 1.7 V, about 1.8 V, or about 1.9 V. As used throughout, when discussing amplitude values of electric fields, voltage values (V) represent peak-to-peak voltages ($V_{p-p}$). These ranges are suitably used when associating nanowires that are CSS and/or CNOS in composition.

Following association of the nanowires with the electrode pair, modulation of the energizing of the electrode pair is then used to couple nanowires onto the electrode pair. Modulating the electrode pair suitable comprises modulating an AC electric field between the electrode pair. As used herein the term "modulate" or "modulation" means to vary or adjust the energizing. For example, the frequency, amplitude, or both, of an electromagnetic wave, electric field or electric signal can be modulated modulated. The terms "vary" and "adjust" include increasing as well as decreasing the energizing (e.g., the field or signal). For example, modulation of the AC electric field can include frequency modulation, amplitude modulation, as well combinations of both, whether taking place at different times or at the same time. Modulation includes increasing both the frequency and amplitude, increasing the frequency and decreasing the amplitude, and decreasing the frequency and increasing the amplitude, and decreasing both the amplitude and the frequency. The timing of these increase and/or decreases can occur at the same time or at different times.

Figure 8B:
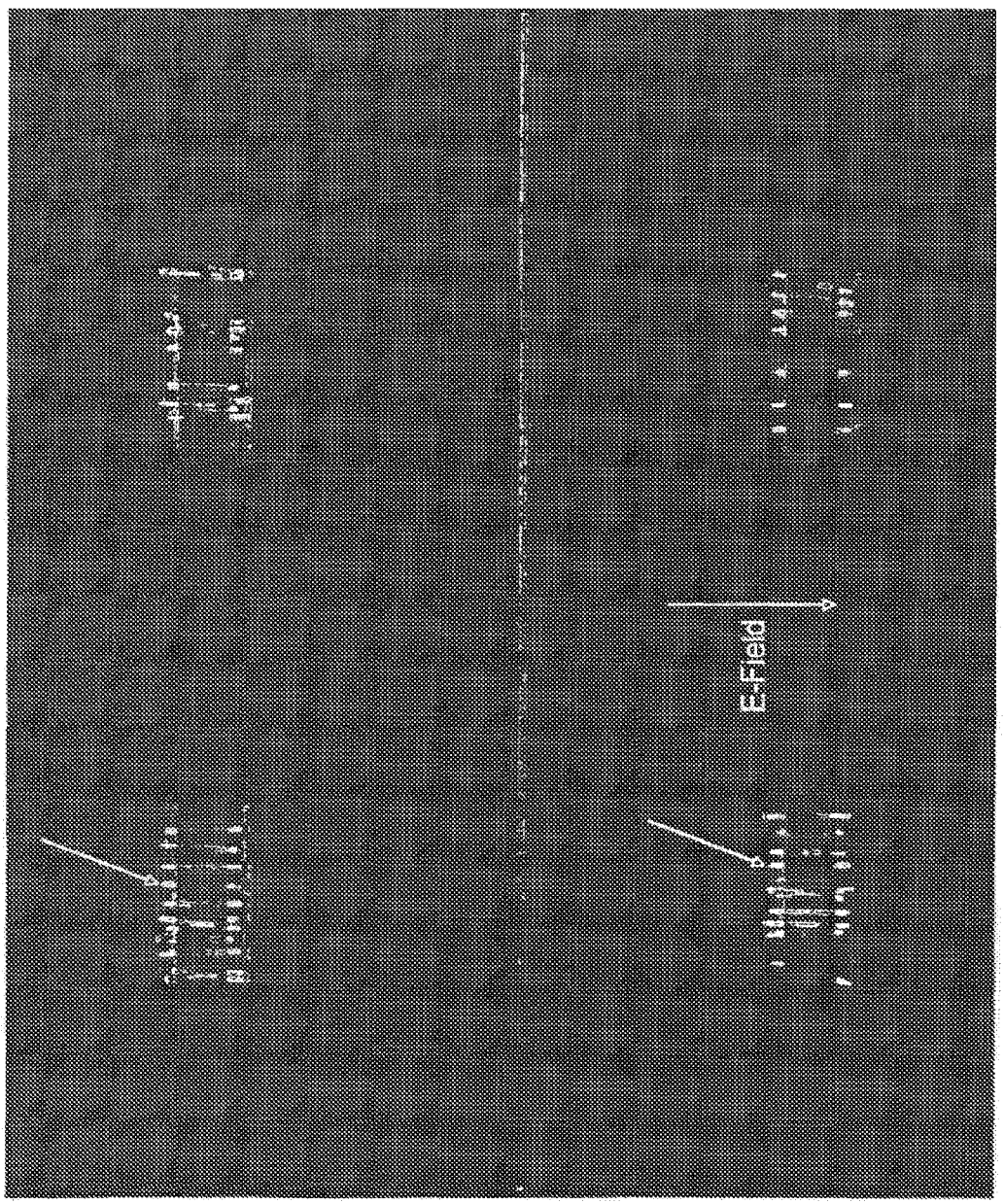
FIG. 8b is a micrograph showing the coupling of nanowires onto electrode pairs.
Figure 11:
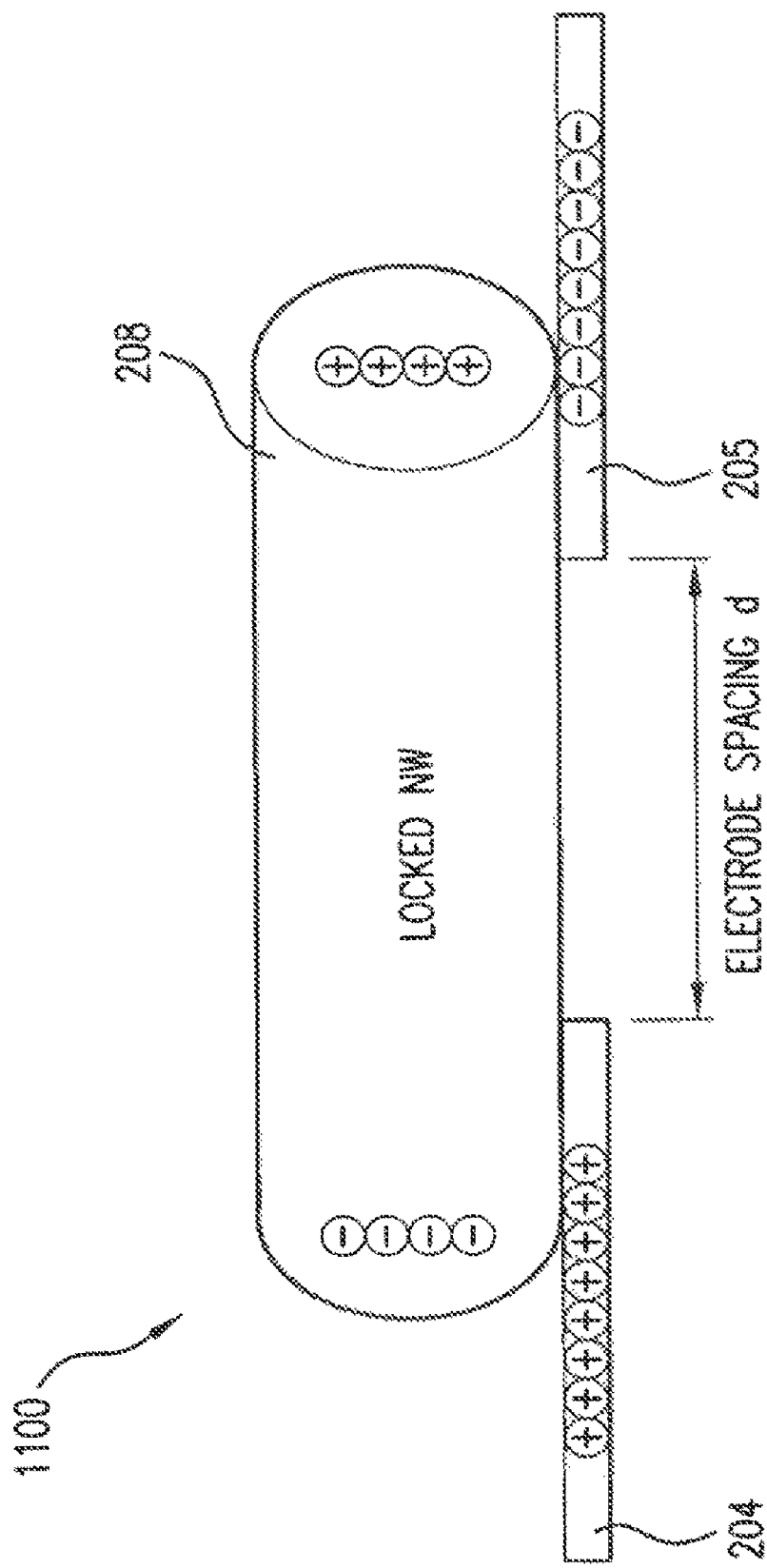
FIG. 11 is a schematic showing the coupling of a nanowire onto an electrode pair in accordance with one embodiment of the present invention.

Suitably, modulating the energizing (e.g., the AC electric field) between the electrode pairs causes the nanowires to be come coupled or "locked" onto the electrode pair. "Coupling" or "locking," as used herein, refers to a state in which the nanowires become so strongly attracted to the electrodes that they do not continue to move or shift under continued frequency modulation or under flow conditions (generally moderate flow), and also remain in their aligned state. While not wishing to be bound by the following theory, it is hypothesized that upon modulation of the AC field, the equilibrium between opposing forces represented in FIG. 11 (dielectrophoretic and electro-osmotic) is shifted such that the dielectrophoretic force becomes greater than the electro-osmotic force, and hence the nanowires are drawn closer to the electrodes than in the "association phase" described above. As the nanowires reach a critical distance from the electrodes, localized forces, such as van der Walls force, are strong enough to couple the nanowires to the electrodes. As shown in FIG. 11, the nanowire 208, coupled or locked to the electrode pair (204, 205), is substantially immobile. FIG. 8b shows a micrograph of the same four electrode pairs as shown in FIG. 8a, following modulation of the AC electric field (change from association phase to coupling phase). Almost immediately after modulating the AC field to a frequency and/or amplitude at which nanowire coupling occurs, the nanowires attract to the electrodes and then become substantially immobilized. As shown in FIG. 8b, the ends of the wires that are in contact with the electrode surface, and now coupled to the electrodes via van der Walls attractions (or some other force), appear to glow in the micrograph (arrows in FIG. 8b). Video of the process shows that the wires no longer are able to migrate, rearrange, align or otherwise move as in the association phase in FIG. 8a.

Modulating the energizing of the electrode pair, suitably modulating the frequency of the AC electric field, includes increasing the frequency of the field (from that of the association phase above) to the range of about 1 kHz to about 500 kHz, suitably about 1 kHz to about 400 kHz, about 1 kHz to about 300 kHz, about 1 kHz to about 200 kHz, about 1 kHz to about 100 kHz, about 10 kHz to about 100 kHz, about 20 kHz to about 100 kHz, about 30 kHz to about 100 kHz, about 40 kHz to about 100 kHz, about 50 kHz to about 100 kHz, about 60 kHz to about 100 kHz, about 70 kHz to about 100 kHz, about 80 kHz to about 100 kHz, about 90 kHz to about 100 kHz, or about 100 kHz. It should be understood that other frequency ranges above those described herein can also be utilized. Modulating the frequency also includes decreasing the frequency of the AC field, e.g., decreasing the frequency to about 1 Hz to about 10 Hz.

Modulating the amplitude of the AC electric field also includes increasing the amplitude of the field (from that of the association phase above) to the range of about 2 V to about 20 V, suitably about 2 V to about 10V, about 3 V, about 4 V, about 5 V, about 6 V, about 7 V, about 8 V or about 9V. It should be understood that other amplitude ranges above those described herein can also be utilized. Modulating the amplitude also includes decreasing the amplitude of the AC field, e.g., decreasing the amplitude to about 0.01 to 0.1 V.

In suitable embodiments of the present invention, the frequency and the amplitude of the AC field are modulated at the same time, or substantially the same time (within a few minutes of each other for example). For example, both the frequency and the amplitude can be increased from the values used during the association phase, thereby causing the nanowires to couple onto the electrodes. For example, the frequency and amplitude ranges used in the association phase, e.g., between about 10 Hz and about 1 kHz, and between about 0.5 V and 2 V, can be increased to ranges where the nanowires couple onto the electrodes, e.g., between about 1 kHz and about 100 kHz, and between about 2 V and about 10 V. In suitable embodiments, the frequency and amplitude values utilized during the association phase, e.g., about 500 Hz and 1 V, are modulated to about 10 kHz, or about 100 kHz, and about 4 V.

In additional embodiments of the present invention, the frequency and amplitude can be modulated separately. That is, for example, the frequency of the electric field can first be increased from a value utilized during the association phase to a higher frequency, and then the amplitude of the electric field can be increased at some later time (or the amplitude can be modulated before the frequency). For example, the amplitude can be increased after about a few seconds, a few minutes or several minutes (e.g., 5, 10, 20, 30, 40 minutes) after the frequency is increased. Suitably, the frequency and amplitude ranges used in the association phase, e.g., between about 10 Hz and about 1 kHz, and between about 0.5 V and 2 V, can be increased to ranges where the nanowires couple onto the electrodes, e.g., between about 1 kHz and about 100 kHz, and between about 2 V and about 10 V.

In a further embodiment of the invention, modulation of the frequency before modulating the amplitude can be used to further align the nanowires prior to the ultimate coupling onto the electrodes. For example, the frequency and amplitude ranges used in the association phase, e.g., between about 10 Hz and about 1 kHz, can first be modulated by only increasing the frequency, for example to from about 10 kHz to about 100 kHz, while maintaining the amplitude at the association phase level, for example between about 0.5 V and 2V, suitably about 1 V. It has been determined that by maintaining the amplitude of the electric field at a relatively low amplitude (e.g., 1 V peak-to-peak) and then modulating the frequency from about 500 Hz up to about 100 kHz, nanowires that are associated with electrodes will migrate and rearrange such that in some cases they attain better alignment than in the association phase (i.e., less wires crossing or at angles that are not parallel to each other).

Figure 10A:
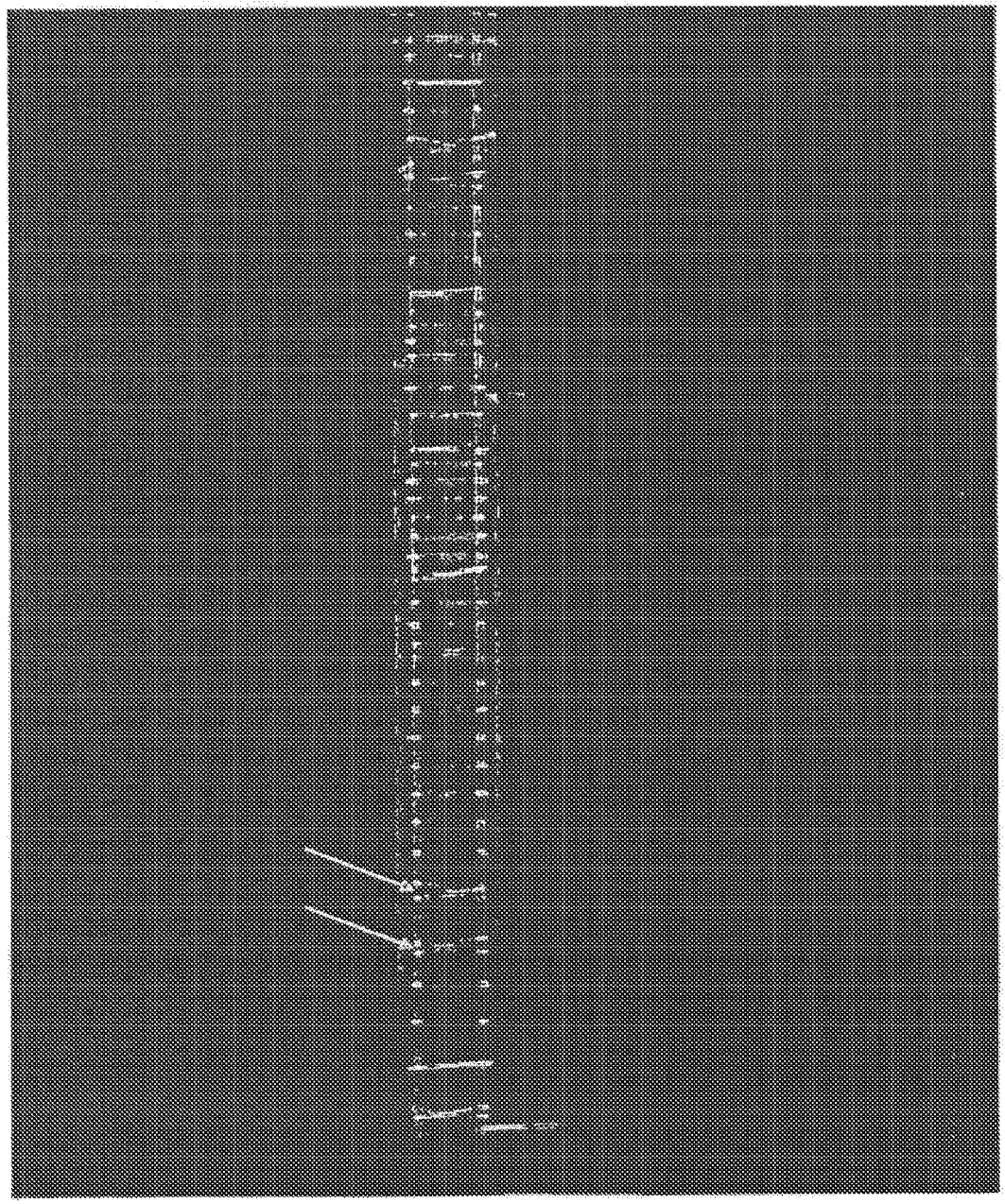
FIG. 10a is a micrograph showing associated nanowires prior to the modulation alignment phase.
Figure 10B:
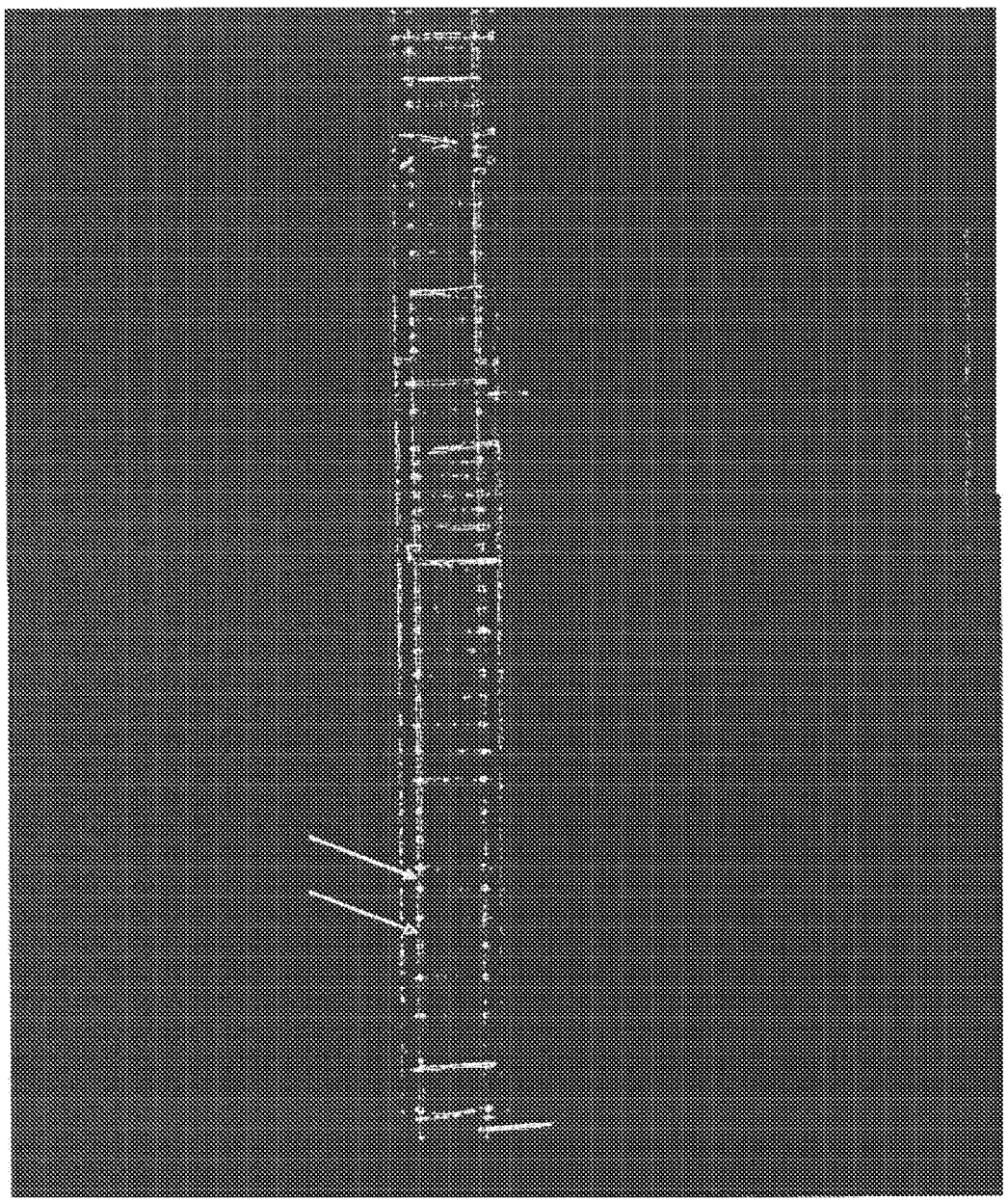
FIG. 10b is a micrograph showing the same nanowires as in FIG. 10a, following the modulation alignment phase.

Modulating (e.g., increasing) the frequency in this manner has also been noted to uncross or untangle nanowires that may have been crossed or in contact with each other in the association phase. Provided that there is sufficient space available on the electrode surface (i.e., the density is not exceedingly high), the nanowires are able to uncross and rearrange such that a greater number of nanowires are parallel after modulation, than prior to the modulation. For example, as shown in FIGS. 10a and 10b, nanowires that were initially crossed in FIG. 10a (arrows) are able to migrate and rearrange during the modulation alignment phase such that they are now uncrossed in FIG. 10b. This phase is termed "modulation alignment" throughout and is an alignment phase in addition to the alignment that takes place during the association phase. It should be understood that the modulation alignment phase is not critical to the practice of the present invention and can be omitted such that the methods of the present invention proceed from the association phase directly to the coupling phase.

Figure 10C:
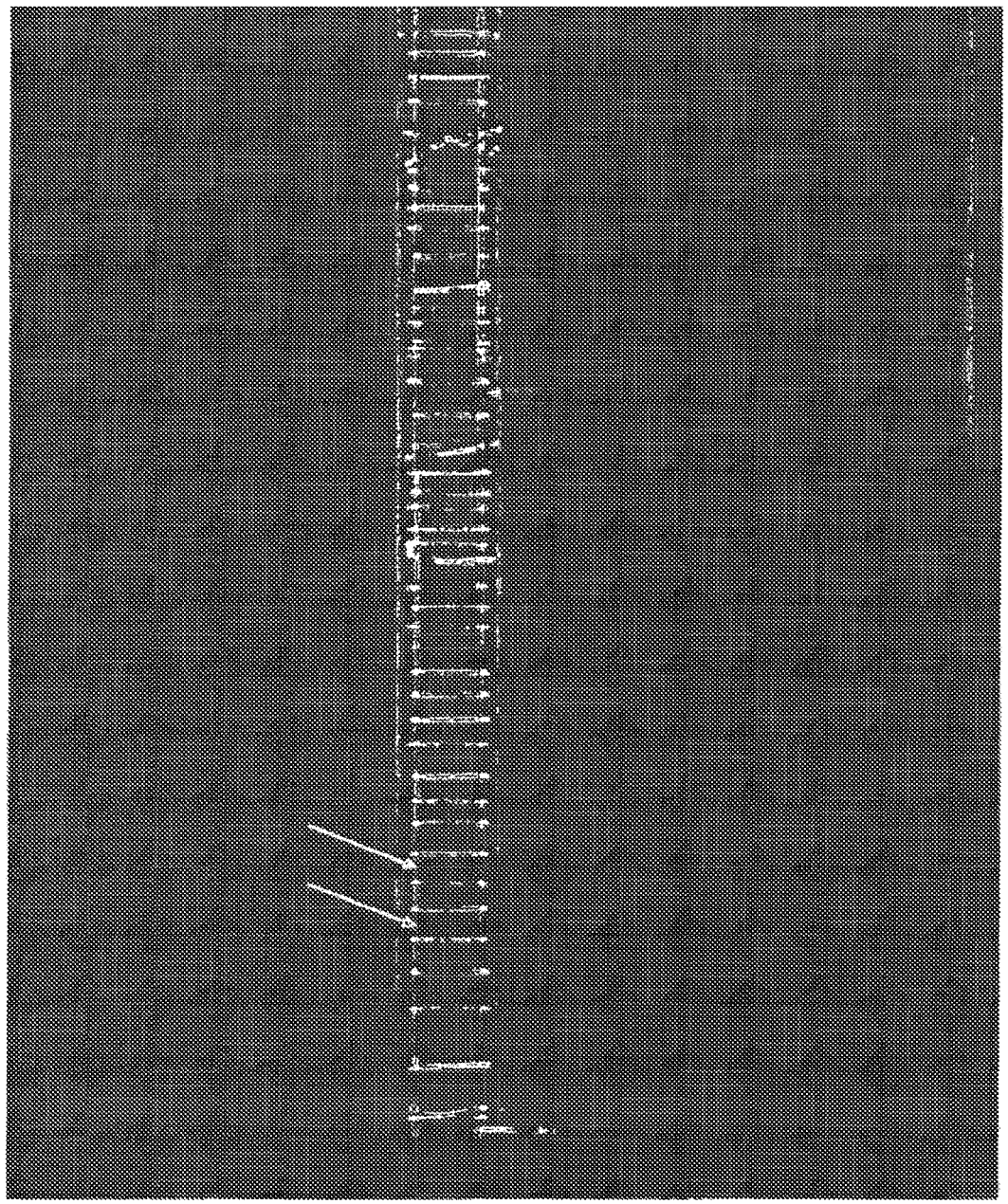
FIG. 10c is a micrograph showing the same nanowires as in FIG. 10b, following the coupling phase.

After the nanowires have been aligned sufficiently during the modulation alignment phase (if used) the amplitude is then modulated so as to cause the wires to couple onto the electrodes (see FIG. 10c, note intense brightness at nanowire tips where nanowires are coupled onto the electrodes). It should be noted that while additional frequency modulation is not necessary after the modulation alignment phase, additional modulation of the frequency can be used in order to cause the nanowires to couple onto the electrodes. In suitable embodiments, the amplitude of the electric field is increased from the range used during the association phase (and the modulation alignment phase), e.g., originally between about 0.5 V and about 2 V, to the amplitude range utilized for nanowire coupling e.g., increased to about 2 V to about 10 V, suitably about 4 V.

While the modulation frequencies and amplitudes described above can be utilized on any nanowire composition/structure, suitably they are used when positioning nanowires that are core:shell:shell (CSS) and/or core:no oxide:shell (CNOS) in composition. In cases where CSS and/or CNOS nanowires are utilized, the outermost shell layer is suitably a metal or other material which possesses a surface charge (either positive or negative). In solution, the outer (metal) shell attracts oppositely charged ions creating an electric double layer on the surface of the nanowire. The presence of a surface charge on the nanowires aids in association and coupling as described in the theory section above. The charge layer that forms on the nanowires also reduces, limits or eliminates nanowire crossing and/or clumping, as the nanowires tend to repel each other when brought in close proximity. As the nanowires are being associated/aligned with the electrodes, the lateral mobility of the nanowires, along with a repulsive surface charge, provides sufficient movement such that crossed nanowires are able to uncross and distribute themselves along the electrode (see, e.g., FIGS. 10a and 10b).

When positioning nanowires that comprise a core:shell (CS) structure (e.g., $SiO_2$), higher frequency and/or amplitude AC electric fields may be required to associate and couple nanowires onto electrodes. For example, nanowire association may require generation of an AC field with a frequency of about 1 kHz to about 50 kHz, more suitably about 5 kHz to about 20 kHz, or about 10 kHz, and an amplitude of about 1 V to about 10 V, suitably about 2 V to about 5 V, or about 2 V. Nanowire coupling of CS nanowires may require modulation of the AC field to a frequency of about 50 kHz to about 500 kHz, suitably about 75 kHz to about 200 kHz, or about 100 kHz, and amplitude modulation to about 3 V to about 10 V, suitably about 3 V to about 5 V, or about 4 V. Nanowires that do not comprise an outer (metal) shell layer, and therefore an outer charged layer, in general may require generation of higher frequencies and/or amplitudes to achieve association and/or coupling, as compared to nanowires that comprise an outer metal shell layer (i.e., CSS).

Thus, in suitable embodiments, the present invention provides methods for separating one or more conductive nanowires (e.g., CSS conducting nanowires) from a mixture of conductive and semiconductive (e.g., CS semiconductive) nanowires. As noted above, CSS nanowires suitably comprise an outer shell or of metal, thereby making these wires conductive. Thus, in suitable embodiments, a solution comprising one or more conductive nanowires and one or more semiconductive nanowires is provided proximate to an electrode pair. The electrode pair is then energized, whereby the conductive and semiconductive nanowires become associated with the electrode pair. Then, the energizing is modulated, whereby the conductive nanowires become coupled onto the electrode pair. The semiconductive nanowires are then removed.

Suitable methods for generating an AC field between the electrode pairs are described throughout, including a direct electrical connection and an electromagnetic wave. Exemplary AC electric fields useful in the association phase include AC fields having a frequency of about 10 Hz to about 5 kHz and an amplitude of about 0.5 V to about 3 V. Modulating the AC electric field by increasing the frequency to about 1 kHz to about 500 kHz, but maintaining or increasing the amplitude of the AC field to about 1 V to about 4 V preferentially pins and locks the conductive nanowires (e.g., CSS nanowires), while semiconductive nanowires are not coupled (locked). Subsequent removal of uncoupled, semiconductive nanowires, provides a method for selectively removing conductive nanowires from suspension. Thus, the conductive nanowires that are coupled to the electrodes can be utilized in various applications, and similarly, semiconductive nanowires remaining in the solution (now substantially free of conductive nanowires) can also be utilized in additional applications.

In further embodiments, alignment, association and coupling can be performed using nanowires that are n-doped on one end and p-doped on the opposite end. The use of two different dopings results in nanowires that will have two induced dipoles when an electric field is applied. As electrons are more mobile in n-doped materials as compared to p-doped materials, the n-doped "end" of a nanowire will have a stronger dipole than the p-doped "end." Consequently, the differences in doping of the nanowires allows for alignment and deposition in a predetermined direction. For example, a set of electrodes can be used (e.g., three or four electrodes, though more electrodes can be used) in which one pair of electrodes is energized at a higher level than a second pair. Suitably, pairs of electrodes in an electrode set are positioned such that one electrode pair is in the same plane as the other pair, for example next to each other or one pair above another pair (e.g., positioned in line with each other on the substrate). Nanowires are drawn toward the electrode set as noted throughout. However, due to the higher electric field between two of the electrodes, the n-doped end of the nanowires tends to associate and couple with these electrodes, while the p-doped end of the nanowires associates and couples with the lower electric field pair. In this way then, nanowires can be aligned in predetermined directions such that substantially all of the nanowires (e.g., greater than 50%, greater than 60%, greater than 70%, greater than 80%, greater than 90%, and suitably about 100% of the nanowires) align in the same orientation and direction (i.e., n-doped ends all pointing the same direction). Alignment and deposition performed in this manner is especially useful when preparing arrays of nanowires, for example, for use as diodes, where all of the n-doped ends of nanowires are positioned together on one side of an electrode set.

In embodiments in which a waveguide or similar instrument is used to generate an electric field, nanowire alignment, association and coupling can occur within a single step. That is modulation of the frequency and/or amplitude is not required (though it can be used) to achieve nanowire coupling. For example, when a waveguide is utilized, frequencies on the order of about 1 GHz to about 5 GHz are utilized to generate an electric field. Suitably, the frequency is about 2 GHz to about 3 GHz, or about 2.3 GHz to about 2.5 GHz, for example about 2.45 GHz. The amplitude of the electric field generated by the waveguide is suitably on the order of about 1 V to about 10 V. Generation of an electric field at frequencies of this magnitude cause nanowires to align, associate and couple at substantially the same time. Upon generation of an electric field using a waveguide, nanowires are aligned, associated and coupled onto the electrode pairs, suitably in one nearly continuous step or motion. A separate modulation of the frequency and/or amplitude is therefore not required (though modulations can be used) to couple the nanowires onto the electrodes.

Figure 12:
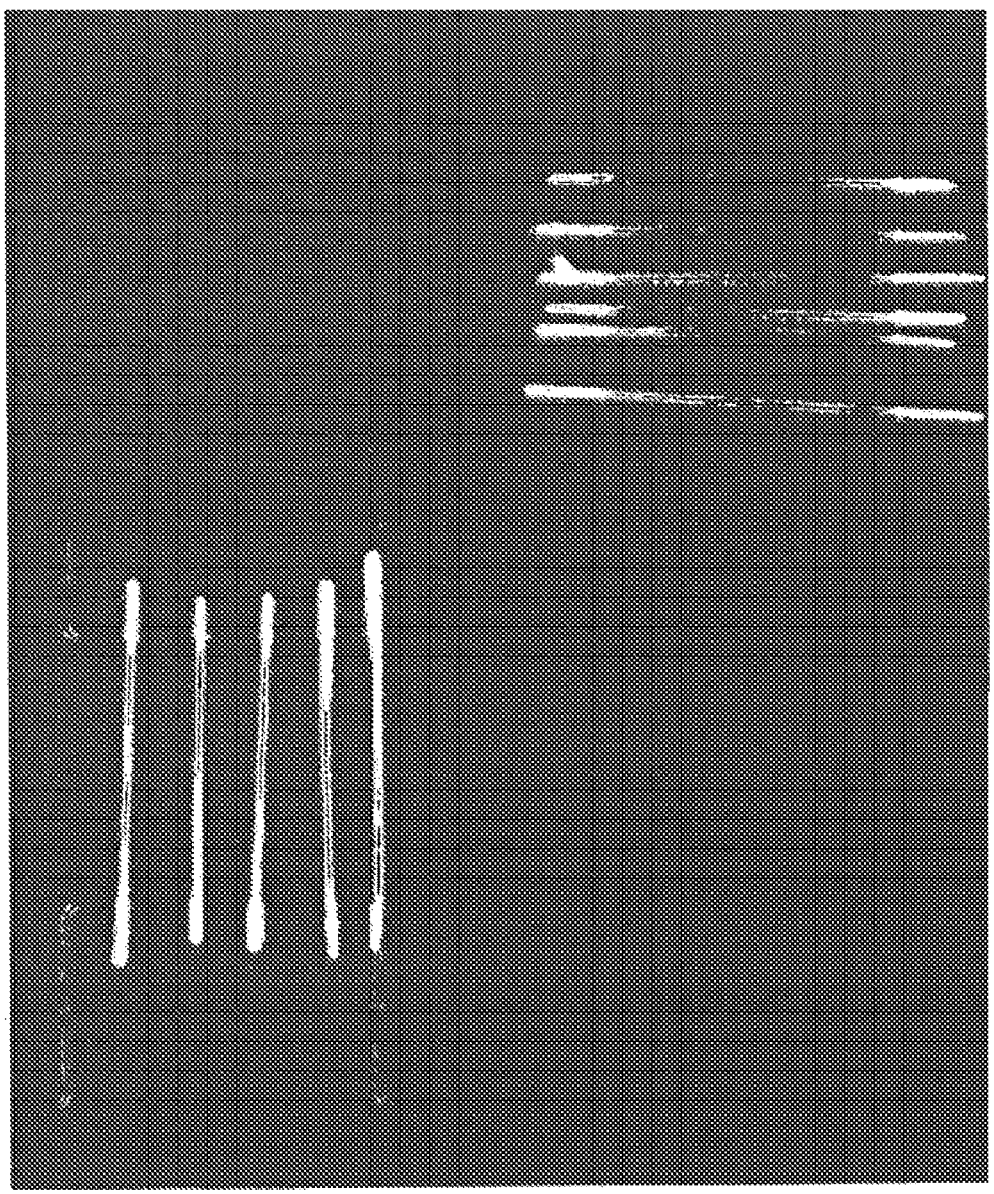
FIG. 12 is a micrograph showing nanowires coupled in both the x and y planes.

In additional embodiments, a nanowire suspension is simply placed on top of electrode pairs 207, without a flow of the suspension, and thus the nanowires are in a stationary suspension prior to alignment and deposition. Upon application of an electric field, nanowires associate and couple as described throughout. However, due to the lack of fluid flow conditions, the nanowires are not pre-aligned prior to deposition. This allows for nanowire deposition in directions that are normal to one another (i.e., in both the x and y directions). For example, as shown in FIG. 12, nanowires can be aligned and deposited in orientations that are perpendicular to one another, simply by providing electrode pairs in the desired orientation. In addition to deposition in x and y directions, nanowires can be deposited an any direction or orientation. These embodiments are particularly useful in electric device construction where it is often desired to have wires in several different orientations, including in orientations perpendicular to each other.

Figure 13:
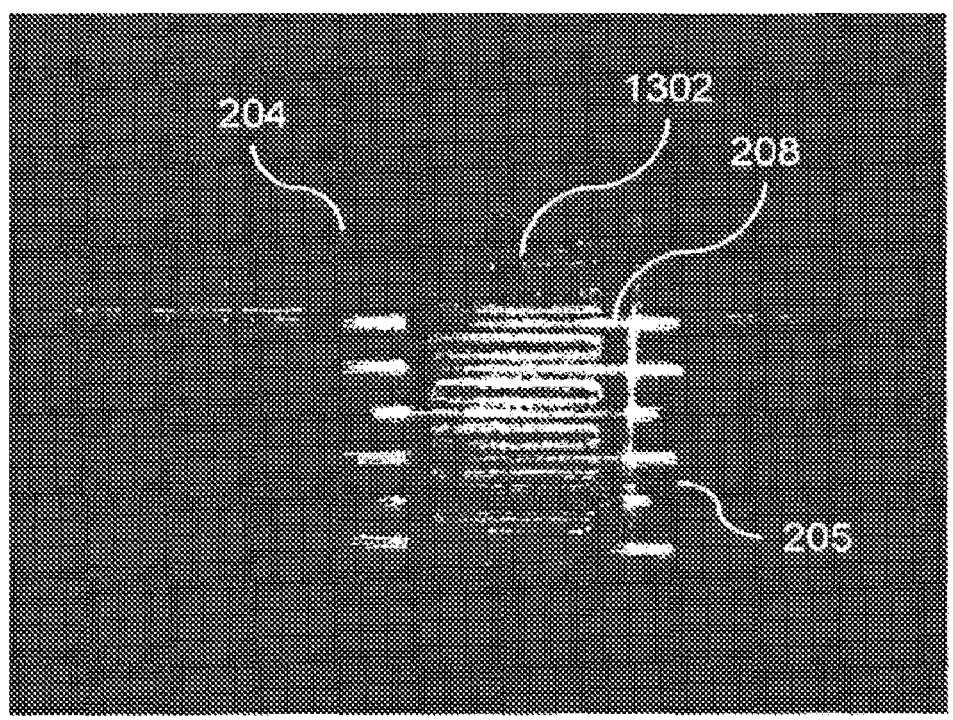
FIG. 13 is a micrograph showing nanowires aligned with the aid of metallic elements positioned between electrodes, in accordance with one embodiment of the present invention.

In a further embodiment, placement of one or more metallic elements between electrode pairs can be used to enhance or aid nanowire alignment and deposition. For example, as shown in FIG. 13, depositing or positioning one or more metallic elements 1302, for example metallic strips, between electrodes 204 and 205 of an electrode pair, aids in nanowire 208 alignment on the electrodes. Any suitably metal can be used in the methods of the present invention, for example, Al, Cu, Fe, Au, Ag, etc., or combinations thereof. FIG. 13 shows that nanowires align and deposit in a substantially straight and aligned fashion, each depositing between a pair of metal elements. By selecting the size and orientation of metallic elements 1302, the spacing between nanowires can be controlled and tailored such that the association and coupling of substantially evenly spaced, parallel, aligned nanowires can be achieved.

The present invention also provides methods for positioning one or more nanowires. In such methods, one or more nanowires are provided proximate to an electrode pair. The electrode pair is then energized, whereby the nanowires become associated with the electrode pair, wherein one or more metallic elements are positioned between electrodes of the electrode pairs, such that inter-nanowire distances between adjacent associated nanowires vary by less than about 50% of a standard deviation. In further embodiments, the methods further comprise modulating the energizing between the electrode pairs, whereby the nanowires become coupled onto the electrode pair, and wherein one or more metallic elements are positioned between electrodes of the electrode pairs, such that inter-nanowire distances between adjacent coupled nanowires vary by less than about 50% of a standard deviation. See e.g., FIG. 13. The present invention therefore provides methods for positioning nanowires such that the inter-nanowire distances between adjacent nanowires can be controlled to such a degree that the distances vary less than about 50% of a standard deviation from the mean of the distances. As used herein, adjacent nanowires refers to associated and/or coupled nanowires that are positioned next to each other with no other nanowires between them. As used herein, inter-nanowire distances refers to the distance between adjacent nanowires. As discussed herein with reference to inter-nanowire distances, a standard deviation indicates the standard deviation of the mean (average) of the inter-nanowire distances. The standard deviation of the mean of inter-nanowire distances can be readily calculated, by first calculating the mean of the inter-nanowire distances (Sum of inter-nanowire distances/number of distances). The standard deviation of the mean ($\sigma$) is then calculated as:

$$\sigma = \sqrt{\frac{1}{N}\sum_{i=1}^{N}(x_i - \bar{x})^2}$$

where $x_i$ represents each of the individual inter-nanowire distances, x-bar is the mean of the inter-nanowire distances, and N is the total number of inter nanowire distances.

By utilizing the methods of the present invention incorporating metallic elements positioned between the electrodes, the inter-nanowire distances between adjacent nanowires can be controlled such that the variation between these distances will be less than about 50% of a standard deviation from the mean, for example, less than about 40%, less than about 30%, less than about 20% or less than about 10% of a standard deviation from the mean.

The present invention also provides substrates comprising at least a first pair of electrodes and at least four nanowires coupled between the first pair of electrodes, wherein the inter-nanowire distances between adjacent coupled nanowires varies by less than about 50% of a standard deviation. In suitable embodiments, the substrates further comprise three or more metallic elements positioned between the electrodes of the first electrode pair. See e.g., FIG. 13. In suitable embodiments, the substrates comprise at least four nanowires coupled between a first pair of electrodes, wherein the inter-nanowire distances between adjacent coupled nanowires varies by less than about 50% of a standard deviation from the mean, for example, less than about 40%, less than about 30%, less than about 20%, or less than about 10% of a standard deviation from the mean.

In a still further embodiment, one of the electrodes of an electrode pair can comprise two or more electrodes in the same plane (i.e., a split electrode configuration), each of which is connected to a separate source of an AC field. In these embodiments, an AC field can be generated between both electrodes of the split electrode configuration and the other electrode of the pair in such a way that the AC field at one of the electrodes of the split electrode configuration is modulated to provide nanowire association and coupling, while the other electrode is not modulated. In such a configuration, substantially straight nanowires of a preferred length associate and couple between the modulated electrode of the split configuration and the other electrode of the pair, while the non-modulated electrode attracts stray, undesired nanowires, thus removing them from the alignment process. In this way, substantially parallel and uniform nanowire deposition can be achieved.

Following coupling of the nanowires onto the electrodes, uncoupled nanowires can then be removed from the electrode pairs so as to substantially eliminate nanowires that are not fully aligned, not fully coupled, overlapped, crossing, or otherwise not ideally coupled to the electrode pair. Nanowires that are to be removed following the coupling phase are described herein as "uncoupled nanowires." Any suitable method for removing uncoupled nanowires can be used. For example, the uncoupled nanowires can be removed using tweezers (e.g., optical tweezers, see, e.g., U.S. Pat. Nos. 6,941,033, 6,897,950 and 6,846,084, the disclosures of each of which are incorporated herein by reference in their entireties) or similar instrument, or by shaking or physically dislodging the uncoupled nanowires. Suitably, uncoupled nanowires are removed by flushing away the nanowires.

Figure 8C:
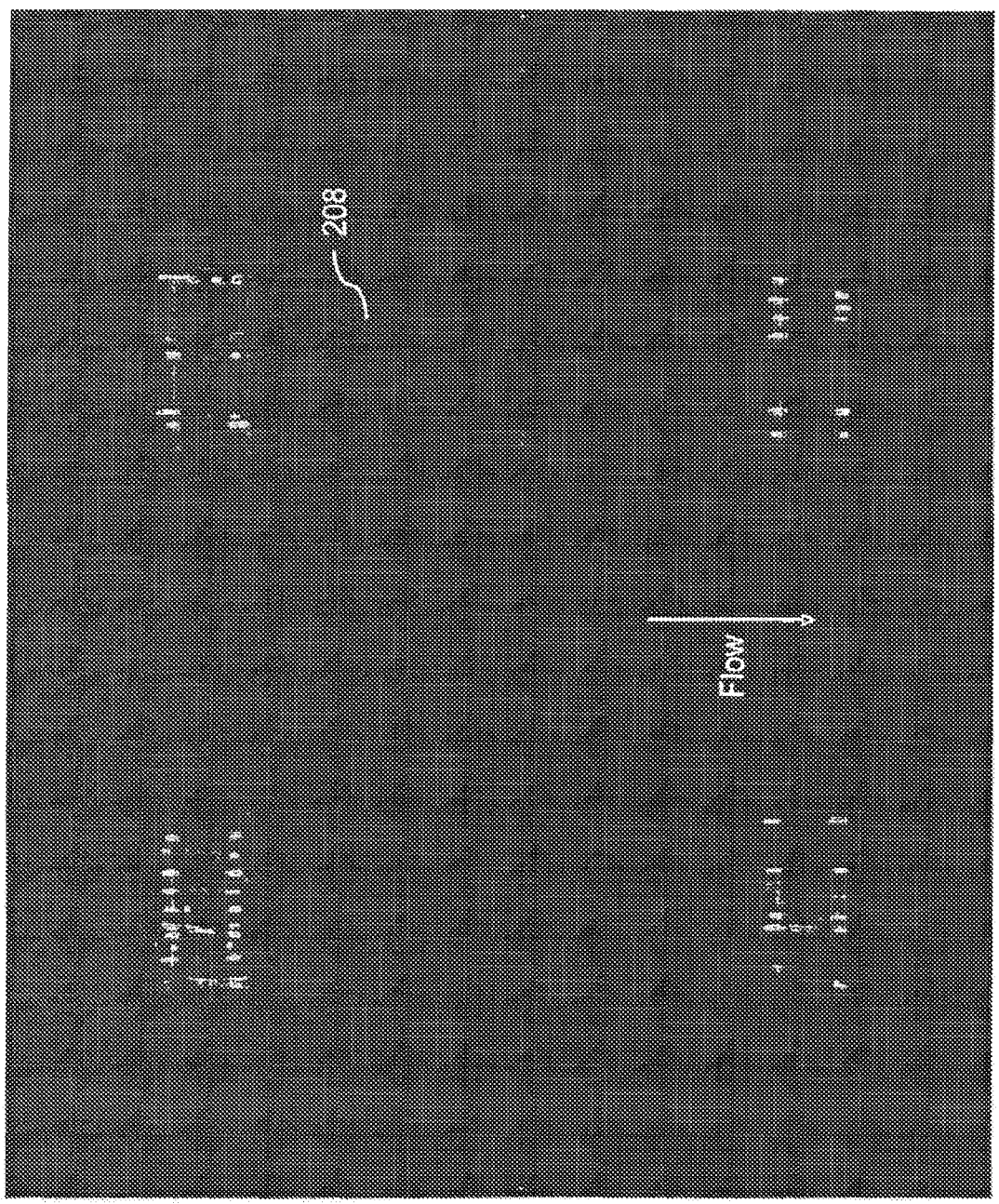
FIG. 8c is a micrograph showing the removal of uncoupled nanowires from electrode pairs.

As used herein, the term "flushing away" includes processes where a fluid (either gaseous or liquid phase) is flowed over or around the nanowires so as to remove them from the electrode pairs. Flushing away also includes translating or moving the electrode pairs so as to create a flow of fluid over the nanowires. In suitable embodiments, a liquid is flowed over the nanowires so as to flush away uncoupled nanowires. Flowing a liquid over the nanowires includes simply the application of a liquid to the nanowires as well as causing a liquid to move over the nanowires with a velocity such that uncoupled nanowires are flushed away. Fluid velocities for flushing away uncoupled nanowires can be generated using any method known in the art, including, but not limited to, gravity, a nozzle or spray apparatus, a suction apparatus and the like. As shown in FIG. 8c, suitably the direction of fluid flow is parallel to the nanowires, and hence perpendicular to the electrode pairs, though any direction of fluid flow can be used. As shown in FIG. 8c, uncoupled nanowires (208) that were either not completely coupled to the electrodes are washed away in the fluid flow. The arrows in FIG. 2 represent an exemplary direction of fluid flow when utilizing apparatus 200. It should be understood that the removal of uncoupled nanowires, while designed to remove many if not all uncoupled nanowires, may in fact leave some uncoupled nanowires still contacting the electrode pairs. The ordinarily skilled artisan will readily understand remaining uncoupled nanowires will not significantly impair further use of coupled nanowires. Any suitable liquid can be used to flush away uncoupled nanowires, for example, a solvent such as IPA, water or other aqueous solvent and the like. Suitably the solvent is the same solvent that originally contained the nanowires, just without additional nanowires present in the suspension. Flushing of the nanowires can be performed in any direction relative to the nanowires (i.e., parallel, perpendicular, or other orientation). As the nanowires are coupled onto the electrodes and therefore fixed in that position, fluid flow conditions do not disturb that coupling, even if the flow is normal to the plane of nanowire alignment.

Figure 8D:
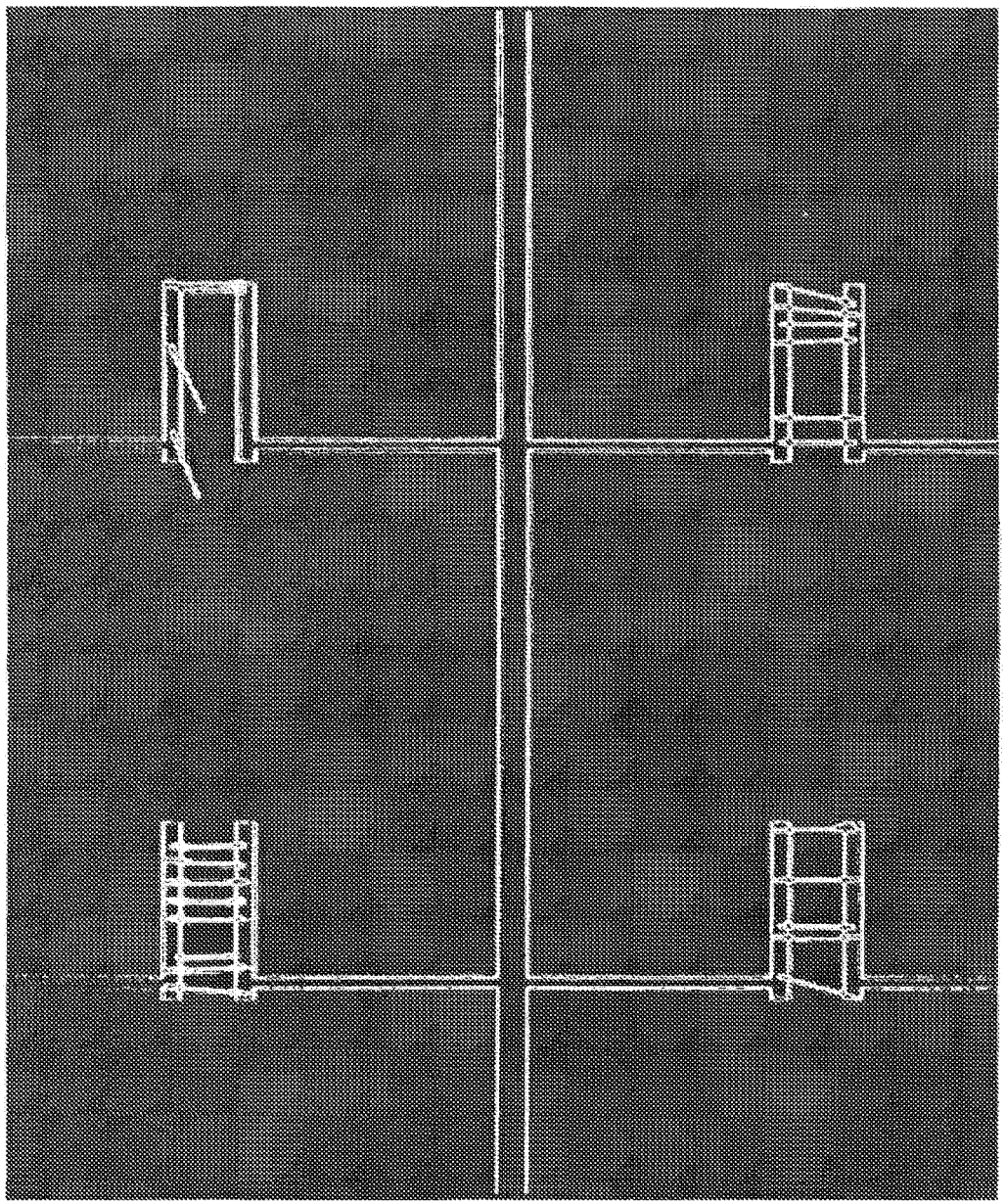
FIG. 8d is a micrograph showing nanowires coupled to electrode pairs following drying.

In addition to removing one or more uncoupled nanowires from the electrode pairs, the nanowires are also suitably dried following the coupling phase. Generally, drying will occur after the removal of uncoupled nanowires, but it is not necessary to remove uncoupled nanowires prior to drying. Drying of the nanowires can occur via any suitable process known in the art, for example, air drying (whether stagnant or moving) to allow for evaporation, heating using an oven or other suitable device, or other mechanism. FIG. 8d shows a micrograph of coupled nanowires following a drying process.

Figure 14A:
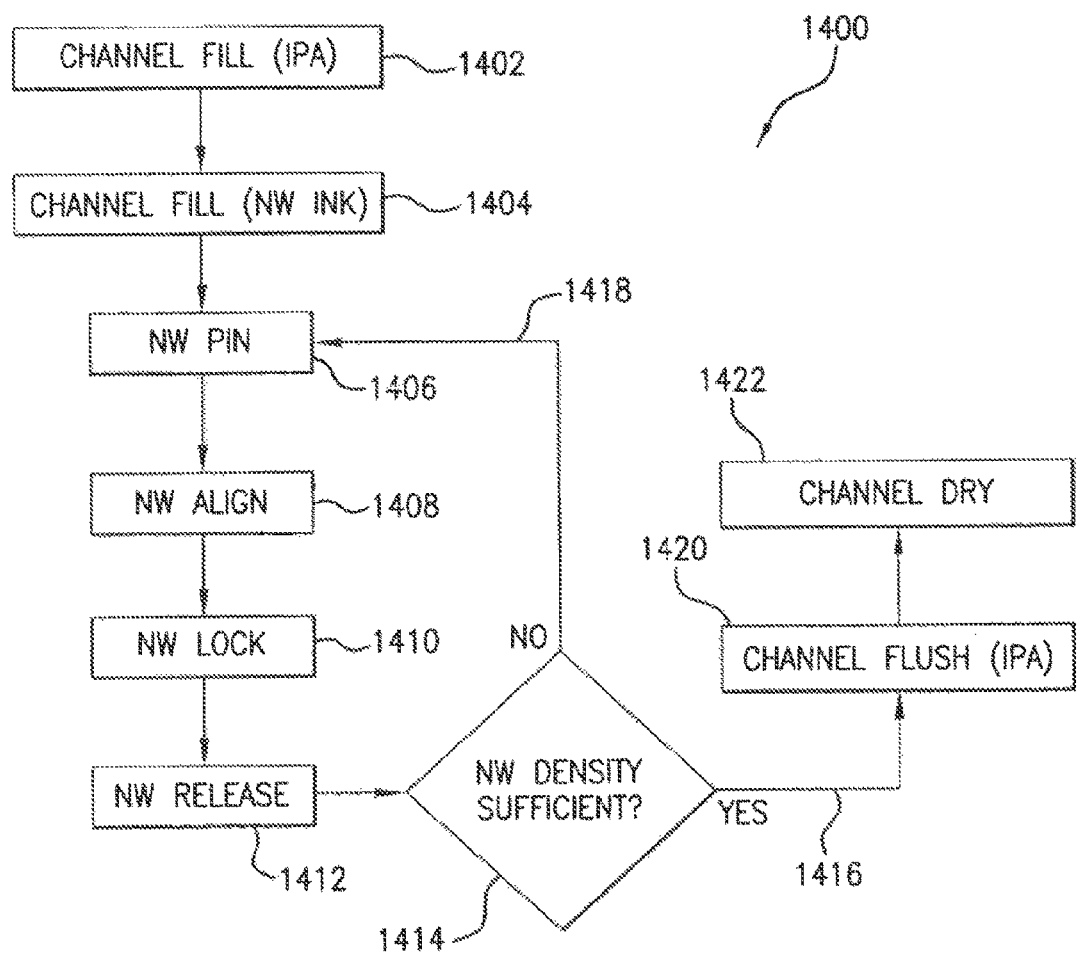
FIG. 14a represents a flowchart showing a method of nanowire alignment and deposition in accordance with one embodiment of the present invention.

FIG. 14a represents a flowchart 1400 showing a method of nanowire alignment and deposition in accordance with one embodiment of the present invention. In step 1402 of flowchart 1400, a channel, for example channel 206 as represented in FIG. 2, is first filled with a suitable solvent, for example, IPA. It should be noted that the initial filling of the channel is not required. In step 1404, the channel is then filled with a nanowire suspension, for example a nanowire ink. As noted throughout, it is not necessary to utilize a channel, but rather the nanowire suspension can simply be placed directly on the electrode pairs. The nanowires are then associated or pinned to the electrodes in step 1406, suitably as set forth in the association phase as described throughout. En suitable embodiments, the electric field is then modulated so as to align the nanowires 1408. As described throughout, suitably the alignment modulation phase comprises increasing the frequency to between about 10 kHz and about 100 kHz to allow nanowires that are crossed or not optimally aligned to migrate and align on the electrodes. As discussed throughout, alignment modulation phase, step 1408, is not required and can be omitted from the methods of the present invention.

Following alignment modulation (or association if alignment modulation is not utilized) the nanowires are then coupled or locked onto the electrode pairs in step 1410, by modulating the electric field as described throughout. Suitably, the electric field is modulated by increasing both the frequency and the amplitude from the association phase. However, in embodiments where a modulation alignment phase is used, suitably only the amplitude of the electric field is increased, though the frequency can also be increased (or decreased if desired).

Uncoupled nanowires are then removed or released, in step 1412, from the electrode pairs using any of the methods described herein or otherwise known in the art. Suitably, nanowires are released or removed from the electrode pairs by flowing a liquid (e.g., IPA) over the nanowires.

After uncoupled nanowires have been removed from the electrode pairs, in step 1414, a decision analysis is made where it is determined whether a sufficient number or sufficient density of nanowires has been achieved by the alignment and deposition methods of the present invention (i.e., steps 1402-1412). This decision analysis can be made by inspecting the electrode pairs in any manner, for example, via visual inspection (microscope or other suitable device), or by using an electrical or other signal to monitor the number and/or density of nanowires at an electrode pair. A "sufficient number of nanowires" can be a pre-set or pre-determined number of nanowires, a number of nanowires that is determined at the time of deposition, or a number of nanowires that is dependent upon the electrical or other of characteristics of the wires. For example, as discussed throughout, a "sufficient number of nanowires" can be determined by measuring the impedance, capacitance, resistance or other characteristics of the nanowires coupled onto the electrode pairs.

If it is determined that a sufficient number of nanowires has been coupled onto the electrode pairs, decision analysis step 1414 will return an answer of "yes," in step 1416, following which, a final nanowire flush step 1420 will suitably begin. It should be noted that nanowire flush step 1420 is not required. Following this nanowire flush (or following a "yes" decision in step 1416), the nanowires are then dried in step 1422.

If is it determined that a sufficient number of nanowires has not been coupled onto the electrode pairs, decision analysis step 1414 will return an answer of "no," in step 1418. An answer of "no" means that a sufficient number of nanowires have not been deposited on at least one of the electrode pairs. Therefore, in order to provide for additional nanowire coupling, steps 1406 through 1412 are repeated. It should be noted that additional nanowires can also be provided, for example, via introduction of a nanowire suspension as in step 1404. Following alignment and deposition of an additional population of nanowires, a second, decision analysis, step 1414, is performed. At the end of this decision analysis, a sufficient number of nanowires will have either been deposited (an answer of "yes"), and the steps 1416, 1420 and 1422 will follow, or a sufficient number of nanowires will not have been deposited (an answer of "no"), and steps 1406-1412 are repeated. This type of feedback loop can be repeated as many times as necessary (e.g., 2, 3, 4, 5, 10, 15, 20, 50, 100 times, etc.) until a sufficient or desired number of nanowires are coupled onto the electrode pairs.

Figure 14B:
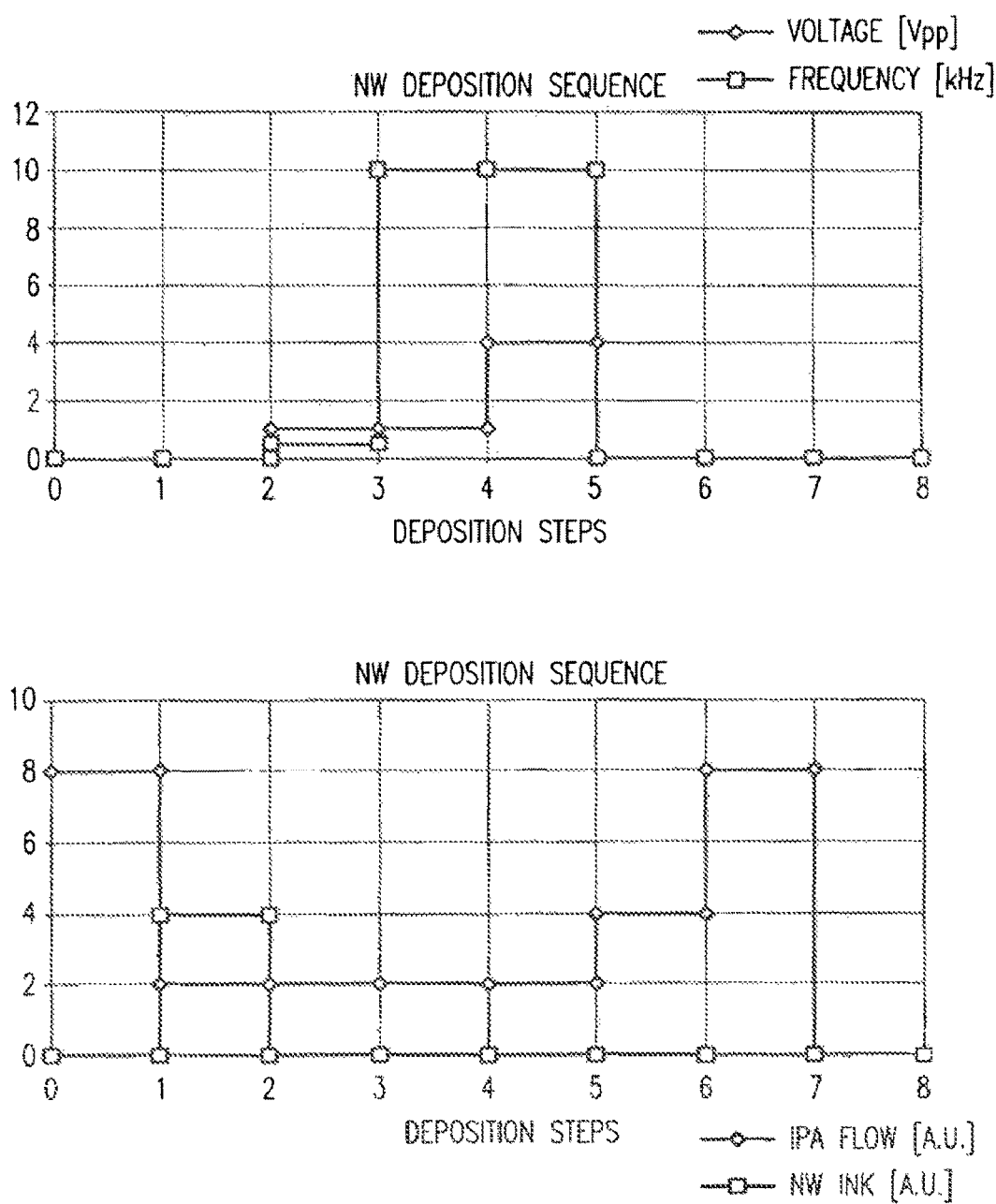
FIG. 14b represents a nanowire alignment and deposition sequence in accordance with one embodiment of the present invention.
Figure 14C:
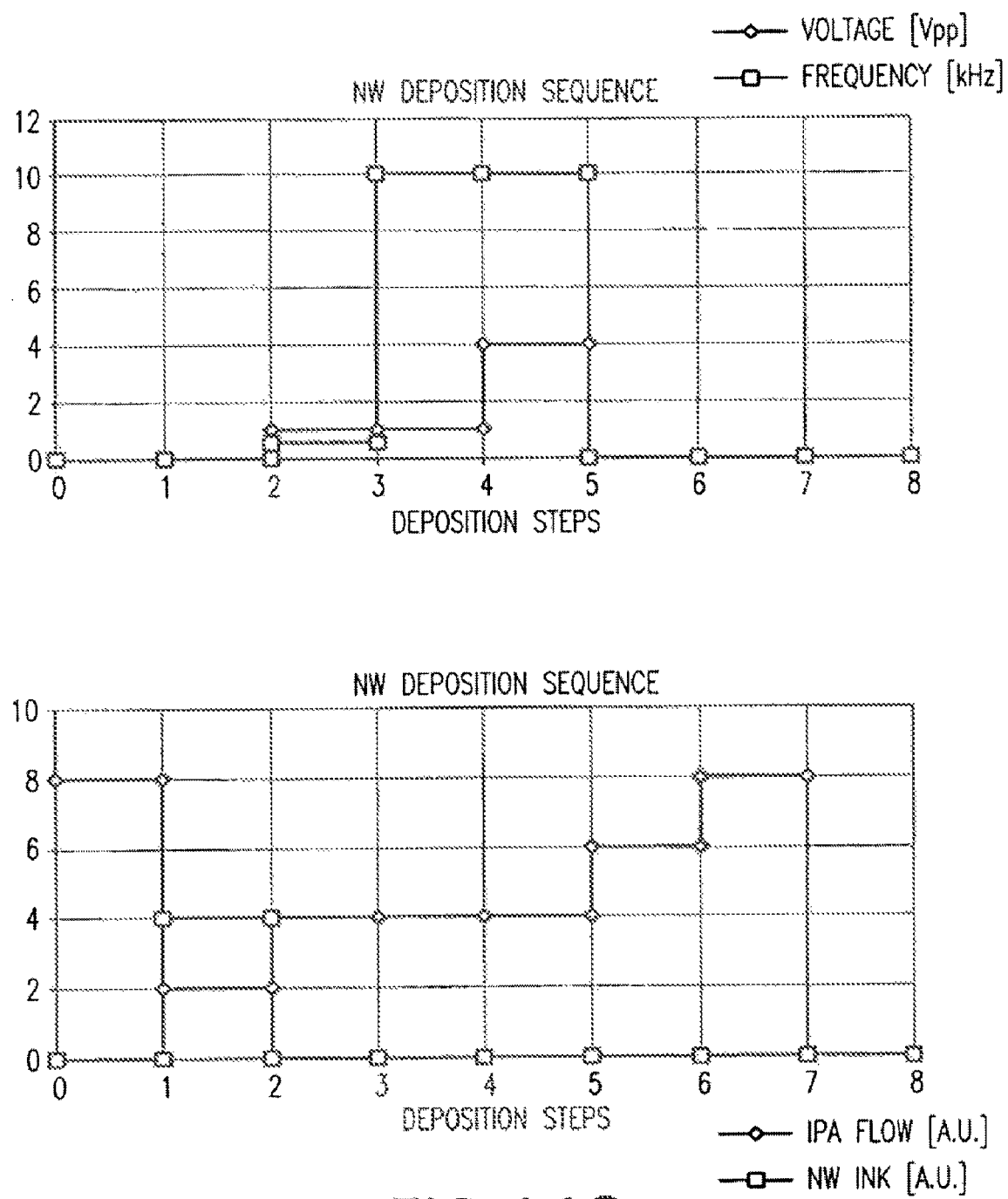
FIG. 14c represents an additional nanowire alignment and deposition sequence in accordance with one embodiment of the present invention.

FIGS. 14b and 14c represent exemplary nanowire alignment and deposition sequences in accordance with embodiments of the present invention. For all plots, the x axis represents a series of steps in an exemplary alignment and deposition process, for example, corresponding to steps 1402-1422 as shown in FIG. 14a. It should be noted that the amount of time between successive steps is not represented by the distance between the steps as some steps may occur soon after each other, while others may be separated by longer times. In FIG. 14b, the upper plot represents the voltage and frequency of the AC electric field at each of the process steps. As represented in FIG. 14b, suitably the electric field is off (i.e., amplitude and frequency are zero, or very low) during the channel fill steps (1402 and 1404, deposition steps 0 and 1) when a solvent and/or a nanowire suspension are added to the electrode pairs (e.g., in channel 206 as shown in FIG. 2).

Upon initiation of the association phase, represented by step 1406 and deposition step 2 in FIG. 14b, both the amplitude and the frequency of the AC electric field are turned on/increased such that nanowire association and alignment begin. Suitable amplitudes and frequencies for use during the association phase are described herein. For example, as represented in the upper graph of FIG. 14b, suitably the amplitude (voltage V) of the electric field is about 0.5 V to about 2 V, for example, about 1 V. The frequency of the electric field as represented in the upper graph of FIG. 14b is suitably about 100 Hz to about 1 kHz, for example, about 500 Hz.

As the deposition sequence moves to step 3, the modulation alignment phase represented as step 1408 in FIG. 14a, the frequency of the AC field is modulated, e.g., increased. As discussed throughout, suitably, during the modulation alignment phase, only the frequency of the field is increased, though the amplitude can be increased as well. Suitably, the frequency of the field is increased to between about 10 kHz and about 100 kHz (e.g., 10 kHz as shown in FIG. 14b), while maintaining the amplitude at the association phase level, for example between about 0.5 V and 2V, suitably about 1 V.

Moving to deposition step 4, the coupling or locking phase (represented as step 1410 in FIG. 14a), the amplitude of the AC electric field is modulated so as to cause the nanowires to couple onto the electrodes. As discussed throughout and represented in FIG. 14b, suitably the amplitude of the AC field is increased, while maintaining the frequency at the previous level (though the frequency can be increased as well). Suitably, the amplitude of the AC field is increased to between about 2 V and about 10 V, for example, to about 4V, so as to initiate the nanowire coupling phase.

Following nanowire coupling, the AC field is suitably turned off. For example, the frequency and the amplitude of the field are reduced to zero, or to substantially low values. This allows for removal of uncoupled nanowires (step 1412). A determination can then be made if a sufficient number of nanowires have been deposited (step 1414), prior to determining whether the alignment and deposition process needs to be repeated. If it is determined that there are sufficient nanowires deposited, the nanowires can then be dried.

The bottom plot in FIG. 14b represents the flow of solvent (e.g., IPA) and nanowire suspension (NW Ink) in arbitrary units during the deposition process. The deposition steps along the x-axis correspond to the same steps as described above with regard to the upper graph in FIG. 14b. Initially, during the channel fill step 0, step 1402, no nanowire suspension is introduced, and only solvent is flowing over the electrodes, though at a higher velocity/volume relative to later steps. Upon introduction of the nanowire suspension in step 1, the flow of the nanowire suspension is increased, and the flow of solvent is decreased, so as to allow for nanowire association during step 2, while maintaining a fluid flow to aid in nanowire alignment. After step 2, the nanowire suspension is shut off, leaving only the flow of solvent through steps 2-4, association (step 1406), modulation alignment (step 1408) and coupling (step 1410). Following the completion of coupling step 5 (step 1410), the flow of solvent is increased so as to aid in removal of uncoupled nanowires in step 6 (step 1412). This elevated flow is maintained during the decision analysis process (step 1414), and upon completion of all nanowire alignment and deposition, increased further in step 7 (step 1420) to finally flush the electrodes prior to drying in step 8 (step 1422).

FIG. 14c shows the sequence of an additional nanowire deposition process in accordance with an embodiment of the present invention. The sequence of amplitude and frequency modulation (upper graph) is the same as that in FIG. 14b. The flow of solvent and nanowire suspension, however, represents one exemplary alternative to that shown in FIG. 14b. In the lower graph of FIG. 14c, the sequence of flow of the nanowire suspension is the same as that in FIG. 14b. However, the flow of solvent has been increased by a factor of about 2 (flow is represented in arbitrary units) for steps 2-6 as compared to FIG. 14e. It should be noted that FIG. 14c simply represents an additional embodiment of the present invention in which the flow of solvent is increased. It should not be construed that the increase in flow must be on the order of two-fold, as more or less flow can be used.

In a still further embodiment, the present invention provides one or more electrodes comprising one or more nanowires positioned according to the methods described herein. Suitably, the electrodes comprise electrode pairs, and each electrode pair comprises a plurality of nanowires (e.g., more than 2, more than 5, more than 10, more than 20, more than 50 or more than 100 nanowires, etc.) coupled or pinned to the electrodes. As discussed throughout, the methods of the present invention allow for the alignment and deposition of nanowires on electrode pairs such that substantially all of the nanowires that are deposited are substantially parallel to each other and relatively evenly spaced. This aids in use of the nanowires in devices and helps with transferring nanowires to additional substrates or device contacts.

Figure 15:
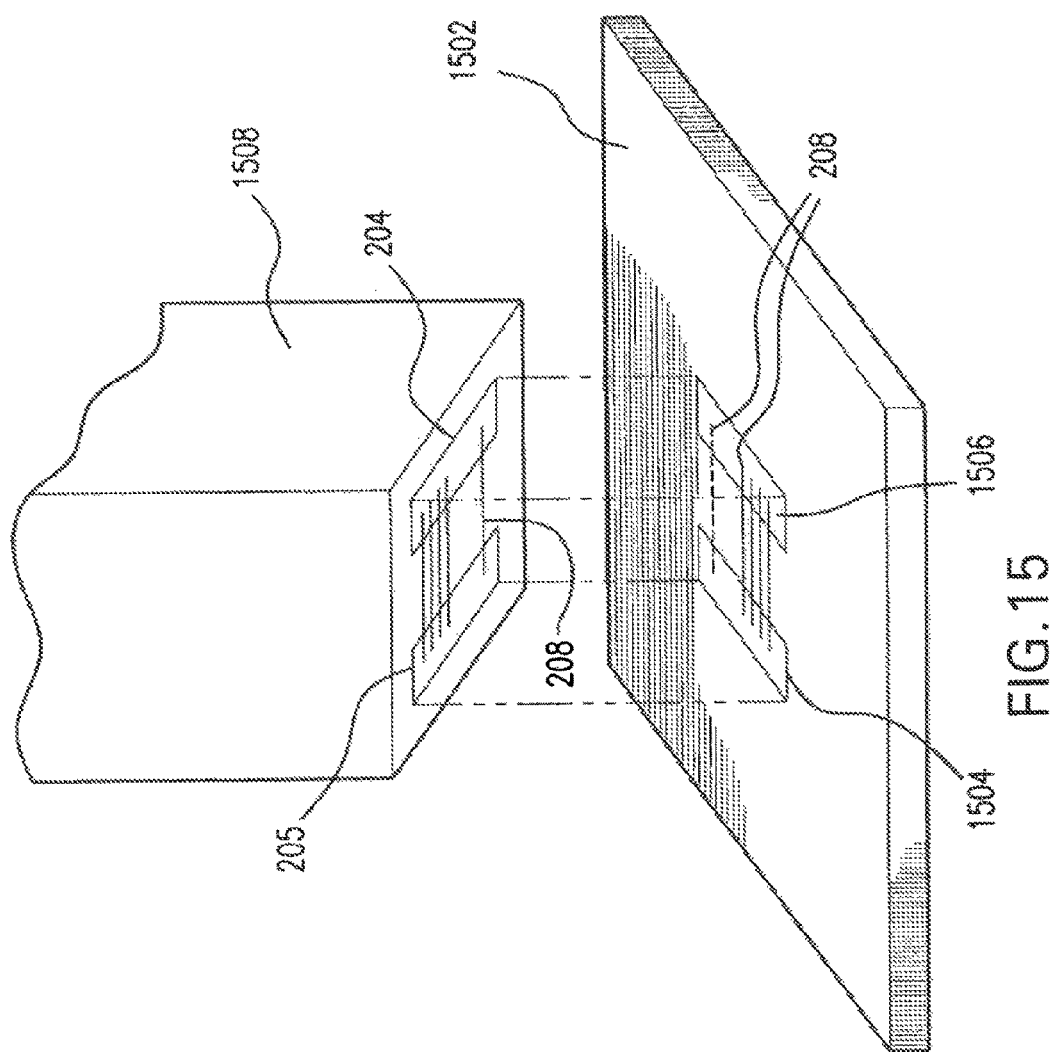
FIG. 15 is a schematic of an apparatus and method for nanowire transfer in accordance with one embodiment of the present invention.

In a further embodiment of the present invention, nanowires that are coupled onto the electrodes can then be transferred onto a substrate. Suitably, the nanowires have been dried prior to the transfer, though nanowires that have not been dried can also be transferred. As used herein, the term "transfer" means to move or relocate the nanowires from the electrodes on a transfer substrate to a receiving substrate. Receiving substrates that can be utilized in the transfer methods of the present invention include any suitable material, for example, semiconductor, dielectric material, etc. Suitably the receiving substrate utilized in the transfer methods comprises one or more device electrode or other suitable contact onto which nanowires are to be transferred (e.g., drain, gate or source electrodes). For example, as shown in FIG. 15, nanowires 208 that have been previously coupled to an electrode pair (204, 205) on a transfer substrate 1508 can be transferred to a receiving substrate 1502 which comprises additional contacts or electrodes (1504, 1506) patterned or positioned on its surface. Single nanowires can be transferred one at a time (see e.g., dotted line in FIG. 15), or multiple nanowires can be transferred from electrodes to the substrate/contacts.

In suitable embodiments, the transfer methods of the present invention provide a method for "printing" nanowires onto a transfer substrate which comprises one or more contacts or electrodes. For example, a transfer substrate 1508 comprising one or more electrode pairs (204, 205) which comprises one or more nanowires 208 can be used in effect as a type of "print" head. That is, one or more nanowires that are coupled onto the electrodes (e.g., using the methods and processes described throughout) on the transfer substrate can be transferred to a suitable contact (1504, 1506) on a receiving substrate 1502 by simply positioning the transfer substrate (or the receiving substrate can be positioned) such that the nanowires can be transferred from the electrode pair to the contact. For example, the transfer substrate can be positioned above a receiving substrate which comprises a contact and then the nanowires brought in position relative to the contact such that the wires transfer from the electrodes to the contact. This process can be repeated as many times as desired, relocating the transfer substrate in relation to the contacts on the receiving substrate such that nanowires can be transferred to a variety of different locations on the receiving substrate. Single nanowires or a plurality of nanowires can be transferred from the electrodes to the contacts. As such then, the transfer methods of the present invention provide a type of printing in which nanowires are transferred from electrodes to contacts in a precise manner.

The present invention also provides methods for positioning one or more nanowires on a substrate. Suitably the methods comprise providing one or more nanowires in a suspension (e.g., as a nanowire ink) and energizing the electrode pair, whereby the nanowires become associated with the electrode pair (i.e., an association phase). In exemplary embodiments, the energizing of the electrode pair comprises generating an alternating current (AC) electric field between an electrode pair on a transfer substrate. Suitable AC field characteristics for use in the association phase of the transfer methods of the present invention are described throughout. The energizing of the electrode pair is then modulated, whereby the nanowires become coupled onto the electrode pair (i.e., a coupling phase). For example, an AC electric field between the electrode pair(s) is modulated. Suitable AC field modulations for use in the coupling phase of the transfer methods of the present invention are described throughout. Uncoupled nanowires are then removed from the electrodes, and then the coupled nanowires are transferred onto the substrate, suitably onto contacts or electrodes on the receiving substrate. The present invention also provides substrates comprising one or more nanowires positioned according to the methods of the present invention. As described throughout, the methods of the present invention allow for the alignment and deposition of nanowires such that substantially all of the nanowires are parallel to each other. This allows for increased ease of transfer of the nanowires to a final substrate and/or device contact.

In additional embodiments, the substrate comprising the electrodes and coupled nanowires can be utilized as a device substrate. For example, the electrodes themselves can be the contacts that will ultimately be used in a final device configuration. In other embodiments, the electrodes can be etched away using suitable etchants known in the art (e.g., mildly alkaline ferricyannide-based etchant formulations that are generally commercially available), so as to remove the electrodes and leave behind the aligned, oriented nanowires. This etching can be performed prior to any nanowire transfer or after the nanowires have been transferred to a transfer substrate/contact so as to leave only nanowires and little or no residual electrode material.

In a further embodiment, the present invention provides methods for controlling the number of nanowires positioned on an electrode pair. In suitable embodiments, the methods comprise positioning one or more nanowires according to the various methods of the present invention. A signal is then applied to the electrode pair and the signal is monitored. The positioning of nanowires on the electrode pair is then stopped when the signal attains a pre-set value. By monitoring an electrical signal at an electrode pair, the number of nanowires can be controlled. Thus, once a pre-determined signal is obtained, the deposition processes of the present invention can be stopped.

Figure 16A:
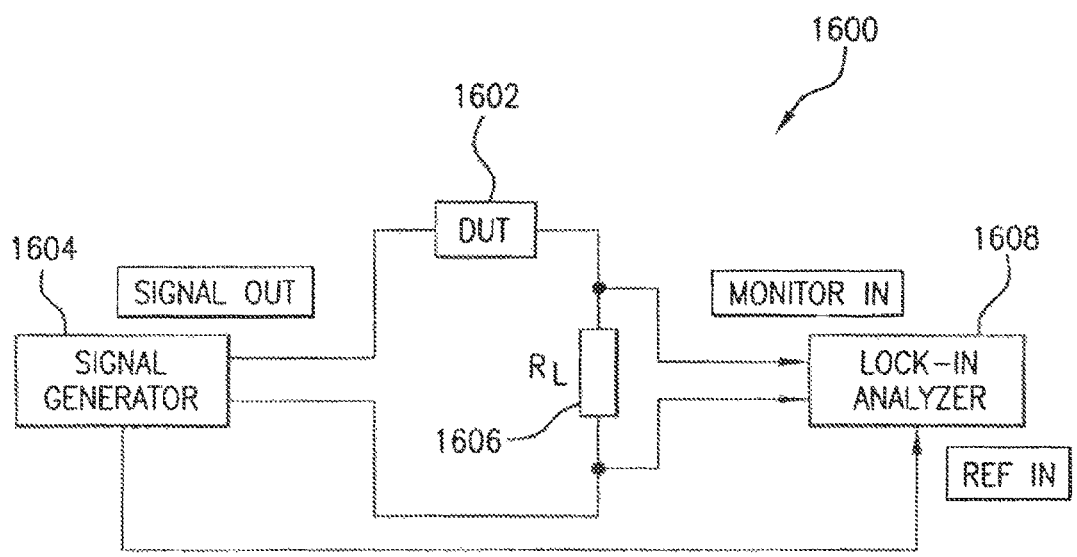
FIG. 16a is a schematic showing an apparatus for monitoring the deposition of nanowires onto a device under test in accordance with one embodiment of the present invention.
Figure 16B:
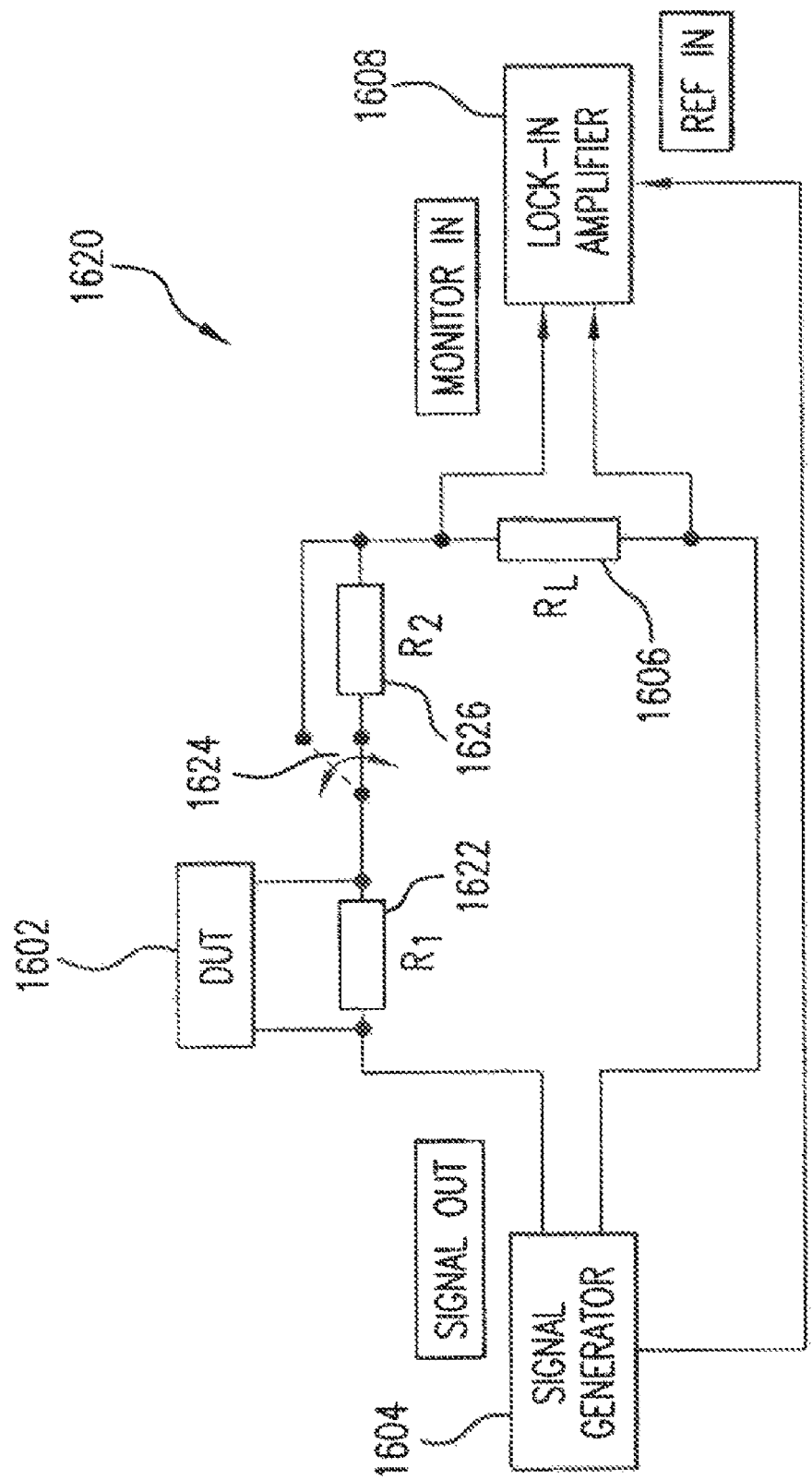
FIG. 16b is a schematic showing an additional apparatus for monitoring the deposition of nanowires onto a device under test in accordance with one embodiment of the present invention.

FIGS. 16a and 16b represent schematics showing apparatuses for monitoring the deposition of nanowires in accordance with suitable embodiments of the present invention. Apparatus 1600 represented in FIG. 16a comprises a device under test (DUT) 1602 which represents one or more electrode pairs that have been involved and/or are involved in the alignment and depositions processes/methods of the present invention. Suitably, DUT 1602 will comprise a plurality of electrode pairs, each of which can be monitored separately using the methods of the present invention.

Apparatus 1600 further comprises a signal generator 1604, which provides an electronic signal to DUT 1602. Suitably, signal generator 1604 is a waveform generator, and the same source for the AC electric field being used in the association, modulation alignment and coupling phases described throughout. A signal that is generated by signal generator 1604 is first applied to DUT 1602, for example, by applying a waveform to one electrode of an electrode pair (or several electrodes, each of which is one electrode of a plurality of electrode pairs). The opposing electrode of an electrode pair (or electrode pairs) (i.e., the electrode that is not connected to signal generator 1604), is connected in series to a load resistor ($R_L$) 1606. The signal that is propagated through the DUT passes through the load resistor 1606 and then returns to the signal generator. The signal passing through load resistor 1606 is monitored by lock-in analyzer 1608, which comprises a device to monitor the signal (e.g., an oscilloscope), to determine the characteristics of the signal that has passed through the DUT. For example, the frequency, amplitude, phase shift, etc. of the signal can be monitored, for example by using an oscilloscope. Lock-in analyzer 1608 suitably compares the signal at load resistor 1606 to a reference signal provided by signal generator 1604. When a pre-determined signal is observed/measured at lock-in analyzer 1608, the apparatus of the present invention provides a mechanism for stopping the deposition of nanowires. This mechanism can either be monitored via human intervention, or can be set up to be monitored electronically or automatically via computer, so that when the pre-determined value is reached, the deposition is stopped. The embodiments of the present invention that provide a method for controlling the number of nanowires aligned and deposited utilizing a pre-set signal value are described throughout as "active" monitoring and control.

In suitable embodiments of the present invention, the signal that is monitored at the DUT (i.e., at load resistor 1606) is a type of signal that will change or vary as additional nanowires are aligned and deposited (coupled) onto an electrode pair (the DUT). Examples of suitable signal types that can be monitored using the methods, systems and apparatus of the present invention include, but are not limited to, impedance, voltage, capacitance and current, basic and complex waveforms and the like, as would be apparent to a person of ordinary skill in the art.

In further embodiments, the signal that is measured across load resistor $R_L$ is fed to an analog-to-digital converter, and the digital signal is then amplified by a computer, digital signal processor or the like. This signal is then monitored as above to determine when a desired number of nanowires have been deposited.

For example, as nanowires are deposited/coupled onto an electrode pair, the impedance of the signal at the electrodes changes as more and more nanowires are coupled onto the electrodes. One skilled in the art will readily understand that the impedance at a pair of electrodes changes as nanowires are deposited and hence connect the two electrodes. The real and imaginary portion of the impedance can therefore be monitored, such that a change in one or the other (or both) (i.e., the real or imaginary portion of the impedance) signals that an additional nanowire(s) has been coupled onto the electrode pair. More specifically, for example, the signal that is monitored by lock-in analyzer 1608 is the imaginary portion of the impedance at DUT. Therefore, monitoring the impedance at load resistor 1606 (and hence, at DUT 1602) provides a method for determining, and therefore controlling, the number of nanowires that are deposited at an electrode pair.

As the signal at the DUT is monitored, a pre-set or pre-determined (e.g., threshold) value can be chosen such that when such value is reached, apparatus 1600 provides a signal or other feedback that a required or desired number of nanowires has been coupled onto the electrodes. For example, a pre-determined impedance value can be set, such that when a sufficient number of nanowires have been deposited, the impedance value (e.g., the imaginary part of the impedance) at the DUT attains, passes or closely approaches the pre-determine value. At this time, the lock-in analyzer, reaching such a pre-determined value, provides some type of feedback or signal indicating that such value has been obtained. In accordance with the present invention, the nanowire deposition process is suitably stopped once this pre-determined value is reached. Stopping the nanowire deposition process can be achieved using any suitable method, for example, by reducing the electric field between the electrode pair, thereby stopping the positioning of the nanowires on the electrode pair (in embodiments where the methods of the present invention are being utilized to align and deposit nanowires). Other suitable methods to stop nanowire deposition include, removing the source of nanowires (e.g., a nanowire suspension), removing the electrodes from the source (e.g., by pulling the substrate out of the suspension) or by other suitable methods dependent upon the deposition method being utilized.

FIG. 16b represents an additional apparatus 1620 in accordance with the present invention. As with apparatus 1600 represented in FIG. 16b, apparatus 1620 also comprises a device under test (DUT 602) (e.g., one or more electrodes or electrode pairs), a signal generator 1604, a load resistor 1606 and lock-in amplifier 1608. Apparatus 1620 also further comprises resistors $R_1$, 1622 and $R_2$, 1626. Resistor $R_1$ is suitably placed in parallel with DUT 1602, and in series with $R_2$, by positioning switch 1624 in the proper orientation. A signal is generated by signal generator 1604 such that the signal is transmitted to both electrodes of an electrode pair (represented by DUT 1602).

As in FIG. 16a, the signal that is monitored at load resistor $R_L$ is used to determine when a desired or required number of nanowires has been deposited on the electrodes. $R_2$ can be either included in the monitoring loop or can be bypassed, for example, but moving switch 1624 to the position where $R_2$ is removed from the loop. As in FIG. 16a, as nanowires are deposited/coupled onto an electrode pair, the impedance of the signal (or other characteristic of the signal) changes as more and more nanowires are coupled onto the electrodes. The real and imaginary portion of the impedance can therefore be monitored, such that a change in one or the other (or both) (i.e., the real or imaginary portion of the impedance) signals that an additional nanowire(s) has been coupled onto the electrode pair. Suitably the signal that is monitored by lock-in analyzer 1608 is the imaginary portion of the impedance at DUT. Therefore, monitoring the impedance at load resistor 606 (and hence, at DUT 1602) provides a method for determining and therefore controlling the number of nanowires that are deposited at an electrode pair.

The apparatuses presented in FIGS. 16a and 16b are referred throughout as "active" monitoring systems of apparatuses. As the systems require monitoring by the lock in amplifier, followed by some response in order to stop or halt nanowire deposition, the systems are therefore active monitoring systems.

In additional embodiments, the present invention also provides for "passive" monitoring systems and apparatuses. In passive systems, rather than utilizing a lock-in amplifier or other system to actively monitor the signal at the electrodes (and/or actively respond when a sufficient number of nanowires have been deposited), the apparatus is designed such that a resistor is placed in parallel with the DUT, e.g., $R_1$ in FIG. 16b. As nanowires are coupled on the electrode pairs, the resistance across the DUT drops below the threshold resistance value of $R_1$. The electric field at the DUT (e.g., between an electrode pair) is then insufficient to associate and/or couple any additional nanowires. Hence, by simply correlating the resistance between a pair of electrodes with the number of nanowires that become coupled, a threshold resistance can be determined. Then, by proper selection of the threshold resistor $R_1$, a passive monitoring system can be set up such than when this pre-determined number of nanowires are coupled onto the electrodes, the resistance drops below the threshold resistor $R_1$, and the e-field deposition can not continue. Hence, a passive monitoring system is provided.

In addition to determining the number of nanowires deposited at an electrode pair, the monitoring methods of the present invention can also be used to determine if undesired versus desired nanowires have been deposited, and/or if nanowires (whether desired or undesired) have deposited in a desired or undesired fashion.

For example, individual electrode pairs can be monitored, e.g., electrically, to determine when a desired nanowire(s) has aligned on the electrodes. As discussed throughout, nanowires for deposition are often core-shell-shell in structure. However, some of these wires may have an incomplete or damaged outer shell or other defect in their structure, and thus be considered "undesired." The methods of the present invention can be used to detect when such undesired nanowires are deposited by observing a change in an electrical property at the electrodes (e.g., current or impedance) versus when desired nanowires are deposited.

In addition, as discussed throughout, nanowires can often deposit on the electrodes in clumps, or as broken, branched or crossing nanowires, rather than straight, single wires, as desired. By monitoring the electrode pairs via an electrical signal (e.g., impedance, current, etc.), it can be determined if nanowires have deposited on the electrode pair in a desired or undesired manner.

If it is determined that undesired nanowires have been deposited, or if nanowires have deposited in an undesired manner, the voltage to the electrode pair can be turned off (or otherwise reduced or modulated) individually, leaving the other electrode pairs electrified, such that the undesired nanowire(s) can be removed from the electrode pair, for example via flushing away, gravity or other removal technique. After the undesired nanowire(s) have been removed, the electrode can be re-electrified and deposition continued. If it is determined that desired nanowires have been deposited, the voltage to the electrode pair can be modulated as described throughout so as to lock the desired nanowires onto the electrode pair. Thus, the present invention provides methods for aligning and depositing desired nanowires via monitoring and control of individual electrode pairs.

In a still further embodiment, the present invention provides substrates comprising one or more electrode pairs, wherein a pre-determined number of nanowires have been positioned on the electrode pair, and wherein the number of nanowires has been controlled according to the methods of the present invention. As described herein, the methods, apparatus and systems of the present invention allow for the control of nanowire deposition such that a pre-determined number of nanowires can be coupled on to an electrode pair, and then deposition stopped, such that no additional nanowires are deposited. By monitoring and controlling individual electrode pairs, it is possible to prepare multiple electrode pairs, each of which comprise a pre-determined number of nanowires.

In suitable embodiments, a plurality of electrode pairs on a substrate are each individually monitored (though more than one electrode pair can also be monitored together) such that when a pre-determined number of nanowires is coupled onto the electrode pair, deposition is stopped (suitably deposition is stopped only with regard to that specific electrode pair) but deposition continues at other electrode pairs. The end result of the methods of the present invention is that each electrode pair comprises substantially the same number of nanowires. The present invention therefore provides for a substrate comprising at least two electrode pairs, suitably at least four electrode pairs (e.g., at least 5, at least 10, at least 20, at least 30, etc) and at least two nanowires, suitably at least four nanowires (e.g., at least 5, at least 10, at least 20, at least 50, at least 100, etc) positioned on each electrode pair, wherein each of the electrode pairs comprise substantially the same number of nanowires. As used herein the phrase "substantially the same number of nanowires" means that the number of nanowires positioned on an electrode pair deviates from the number of nanowires positioned on another electrode pair (undergoing the same deposition process and control) by less than about 70%. Suitably the electrodes comprise substantially the same number of nanowires such that the number of nanowires deviates less than about 60%, less than about 50%, less than about 40%, less than about 30%, less than about 20%, less than about 10%, less than about 5% or less than about 1%.

In still further embodiments, the present invention provides systems for aligning and/or positioning nanowires on a substrate, comprising a suspension comprising a plurality of nanowires (e.g., a nanowire ink) a substrate comprising one or more electrode pairs, and a signal generator for generating an alternating current (AC) electric field between the electrode pairs, and for modulating the AC electric field. Suitable substrates and materials for use as electrodes are described throughout. Examples of sources for generating an AC electric field between the electrode pairs include, but are not limited to, direct electric connection(s) to the electrode pairs, waveguides and similar apparatus, as well as other equivalent AC electric field sources.

In additional embodiments, the systems of the present invention further comprising means for flowing the suspension comprising a plurality of nanowires over at least one of the electrode pairs. Exemplary flowing means include, but are not limited to, a fluid control system for controlling fluid flow of the nanowire suspension (e.g., a pump, or similar device), a rudimentary device such as a reservoir or other receptacle which can be used to pour the suspension over the electrode pairs, and other similar and equivalent devices. Suitably, the flowing means is a fixture adapted to be coupled to the underside of the substrate. For example, the flowing means is attached, either permanently or removeably, to the underside of the substrate such that the entire system or apparatus can be re-used from deposition to deposition. In such embodiments, an apparatus or system of the present invention can be utilized to align and deposit nanowires on electrode pairs, the nanowires can then be transferred or removed from the electrodes, and then the apparatus can be used again in a subsequent deposition process. As such, the apparatus and systems of the present invention can be utilized over and over, generally not requiring replacement of electrodes or other components until they have worn out or otherwise become ineffective.

In additional embodiments, the systems of the present invention further comprise an optical imaging system for visualizing the nanowires, such as a microscope, an infrared or laser detector, or similar device. The systems of the present invention can also further comprise one or more field electrodes for manipulating the nanowires in suspension on the substrate. As discussed throughout, in suitable embodiments the systems of the present invention further comprises a signal monitoring device for determining the signal at the one or more electrode pairs (e.g., a oscilloscope) and means for stopping the AC electric field when the signal attains a pre-set value. Means for stopping the AC electric field when the signal attains a pre-set value, include, but are not limited to, reducing the electric field between the electrode pair, thereby stopping the position of the nanowires on the electrode pair (in embodiments where the methods of the present invention are being utilized to align and deposit nanowires), removing the source of nanowires (e.g., a nanowire suspension), removing the electrodes from the source (e.g., by pulling the substrate out of the suspension) or by other suitable or equivalent methods dependent upon the deposition method being utilized.

Figure 17A:
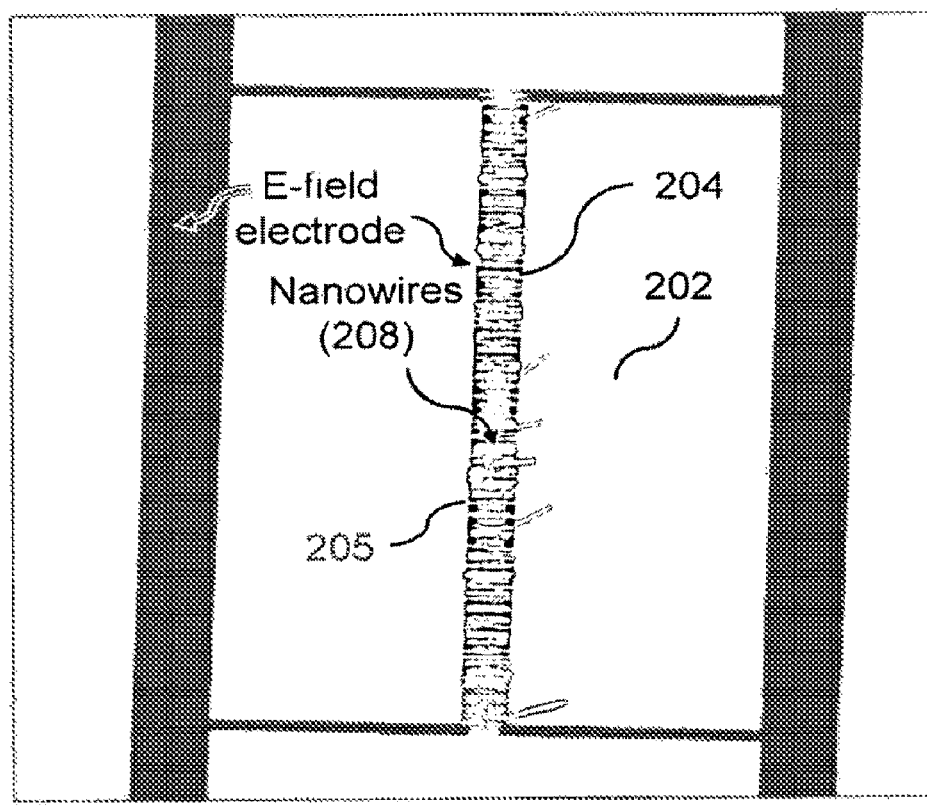
FIG. 17A-17B represent e-field aligned nanowires prior to (A); and following (B) heat deposition in accordance with one embodiment of the present invention.

In further embodiments, the present invention comprises methods for depositing one or more nanowires on a substrate. One or more nanowires are first positioned on a substrate, and then the nanowires are heated so that they become deposited on the substrate. Nanowires can be positioned on the substrate using any suitable process, for example, electric field alignment, langmuir-film alignment or flow alignment. In exemplary embodiments, the nanowires are positioned on the substrate using the various electric field alignment methods as described herein, in which the nanowires are first associated with a pair of electrodes, and then suitably coupled onto the electrode pair by modulating the electric field, as described herein. For example, FIG. 17A shows nanowires 208 that have been coupled onto a pair of electrodes (204, 205) positioned on substrate 202 (e.g., a glass substrate).

Following positioning of the nanowires (e.g., coupling to an electrode pair), nanowires 208 are then heated so as to deposit them on substrate 202. As used herein, the terms "heated" or "heating" comprise various methods for increasing the temperature of the nanowires (and therefore the substrate), including, but not limited to, heating in an oven or annealing chamber, heating the substrate itself, for example, via ohmic heating or conductive heating, or other suitable methods.

In general, the nanowires are heated to a temperature of greater than about 100° C., for example, about 110° C., about 120° C., about 130° C., about 140° C., about 150° C., about 160° C., about 170° C., about 180° C., about 190° C., about 200° C., about 210° C., about 220° C., about 230° C., about 240° C., about 250° C., or higher. As used herein, the term "depositing temperature" refers to the temperature to which nanowires 208 are heated in order to deposit them on substrate 202. The temperature of the nanowires can be increased from the temperature following coupling (e.g., ambient temperature (about 22-25° C.) or above) to a temperature where the nanowires deposit on the substrate (e.g., greater than about 100° C.), using various heating rates. For example, the temperature can be increased to the depositing temperature over a period of a few minutes to several hours. For example, the temperature can be increased from the temperature following coupling to the depositing temperature over a period of about 5 minutes to about 30 minutes.

Once the depositing temperature is reached, the nanowires are suitably held at this temperature for a period of about a few minutes to several hours. For example, the nanowires can be held at the depositing temperature for about 5 minutes to about 2 hours, or about 5 minutes to about 1 hour, about 5 minutes to about 30 minutes, about 10 minutes to about 30 minutes, or about 20 minutes. During this period of heating, the nanowires are suitably contacted with one or more gases, including both reactive and non-reactive (i.e., inert) forming gases, for example, $H_2$, $N_2$, He, Ne, Ar, Kr, Xe, or Rn. In exemplary embodiments, the nanowires are heated in the presence of $H_2$, for example a mixture of $H_2$ and $N_2$. While not intending to be bound by theory, the addition of $H_2$ to the nanowires during the heating appears to enhance the formation of bonds/associations between nanowires 208 and the substrate 202, perhaps via hydrogen bonding between the nanowires and substrate. The present invention also encompasses the use of additional gases, suitably $H_2$ comprising forming gases, that allow for the association/boding between nanowires and substrate. In additional embodiments, covalent bonds between the nanowires and substrate may be formed as a result of the release of $H_2O$ molecules following a chemical reaction.

Following holding the nanowires at the elevated temperature, the nanowires are then cooled to room temperature, for example by removing the source of heat and providing additional $H_2$ gas (e.g., $H_2/N_2$ gas) until the nanowires are cooled.

In exemplary embodiments, prior to heating the nanowires to the depositing temperature, the nanowires are suitably exposed to one or more cycles in which a gas provided to the nanowires, and then the gas is removed. For example, $N_2$ gas can be provided to the nanowires, suitably for about 5-30 minutes (e.g., about 10 minutes) at room temperature. The gas is then removed, for example through the use of a vacuum pump (e.g., vacuuming to a pressure of less than about 100 mTorr for about 5 minutes). In suitable embodiments, the gas providing/removal cycle can be repeated, for example, about 2-10 times, and suitably at least 5 gas providing/removal cycles are utilized prior to heating the nanowires to the depositing temperature.

In additional embodiments, the present invention provides methods for depositing one or more nanowires 208 on a substrate 202. For example, one or more nanowires are provided in a suspension proximate to an electrode pair 207 (204/205) on the substrate. The electrode pair is then energized, whereby the nanowires become associated with the electrode pair, and the energizing is then modulated, whereby the nanowires become coupled onto the electrode pair (exemplary association and coupling frequencies and amplitudes are provided throughout). A gas is then provided to the nanowires, and then removed (e.g., via a vacuum). This cycle of gas providing and removal can be repeated several times, for example, five or more times. Then, the nanowires are heated to a temperature of greater than about 100° C. (e.g., about 200° C.), suitably in the presence of $H_2$ gas (e.g., $H_2/N_2$), whereby the nanowires become deposited on the substrate.

Figure 17B:
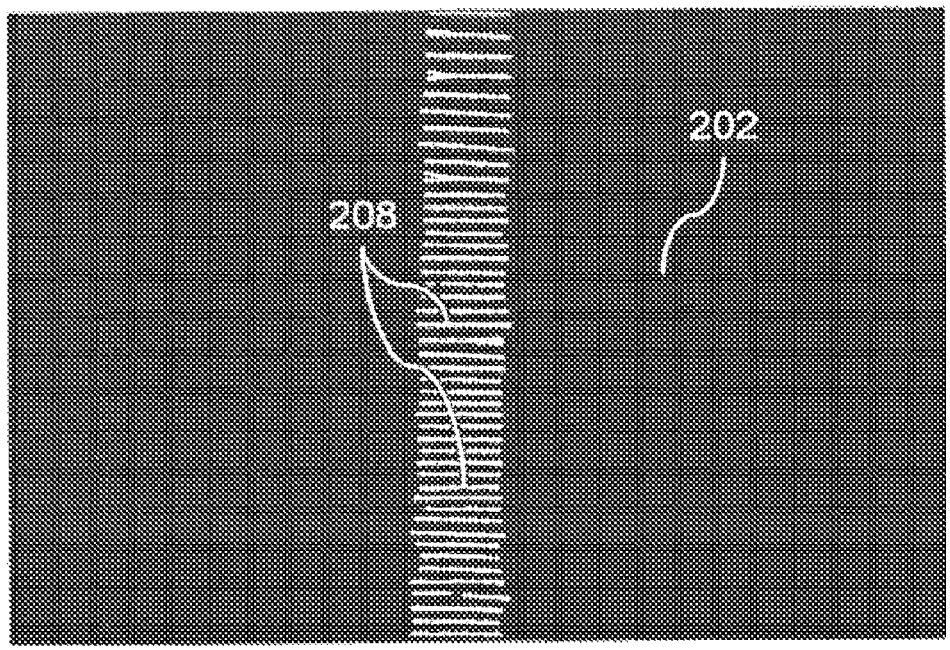

In embodiments of the present invention in which the nanowires 208 are positioned using electrodes on the surface of substrate 202 (e.g., via association and coupling as described throughout), electrodes (e.g., 204 and 205) are then suitably removed. As shown in FIG. 17B, removal of electrodes 204 and 205 leaves nanowires 208 deposited on substrate 202 in an aligned/oriented manner. Exemplary methods of removing electrodes 204 and 205 include, but are not limited to, physical removal such as scraping or etching, including dry etching, plasma or electron beam etching, and chemical etching, such as wet etching, for example a nitride acid-based chemical etch. As shown in FIG. 17B, following removal of electrodes 204 and 205, aligned, deposited nanowires 208 are left on substrate 202. Subsequent washing with DI water (or other solution), as well as drying (e.g., using a spin rinse dryer) do not disturb nanowire 208 alignment on, or association with, substrate 202.

Additional methods for depositing nanowires 208 on substrate 202 include the application of an electro-static force to anchor the nanowires, as well as chemical surface treatment of nanowires 208 and substrate 202 to promote a covalent (e.g., chemical) reaction or non-covalent interaction between the two surfaces.

Figure 18:
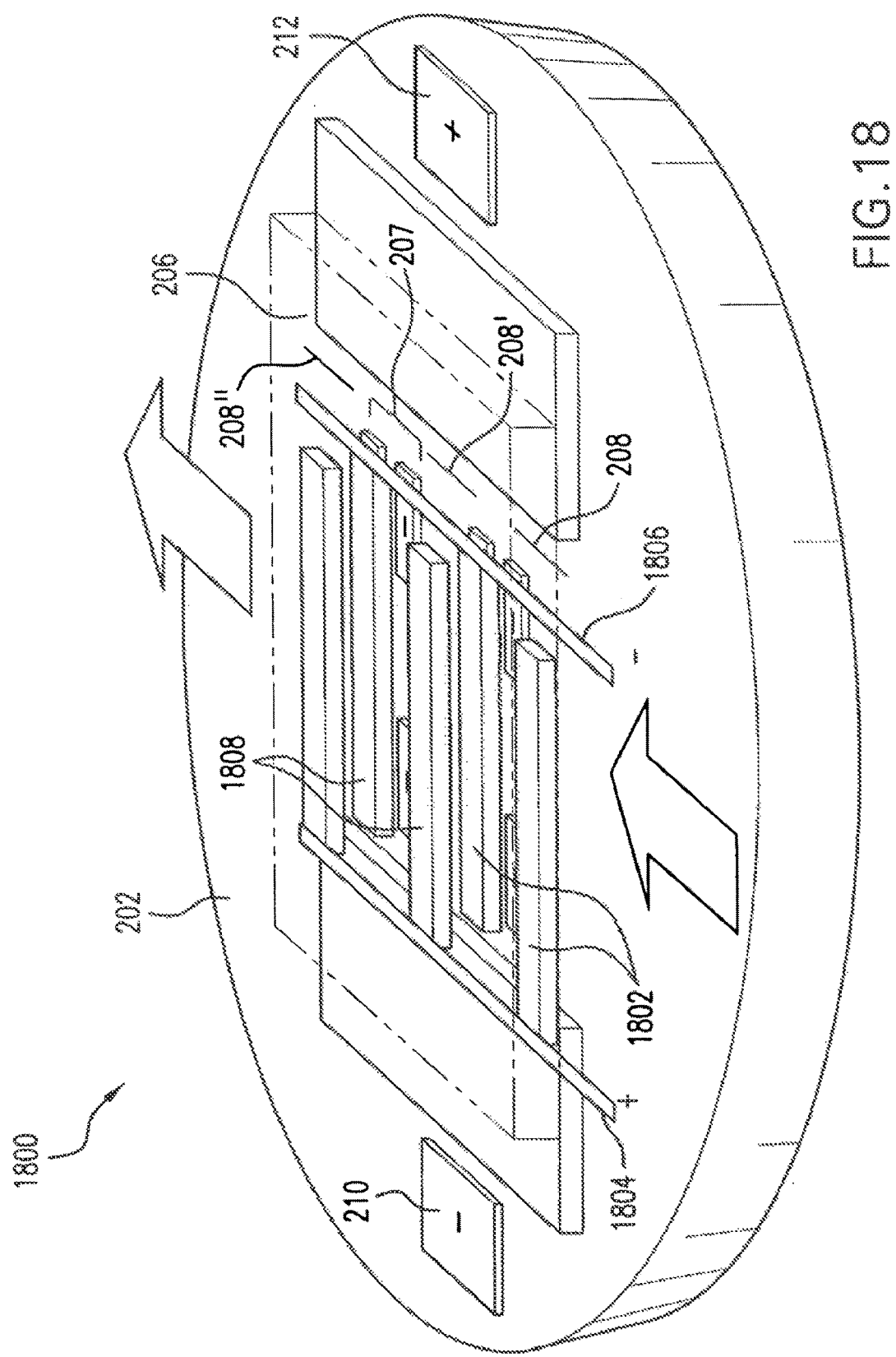
FIG. 18 represents a schematic of a system for manipulating nanowires in a solution in accordance with one embodiment of the present invention.

The present invention also provides systems for manipulating nanowires in a solution (i.e., a suspension of nanowires), for example, system 1800 as shown in FIG. 18. In exemplary embodiments, system 1800 comprises one or more electrode sets (e.g., 1802, 1808). Each electrode set comprises a first electrode having a first polarity and a second electrode having a second polarity. The first polarity (first electrode) is opposite the second polarity (second electrode) as demonstrated in FIG. 18. As used herein, a "set" of electrodes refers to two electrodes. As shown in FIG. 18, electrode sets 1802 and 1808 can be connected to single electrical connections, 1804 and 1806, with electrodes of the first polarity connected to one electrical connection (1804) and electrodes of the second polarity connected to an additional electrical connection (1806). In other embodiments, each electrode in the various sets can be connected to a separate electrical connection. As shown in FIG. 18, in exemplary embodiments, the first electrode set 1802 and second electrode set 1808 are arranged in an alternating manner (i.e., no two electrodes having the same polarity are arranged directly next to each other). Suitably the sets of electrodes will be in the same plane, though in alternate embodiments, they can be in different planes.

A signal generator or other suitable device is then attached to the electrode sets in order to generate an alternating current (AC) electric field between the first and second electrodes (having first and second polarities). Nanowires that are in solution are polarized as a result of the alternating current between electrodes (+, −) of the set and manipulated in the solution, in response to the generated electrostatic field. As discussed below, by alternating or pulsing the current at the various electrode sets, nanowires can be manipulated in flow channel 206. In addition to the use of an AC field between electrodes of an electrode set, a DC field can also be used to generate a dielectrophoretic or electro-osmotic (fluid motion) force between the electrodes. In embodiments which utilize a DC field, electrodes of an electrode set are generally separated by greater distances than when an AC field is utilized. This allows for nanowires to be manipulated over the entire distance between the electrodes, and thus moved along flow channel 206.

In further embodiments, nanowire manipulation systems 1800 of the present invention can further comprise a suspension comprising a plurality of nanowires 208, and a substrate 202 comprising one or more electrode pairs 207 (e.g., electrodes 204, 205). The systems suitably further comprise a signal generator or other device for generating an alternating current (AC) electric field between the electrode pairs, and for modulating the AC electric field. In general, substrate 202 comprising electrode pairs 207 is oriented opposite the electrode sets (1802, 1808). For example, as shown in FIG. 18, electrode sets 1802 and 1808 are oriented above substrate 202, and suitably, are substantially parallel to substrate 202. However, the electrode sets can be oriented in any spatial orientation relative to substrate 202 and electrode pairs 207, for example, the electrode sets (1802, 1808) can be below the electrode pairs 207, or can be above the electrode pairs 207, but are not required to be parallel to substrate 202. For example, electrode sets 1802, 1808 can be oriented at any angle relative to substrate 202.

In suitable embodiments, system 1800 further comprises a means for flowing the suspension comprising a plurality of nanowires over at least one of the electrode pairs 207 and over at the electrode sets 1802, 1808. Exemplary flowing means are described throughout. Additional components of system 1800, for example optical imaging systems for visualizing the nanowires, flow control systems and signal monitoring devices are described throughout.

Figure 19:
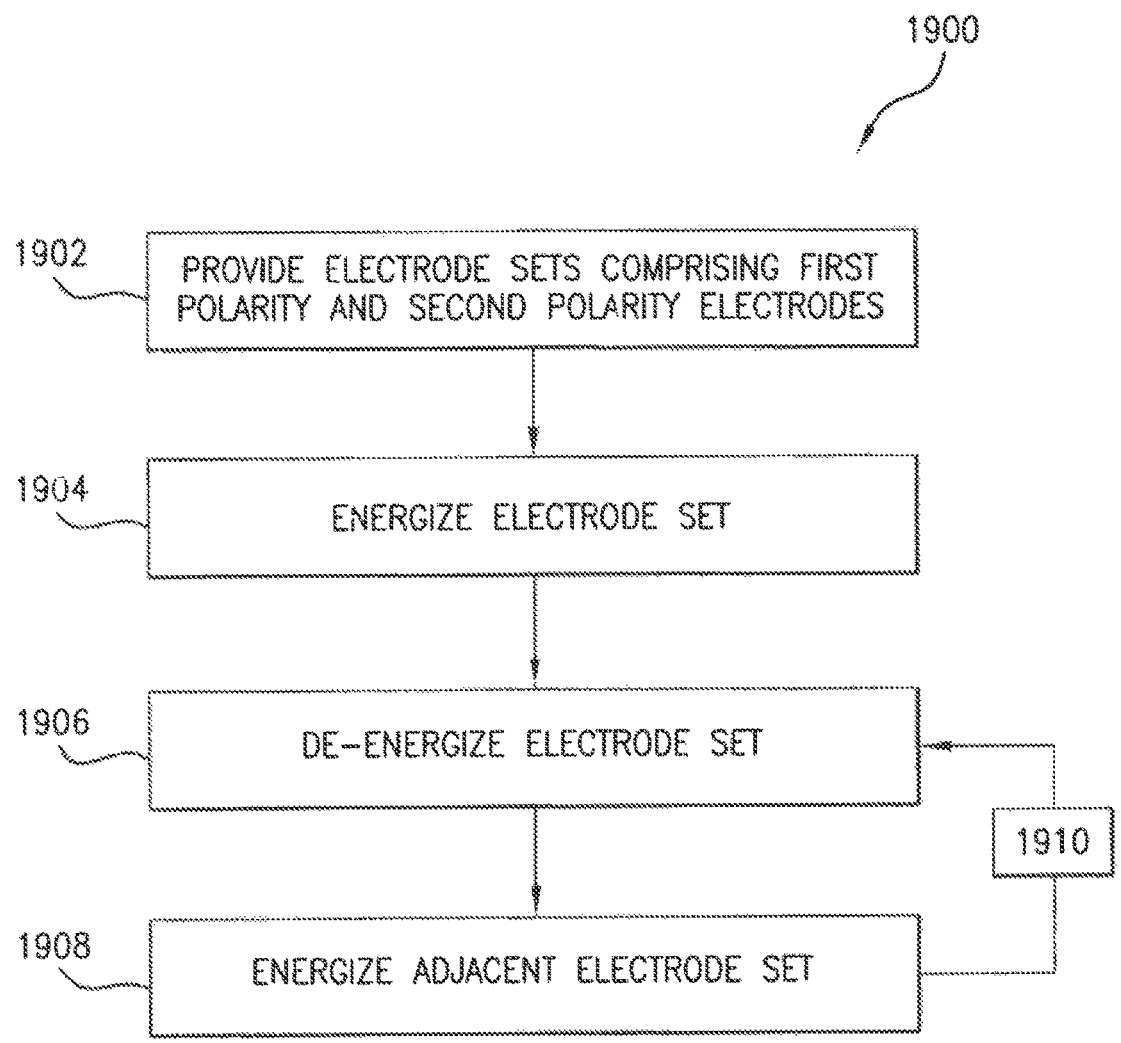
FIG. 19 shows a flowchart of a method of manipulating nanowires in accordance with one embodiment of the present invention.

The present invention also provides methods of manipulating nanowires in a solution, as represented in flowchart 1900 of FIG. 19, with reference to system 1800 of FIG. 18. In step 1902 of FIG. 19, one or more electrode sets 1802, 1808 are provided. Each electrode set suitably comprises a first electrode having a first polarity and a second electrode having a second polarity. As shown in FIG. 18, in suitable embodiments, the electrodes are alternated such that electrodes of similar polarity are not directly next to one another. In step 1904 of FIG. 19, an electrode set (1802) is energized, wherein nanowires are manipulated in the direction of the energizing. As used herein, the term "energize" refers to any suitable mechanism or system for providing an electric current to the electrodes of an electrode set. "Energizing" refers to the generating of a DC electric field and/or an AC electric field at/between the electrodes of an electrode set.

In step 1906 of flowchart 1900, the energized set of electrodes (1802) is then de-energized. As used herein, the term "de-energized" means that the electric current is stopped or otherwise removed from the electrode set. In step 1908 then, an adjacent electrode set (1808) is energized. As used herein, an "adjacent electrode set" refers to an electrode set that is immediately next to the set of electrodes (1802) that was energized in step 1904, and then de-energized in step 1906. Adjacent simply refers to the fact that the electrode sets are oriented spatially next to one another, but does not require that the electrode sets are touching or are any particular distance from one another.

As shown in step 1910 of flowchart 1900, steps 1906 and 1908 are then suitably repeated. For example, energized electrode set 1808 is de-energized, and an additional adjacent set of electrodes (not shown) is energized. Step 1910 can be performed any desired number of times (i.e., energizing and de-energizing adjacent electrode sets). This cycling of electrode sets generates a dielectrophoretic force in a direction, suitably the direction of the energizing (i.e., the direction in which adjacent electrode sets are being energized and then de-energized). As described throughout, the dielectrophoretic force manipulates the nanowires in the same direction as the applied AC electric field. Nanowires move from energized electrode sets, to adjacent energized electrode sets, when the previously energized set is de-energized. This cycling of energizing and de-energizing of adjacent nanowire sets allows nanowires to be manipulated in any desired direction.

For example, as shown in FIG. 18, the energizing/de-energizing generates a dielectrophoretic force in flow channel 206 in the direction of the block arrows. Thus, nanowires originally at the position designated by nanowire 208, migrate through flow channel 206 in the direction of the arrows, e.g., along a path similar to that followed by nanowire 208→208'→208", in response to the "wave" or "pulses" of alternating sets of energized and de-energized electrodes (1802→1808→). In further embodiments, in addition to the dielectrophoretic force generated by the energizing and de-energizing described in FIG. 19, nanowires can be flushed away in the same or similar direction, for example, by using a fluid flow to aid in nanowire manipulation. Exemplary methods for applying and regulating fluid flow are described throughout.

In suitable embodiments, the energizing of the electrode sets comprises generating an AC electric field between the electrodes of the sets. In general, a signal generator or similar apparatus is connected to the electrode sets, for example, via electrical connections 1804 and 1806. Exemplary AC electric fields suitably comprise a frequency of about 10 Hz to about 1 kHz and an amplitude of about 1-10 V (peak-to-peak).

The present invention also provides methods for manipulating one or more nanowires. As discussed throughout, nanowires are suitably associated and then coupled onto one or more electrode pairs 207 using modulation of an electric field between the electrode pairs. Suitably, uncoupled nanowires are removed from the electrode pairs 207 by manipulating nanowires 208 with sets of electrodes (1802, 1808) comprising a first electrode having a first polarity and a second electrode having a second polarity, as described herein, and shown in FIG. 18. For example, an electrode set 1802 is energized, then de-energized and an adjacent electrode set 1808 energized, thereby generating dielectrophoretic force, such that uncoupled nanowires 208 are manipulated in the direction of the energizing, and thereby removed from electrode pair 207. For example, as shown in FIG. 18, nanowires 208 are suitably manipulated in flow channel 206 in the direction of the block arrows. Removed nanowires can then be re-used in subsequent association/coupling applications by simply recycling the nanowire "ink" or suspension.

Exemplary conditions, including AC field characteristics for nanowire association and coupling, as well as nanowire manipulation are described throughout. In additional embodiments, the nanowires can be flushed away, for example by flowing a solution, in addition to manipulation using the electrostatic forces generated by energizing and de-energizing adjacent electrode sets.

Figure 20:
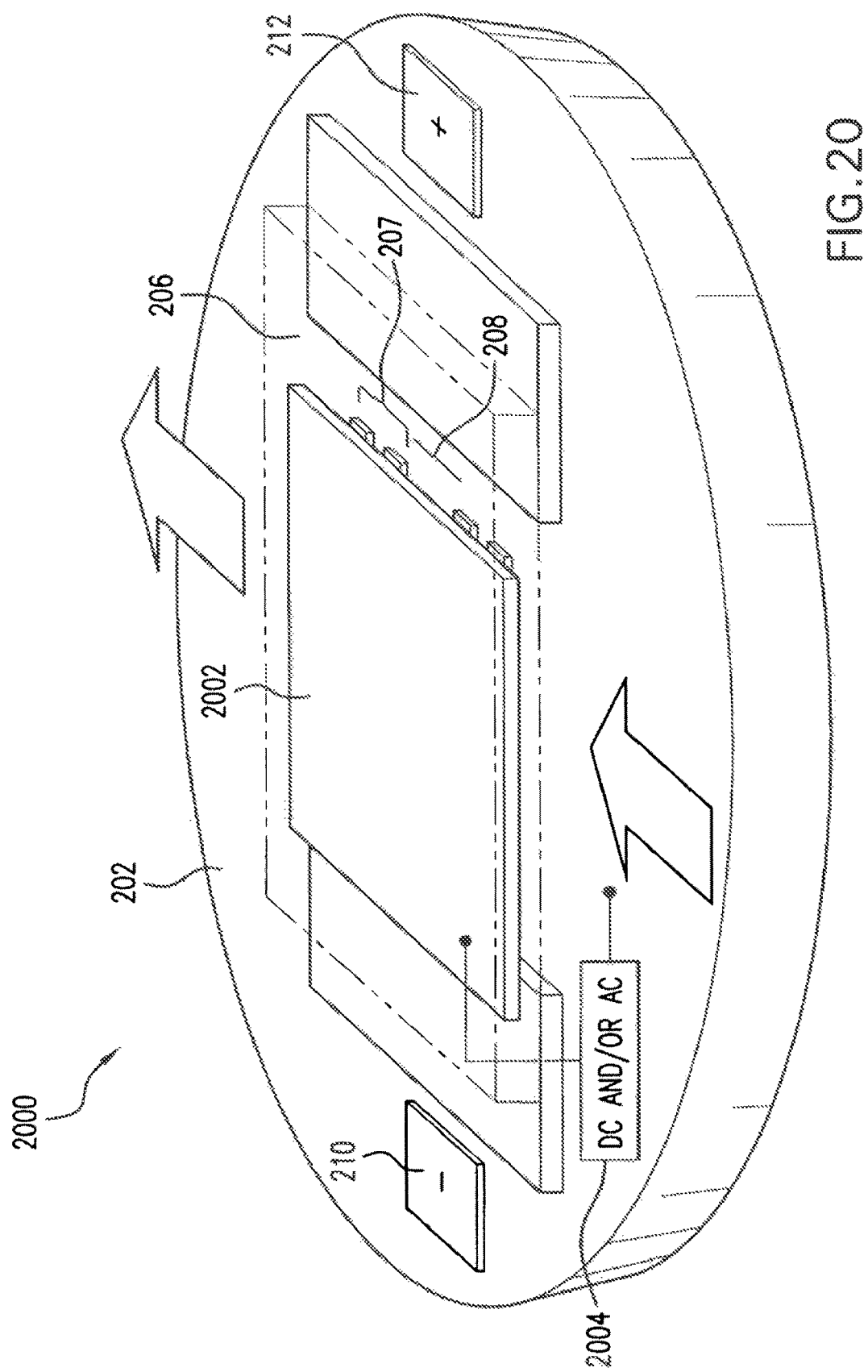
FIG. 20 shows a schematic of a system for removing nanowires in accordance with one embodiment of the present invention.

The present invention provides additional methods for positioning one or more nanowires. As described herein, nanowires are suitably associated and coupled to an electrode pair 207 using the methods of the present invention. For example, a suspension of one or more nanowires are provided proximate to an electrode pair 207 as shown in FIG. 20. Electrode pair 207 is then energized, whereby nanowires 208 become associated with the electrode pair. The energizing is then modulated, wherein by nanowires become coupled onto the electrode pair. Finally, one or more uncoupled nanowires (uncoupled nanowires include nanowires that are not fully bound to electrodes and/or are misaligned or crossing) are removed from the electrode pair. In suitable embodiments, nanowires 208 are removed using a process comprising energizing a removal electrode 2002, wherein the uncoupled nanowires 208 are manipulated in a direction, for example, in the direction of the removal electrode 2002, and thereby removed from the electrode pair 207. As used herein, the term "removal electrode" includes one or more electrodes positioned at a distance from electrode pairs, such that upon energizing the removal electrode, nanowires that are to be removed from the electrode pairs are manipulated toward or in the direction of the removal electrode.

For example, as shown in FIG. 20, removal electrode 2002 can be positioned "above" electrode pair 207 positioned on substrate 202. However, removal electrode 2002 can be positioned at any suitable orientation or distance from electrode pairs 207, and it should be understood that the present invention is not limited to simply positioning removal electrode 2002 above the electrode pairs 207. In suitable embodiments, removal electrode 2002 comprises a single electrode, though multiple removal electrodes can also be used. Removal electrode 2002 is generally positioned inside of flow channel 206, such that it is in fluid communication with the flow channel and therefore nanowires 208 that are in suspension in the solution.

Energizing removal electrode 2002 can comprise generating a DC electric field, an AC electric field, or both DC and AC electric fields (2004) at the removal electrode 2002. For example, DC electric fields can have an amplitude of about 0.1 V to about 10 V. Exemplary AC electric fields suitably have a frequency of about 100 Hz to about 100 kHz and an amplitude of about 5-150 V. Signal generators or other apparatus/device for generation of DC and AC electric fields 2004 are described throughout and well known to those of ordinary skill in the art.

Figure 21C:
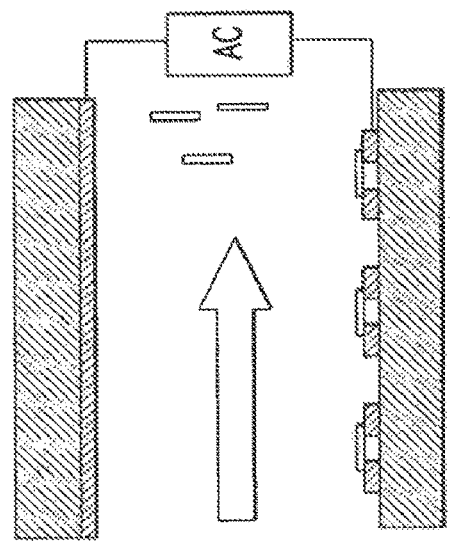
FIGS. 21A-21C represent the effects of the application of DC and AC electric fields on nanowires in accordance with one embodiment of the present invention.

Application of a DC electric field to removal electrode 2002 manipulates nanowires 208 (uncoupled or misaligned nanowires) toward removal electrode 2002. The generation of a positive electric charge at the removal electrode 2002 tends to move nanowires 208 from the region of electrode pairs 207, up into flow channel 206, for example, as shown in FIG. 21A. Flowing a solution in flow channel 206 then removes nanowires 208 from the electrode pair region, allowing them to be collected and re-used in subsequent applications. In additional embodiments, a negative electric charge can be generated at removal electrode 2002, for example, about −0.1 V to about −10 V. A negative charge at removal electrode 2002 tends to manipulate nanowires away from the removal electrode 2002, and hence, toward electrode pairs 207. This can help enhance the nanowire association/coupling phases as described throughout.

Figure 21B:
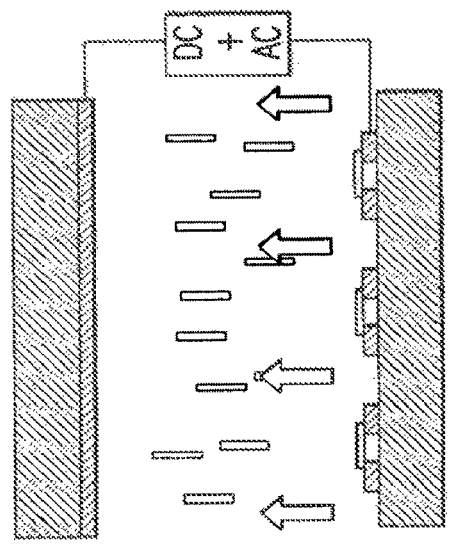
Figure 21A:
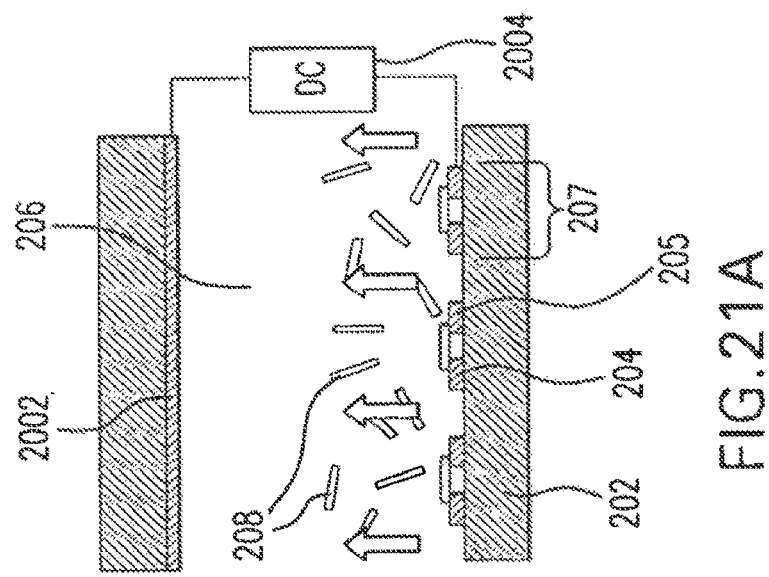

Application of an AC electric field to removal electrode 2002, in addition to manipulating nanowires toward the electrode, also tends to align nanowires 208 in orientations that are parallel to the AC field, for example as shown in FIGS. 21B and C. Thus, in addition to manipulating nanowires 208 away from the electrode pairs 207, nanowires 208 are also aligned in such a way that they have a greater surface area exposed to the application of a fluid flow (see FIG. 21C). It has been determined that the maximum amount of fluid flow is generated at a distance equal to approximately ½ the "height" of flow channel 206 (i.e., half-way between the removal electrode and electrode pairs 207). In exemplary embodiments, flow channel 206 is approximately 500 μm high (distance between removal electrode 2002 and electrode pairs 207 on substrate 202), thus maximum flow is attained at a distance of about 250 μm above the surface of substrate 202. Application of an AC electric field, in combination with a fluid flow to flush away nanowires 208, provides a very effective method for removing uncoupled/misaligned nanowires, and also allows for the recycling of this nanowire ink in further applications, thereby limiting material loss and expense.

In a further embodiment, both an AC and a DC electric field can be generated at removal electrode 2002, for example, as shown in FIG. 21B. Generation of both AC and DC fields help to move nanowires 208 away from electrode pairs 207, and also align nanowires parallel to a fluid flow. In exemplary embodiments, removal electrode 2002 can be energized in three separate steps, for example, an AC electric field can first be generated at the removal electrode, then a DC electric field and an AC electric field can be generated, and finally, an AC electric field can be generated at the removal electrode 2002.

Systems/apparatuses of the present invention which comprise removal electrode 2002 in addition to one or more electrode pairs 207, aids in large area nanowire positioning/deposition. With traditional three terminal electric field manipulation, IR drop can be an issue. However, the use of a large area removal electrode 2002 limits this concern.

Additional methods for manipulating nanowires away from electrode pairs 204/205 can also be used in the practice of the present invention. For example, electrode pairs 207 (and suitably substrate 202) can be translated in various directions to dislodge or manipulate nanowires 208 so that they can be removed by electrophoretic or electroosmotic forces, or can be flushed away by a fluid flow. For example, substrate 202, and thus electrode pairs 207 can be translated "downward" thereby causing nanowires 208 to move "up-ward" and into a fluid flow and be removed from flow chamber 206. Additional methods for manipulating nanowires so that they can be removed by flushing away with a fluid flow or by electrophoretic/electro-osmotic forces include, but are not limited to, ultrasound, as well as sound or other vibration-inducing methods for dislodging uncoupled/misaligned nanowires and then manipulating them into the fluid flow or electrophoretic/electro-osmotic forces.

Figure 23:
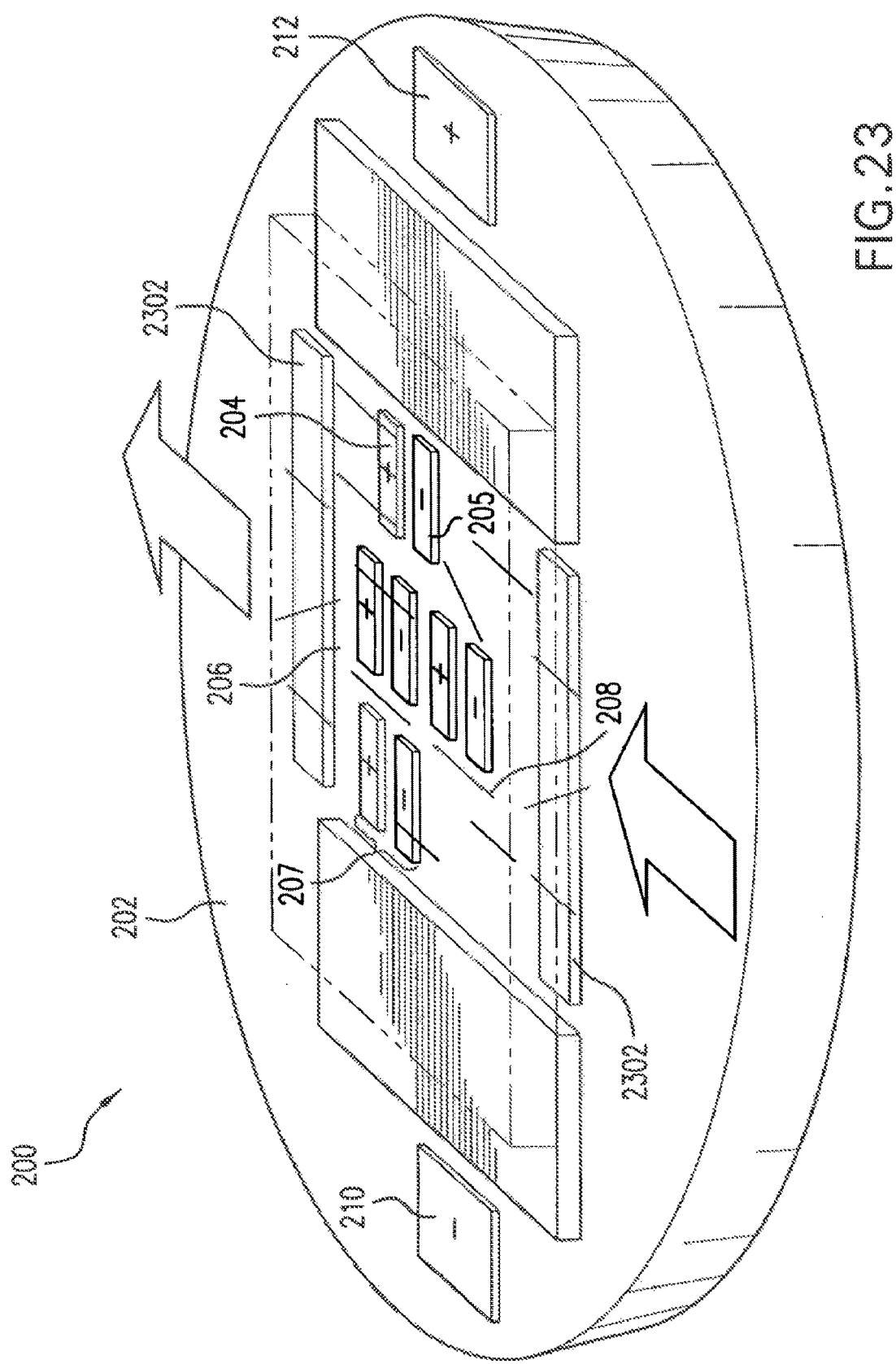
FIG. 23 shows a schematic of a system for positioning nanowires in accordance with one embodiment of the present invention.

In still further embodiments, the present invention provides systems for positioning nanowires on a substrate, for example as shown in FIG. 23. As discussed throughout, such systems suitably comprise a suspension comprising a plurality of nanowires 208. Such systems also comprise a substrate 202 comprising one or more electrode pairs 207 and one or more nanowire-adhering regions 2302. Suitably, these systems also further comprise a signal generator for generating an alternating current (AC) electric field between the electrode pairs, and for modulating the AC electric field.

As discussed throughout, in one embodiment, uncoupled nanowires can be removed from the electrodes by flushing away the nanowires using a fluid flow. This fluid flow can effectively remove nanowires that have not pinned and/or locked onto the electrode pairs. In some embodiments it is desirable to have one or more nanowire-adhering regions 2302 positioned on substrate 202. As used herein, the term "nanowire-adhering" means that these regions attract and stick, or otherwise bond nanowires to their surface. Nanowire-adhering regions can be sections of substrate 202, or additional structures positioned on substrate 202, to which nanowires will adhere.

In further embodiments, it may not be necessary to flush away uncoupled nanowires using fluid flow. Rather, nanowire-adhering regions can be utilized to simply remove uncoupled nanowires from the suspension of nanowires. As discussed herein, this allows for the nanowires to be recovered later and utilized in subsequent coupling reactions.

Suitably, nanowire-adhering regions 2302 are positioned such that they are separated by a distance of between about 10 mm and about 500 cm, suitably between about 1 cm and about 100 cm, or about 10 cm, about 20 cm, about 50 cm, about 70 cm, etc., from each other. Nanowire-adhering regions 2302 can be positioned either parallel or perpendicular to electrode pairs 207. Nanowire-adhering regions 2302 can be any suitable shape and size, for example, plates, rods, bars, or other geometry to which nanowires can adhere.

As discussed throughout, in suitable embodiments, nanowires 208 have a core-shell-shell structure in which the outer shell is a conductive material, such as a metal. In aqueous or alcohol-based solutions, these nanowires will generally have a negative surface charge. Thus, nanowire-adhering regions are suitably positively charged. However, it should be noted that in other environments and/or for other nanowire structures, negatively charged nanowire-adhering regions can also be used, suitably where the nanowires are positively charged. Any material that is the appropriate charge can be utilized as nanowire-adhering regions 2302.

In exemplary embodiments, nanowire-adhering regions 2302 suitably comprise an oxide, such as $Al_2O_3$, or a nitride, or other substance that obtains a positive surface charge in an aqueous or alcohol-based solution. In further embodiments, rather than using a substrate that is charged in a particular environment, a charge can be generated in nanowire-adhering regions 2302, for example through a positive or negative voltage being applied to the regions. Then, the polarity of the voltage can be switched, allowing nanowires 208 to be released from nanowire-adhering regions 2302, and recovered and recycled for further depositions. Thus, nanowire-adhering regions 2302 can be material that is separate from or added onto substrate 202, or can be part of substrate 202 that is then modified, for example via electrification, to generate a nanowire-adhering region.

Figure 24:
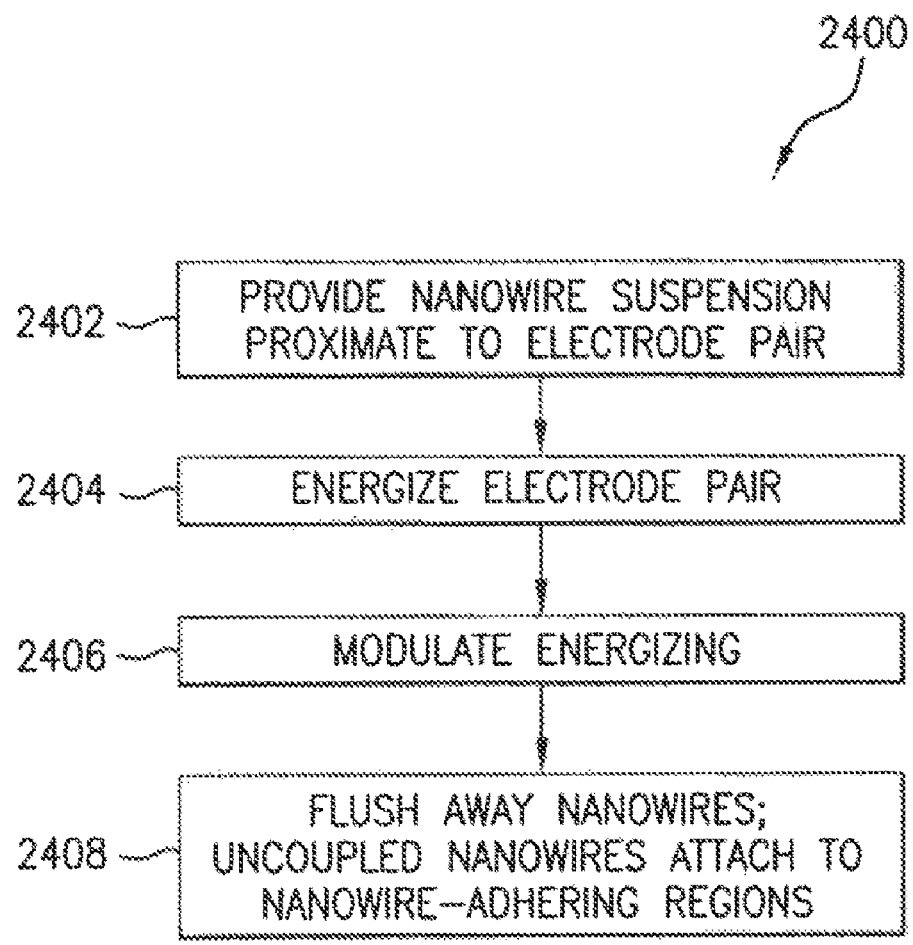
FIG. 24 shows a flowchart of a method for positioning nanowires in accordance with one embodiment of the present invention.

In further embodiments, as shown in flowchart 2400 of FIG. 24 with reference to FIG. 23, the present invention provides methods for positioning one or more nanowires 208. In exemplary embodiments, in step 2402, a suspension of one or more nanowires 208 are provided proximate to an electrode pair 207 on substrate 202. In step 2404, electrode pair 207 is energized, whereby nanowires 208 become associated with the electrode pair. In step 2406, the energizing of the electrode pair is modulated, whereby nanowires 208 become coupled onto the electrode pair 207. In step 2408 then, one or more uncoupled nanowires 208 are removed from the electrode pair by flushing away the uncoupled nanowires, as described herein. In step 2408, when the uncoupled nanowires are flushed away from electrode pairs 207, they become attached to nanowire-adhering regions 2302 on substrate 202. As discussed throughout, use of nanowire-adhering regions 2302 not only limits uncoupled nanowires from interfering with already pinned/locked nanowires, but also reduces the distance uncoupled/removed nanowires must travel during the flushing away procedure.

In addition, as discussed herein, in suitable embodiments it is not necessary to flush away uncoupled nanowires. Instead, uncoupled nanowires can simply attach to nanowire-adhering regions that are "downstream" from the electrode pairs. As used herein, "downstream" is used to indicate that the nanowire-adhering regions are positioned after the electrode pairs in the direction of fluid flow (if a fluid flow is used). In such embodiments, as uncoupled nanowires pass beyond the electrode pairs, they attach to one or more nanowire adhering regions and can then be recovered and utilized in subsequent coupling reactions.

Figure 25B:
FIGS. 25A-25C show micrographs depicting nanowire association as well as nanowire removal, in accordance with one embodiment of the present invention.
Figure 25C:
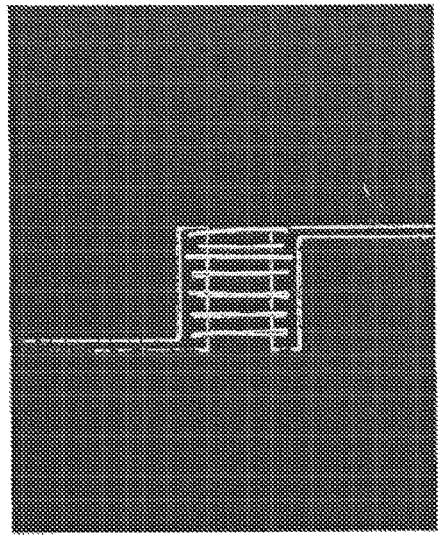
Figure 25A:
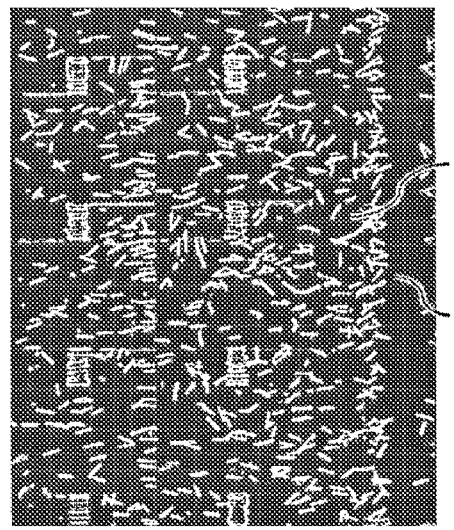

FIGS. 25A-C shows nanowire alignment and deposition in the presence and absence of nanowire-adhering regions 2302. FIG. 25A shows the boundary that forms between nanowire-adhering regions 2302 (e.g., $SiO_2$) and non-adhering regions 2502 (e.g., molybdenum), showing the sharp contrast between the two material surfaces. FIG. 25B shows nanowire alignment and deposition in a region that is nanowire-adhering, and FIG. 25C shows nanowire alignment and deposition in a region that is non-adhering.

Use of Nanowires Deposited According to the Present Invention in Exemplary Devices and Applications Numerous electronic devices and systems can incorporate semiconductor or other type devices with thin films of nanowires deposited according the methods of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The nanowires deposited by the processes and methods of the present invention can also be incorporated in applications requiring a single semiconductor device, and in multiple semiconductor devices. For example, the nanowires deposited by the processes and methods of the present invention are particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The nanowires deposited by the processes and methods of the present invention are also applicable to smart libraries, credit cards, large area array sensors, and radio-frequency identification (RFID) tags, including smart cards, smart inventory tags, and the like.

The nanowires deposited by the processes and methods of the present invention are also applicable to digital and analog circuit applications. In particular, the nanowires deposited by the processes and methods of the present invention are useful in applications that require ultra large-scale integration on a large area substrate. For example, a thin film of nanowires deposited by the processes and methods of the present invention can be implemented in logic circuits, memory circuits, processors, amplifiers, and other digital and analog circuits.

The nanowires deposited by the processes and methods of the present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires deposited by the processes and methods of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

It will be readily apparent to one of ordinary skill in the relevant arts that other suitable modifications and adaptations to the methods and applications described herein can be made without departing from the scope of the invention or any embodiment thereof. Having now described the present invention in detail, the same will be more clearly understood by reference to the following examples, which are included herewith for purposes of illustration only and are not intended to be limiting of the invention.

EXAMPLES

Example 1

Positioning of Nanowires

Figure 5:
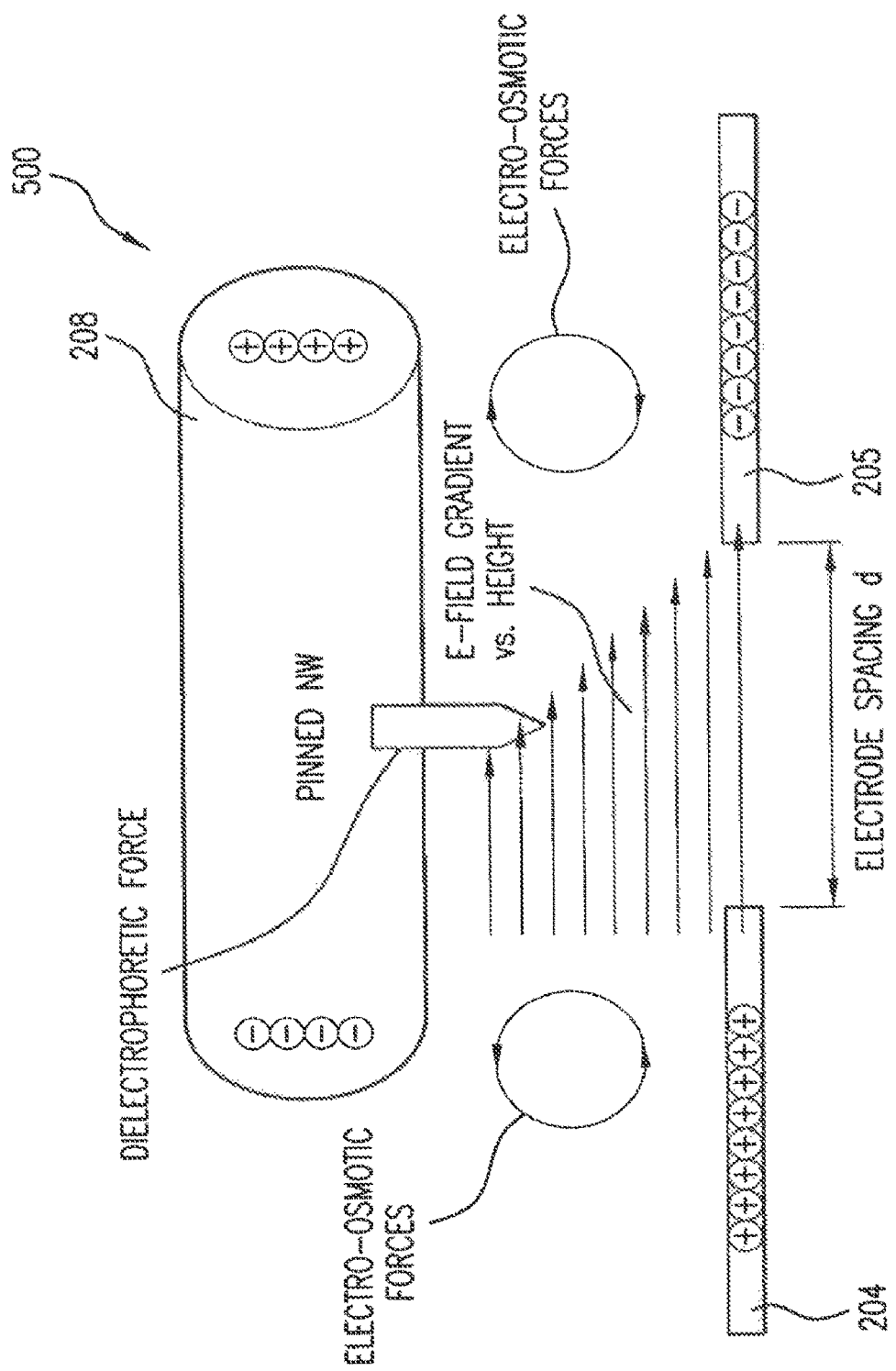
FIG. 5 is a schematic showing the alignment and association of a nanowire with an electrode pair in accordance with one embodiment of the present invention.

As represented in FIGS. 2 and 14a, flow channel 206 is initially filled with solvent (IPA) 1402 and subsequently with nanowire (NW) ink 1404 of a desired concentration. After introduction of a uniform film of NW ink over the wafer surface 202 the electric field is applied to the electrode (204, 205, 207) pattern. E-field parameters were about f=500 Hz and V=1 Vpp. The NWs subject to these conditions are observed to be captured/associated from suspension onto the electrodes with their long axis parallel to the electric field direction. The association can occur with the NWs pre-aligned in a fluid flow or pulled non-aligned from a stationary suspension. The NWs are observed to align adjacent to each other and exhibit a mobility along the electrode bars. This state of NW capture is referred to as weak NW "pinning" or association 1406 and is illustrated in FIGS. 5 and 8a. The mobility can be used to achieve a uniform high packing density of NWs per unit electrode width. An exemplary NW deposition density is on the order of 1 NW per micron (distance is along electrode length). The NW pinning is believed to caused by an equilibrium between the attractive dielectrophoretic force and the repulsive electro-osmotic force (see FIG. 5). The next step in the process (referred to as "NW align" 1408 or alignment modulation) involves increasing the frequency to f=10 kHz with the same AC amplitude. This step aligns the NWs parallel to each other in a less mobile state (strong pinning) possibly due to the higher dielectrophoretic force acting on the induced dipole moment of the NW. The next step in the process involves increasing the AC signal amplitude to V=4 Vpp at f=10 kHz. This change in E-field parameters initiates a so-called NW "locking" or coupling 1410 onto the electrodes. The locked NW state is depicted in FIGS. 11 and 8*b*. In this state, the NWs exhibit very little, if any, mobility along the electrode bars (possibly due to van der Waals forces active between the NWs and the electrodes). The NWs matched appropriately to the electrode geometry are locked sufficiently to be robust with respect to high fluid flow shear forces. However, NWs not matched to the electrode geometry (e.g., short NWs), curly NWs, crossed NWs or branched NWs are observed to be released from the electrodes during the "NW release" process step 1412. If the desired NW deposition density is not achieved (as determined in step 1414), then the process steps from "NW pin" through "NW release" are repeated (1406-1412). When the desired NW deposition density is achieved (as determined in step 1414), then the E-field is switched off and the channel is flushed with solvent (IPA) 1420 (suitably on the order of a few hundred microliters to several mL of fluid is used). Finally the channel is allowed to dry through evaporation of the solvent 1422. Several variations of the electrical parameters have been observed to result in NW deposition. Specifically, the use of amplitude modulation was found to yield a high degree of parallel alignment of NWs across the electrodes. In the "NW pin" step a modulation frequency of 100 Hz with 100% modulation index (ratio of amplitude of the field:amplitude of the carrier) was used. Under these conditions the NWs tend to be captured primarily in a parallel orientation up to high NW deposition densities (2 NW per micron). Moreover, crossed NWs are found to be unstable and can be removed by increasing the solvent flow velocity. Exemplary resulting NW deposition patterns are shown in FIGS. 9*a*-9*b*.

Example 2

Nanowire Coupling with CNOS Nanowires

Nanowires comprising a CNOS composition (Si core), with a TaAlN outermost shell, were prepared utilizing standard growth an harvesting techniques (see e.g., Gudiksen et al (2000) "Diameter-selective synthesis of semiconductor nanowires" J. Am. Chem. Soc. 122, 8801-8802; Cui et al. (2001), "Diameter-controlled synthesis of single-crystal silicon nanowires" Appl. Phys. Lett. 78, 2214-2216; Gudiksen et al. (2001), and "Synthetic control of the diameter and length of single crystal semiconductor nanowires" J. Phys. Chem. B 105, 4062-4064). Nanowires were about 22 microns in length and about 100 nm in diameter. Suspensions of nanowires at both moderate density and low density (10-fold dilution of moderate density suspension) were prepared in isopropanol (IPA).

A 500 micron thick, 4 inch diameter quartz substrate was patterned with a plurality of Moly (Mo) electrodes, each of which was approximately 400 Å thick, and about 15 microns or about 30 microns in width. The electrodes were positioned such that electrode pairs were separated by about 20 microns (i.e., just slightly less than the length of the nanowires sought to be aligned and coupled). A flow channel prepared from Polydimethylsiloxane (PDMS) was then filled with the nanowire suspension (by injecting a droplet of the nanowire suspension into the channel inlet). Capillary driven flow then fills the channel initially and then flow begins after a few seconds. The nanowires were typically pre-aligned with the flow parallel to the eventual electric field direction.

An initial AC electric field was generated using a frequency of about 10 kHz and an amplitude of about 1V. The peak AC field was about 250 V/cm. This low frequency allowed alignment and association of the nanowires from the suspension onto the electrode pairs. The frequency of the electric field was then modulated to about 10 kHz-300 kHz to allow the nanowires to couple onto the electrode pairs.

The channel was then flushed with IPA to remove uncoupled nanowires. The channel and the coupled nanowires were then dried. During the drying step the voltage was increased to above about 4V so as to maintain the nanowires coupled onto the electrodes.

The results of this experiment produced nanowire densities of 1 nanowire per about 4-6 microns (low density solution) and 1 nanowire per about 1-3 microns (high density suspension). Some crossing or clumping of nanowires was observed, but generally the wires were aligned and relatively evenly spaced. In addition, some misalignment and crossing was observed to occur during the drying process. It was determined that the best nanowire deposition occurred for nanowires of a length that were closely matched to the gap between electrode pairs (i.e., nanowires of about 20 microns in length).

Example 3

Nanowire Coupling on 10×10 Array

Nanowires comprising a CNOS composition (Si core), with a TaAlN outermost shell, were prepared utilizing standard growth an harvesting techniques (see e.g., Gudiksen et al (2000) "Diameter-selective synthesis of semiconductor nanowires" J. Am. Chem. Soc. 122, 8801-8802; Cui et al. (2001), "Diameter-controlled synthesis of single-crystal silicon nanowires" Appl. Phys. Lett. 78, 2214-2216; Gudiksen et al. (2001), and "Synthetic control of the diameter and length of single crystal semiconductor nanowires" J. Phys. Chem. B 105, 4062-4064). Nanowires were about 22 microns in length and about 100 nm in diameter. Suspensions of nanowires at both moderate density and low density (10-fold dilution of moderate density suspension) were prepared in isopropanol (IPA).

A 500 micron thick, 4 inch diameter quartz substrate was patterned with a 10×10 array of Moly (Mo) electrode pairs (i.e., 100 total electrode pairs, 200 total electrodes), each of which was approximately 400 Å thick, and about 30 microns in width. The electrodes were positioned such that electrode pairs were separated by about 20 microns (i.e., just slightly less than the length of the nanowires sought to be aligned and coupled). A flow channel prepared from Polydimethylsiloxane (PDMS) was then filled with the nanowire suspension (by injecting a droplet of the nanowire suspension into the channel inlet). Capillary driven flow then fills the channel initially and then flow begins after a few seconds. The nanowires were typically pre-aligned with the flow parallel to the eventual electric field direction.

An initial AC electric field was generated using a frequency of about 500 Hz and an amplitude of about 1V. The peak AC field was about 250V/cm. This low frequency allowed alignment and association of the nanowires from the suspension onto the electrode pairs. The frequency of the electric field was then modulated to about 10 kHz and the amplitude modulated to about 4V to allow the nanowires to couple onto the electrode pairs. The channel was then flushed with IPA to remove uncoupled nanowires. The channel and the coupled nanowires were then dried The results of this experiment produced relatively uniform deposition of nanowires on each of the 10 electrode pairs. For the low density nanowire suspension, a mean number of 4.75 nanowires were deposited at each electrode pair, with a standard deviation of distribution of 2.2. For the medium density nanowire suspension, a mean number of 10.8 nanowires were deposited at each electrode pair, with a standard deviation of distribution of 2.5. The spatial distribution across the array was fairly uniform.

Example 4

Multiple Nanowire Deposition Cycles

The process described above in Examples 1 and 2 was utilized to prepare, associate and couple nanowires to electrode pairs arranged in a 66 micrometer array. Following the initial association and coupling phases, a density of about one nanowire per 5 microns was achieved (see FIG. 9a).

The association and coupling phases were then repeated in order to achieve a higher nanowire density. The results are represented in FIG. 9b, and a nanowire density of about one nanowire per 1.8 microns was achieved.

The use of multiple deposition cycles allows for the generation of a higher density of nanowires while using a smaller concentration or smaller volume of nanowire suspension, and also achieving fairly uniform electrode filling.

Example 5

Nanowire Alignment Using Waveguide-Generated AC Field

Nanowires comprising a CNOS composition (Si core), with a TaAlN outermost shell, were prepared utilizing standard growth an harvesting techniques (see e.g., Gudiksen et al (2000) "Diameter-selective synthesis of semiconductor nanowires" J. Am. Chem. Soc. 122, 8801-8802; Cui et al. (2001), "Diameter-controlled synthesis of single-crystal silicon nanowires" Appl. Phys. Lett. 78, 2214-2216; Gudiksen et al. (2001), and "Synthetic control of the diameter and length of single crystal semiconductor nanowires" J. Phys. Chem. B 105, 4062-4064). Nanowires were about 20 microns in length and about 100 nm in diameter. Suspensions of nanowires at high, moderate, and low density (10-fold dilutions) were prepared in isopropanol (IPA).

A 500 micron thick, 4 inch diameter quartz substrate was patterned with approximately 25 Cr/Au electrode pairs, each electrode of which was approximately 1500 Å thick, and about 50 microns in width, and each of which had a "sawtooth" pattern. The electrodes were positioned such that electrode pairs were separated by about 20 microns (i.e., just slightly less than the length of the nanowires sought to be aligned and coupled). A flow channel prepared from Polydimethylsiloxane (PDMS) (100 microns high, 5 mm in width, at an angle of about 1.5° with respect to horizontal) was then filled with the nanowire suspension (by injecting a droplet of the nanowire suspension into the channel inlet). Capillary driven flow then fills the channel initially and then flow begins after a few seconds. The nanowires were typically pre aligned with the flow parallel to the eventual electric field direction.

An AC electric field was generated using a waveguide frequency of about 2.45 GHz, with an initial power input of 100 W. The total irradiation time was approximately 5 minutes, and 4 different antenna lengths were examined (0.5 mm, 1 mm, 2 mm and 5 mm).

The results of this experiment demonstrated that the AC electric field generated using a waveguide could be used to align and then couple nanowires onto electrode pairs. Electrodes outside of the waveguide did not demonstrate any nanowire deposition. At a low density nanowire suspension, nanowires were deposited at a density of about six nanowires per 50 microns of electrode width. The medium density nanowire suspension deposited approximately 12 nanowires per 50 microns of electrode width. The high density nanowire suspension deposited approximately 20-40 nanowires per 50 microns of electrode width.

Example 6

Nanowire Association and Removal

Figure 22A:
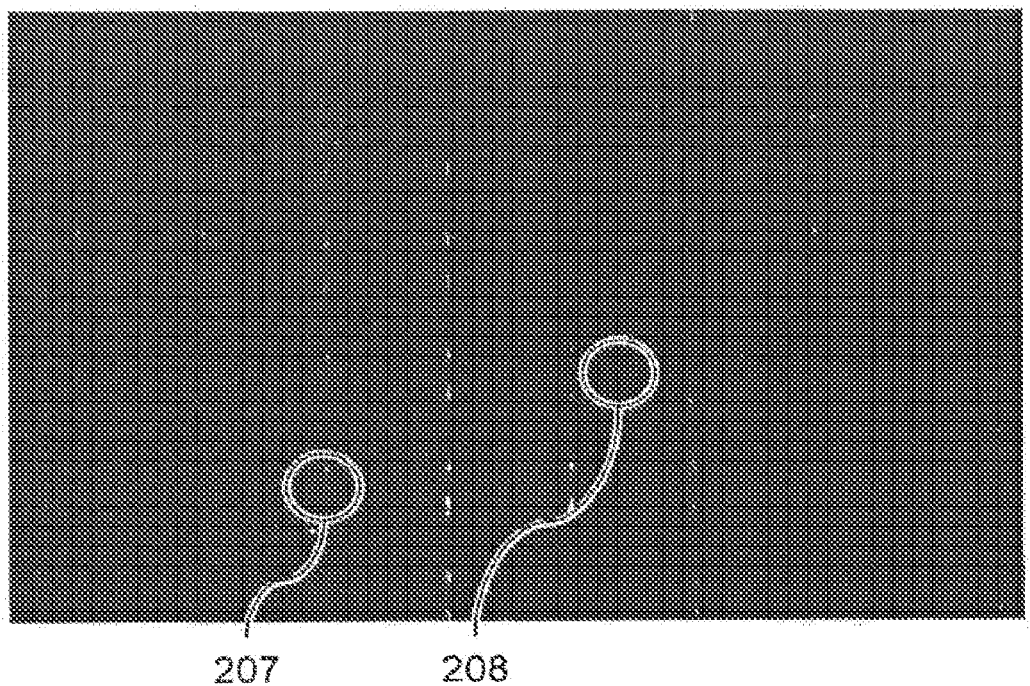
FIGS. 22A-22F show micrographs depicting nanowire association as well as nanowire removal, in accordance with one embodiment of the present invention.

FIGS. 22A-22F depict a series of micrographs showing nanowire association, followed by nanowire removal utilizing the various methods described throughout. FIG. 22A depicts a series of electrode pairs 207 positioned on a substrate. The micrograph is taken from above the substrate/electrode pairs. Nanowires have been introduced into the flow channel, and are visible as blurred objects above the electrode pairs. Also present in the flow channel is a removal electrode above the electrode pairs, although it is not visible in the micrograph as it is above the visual plane of the optical imaging system used to visualize the nanowires. In FIG. 22A, no electric field has been generated between the electrode pairs or at the removal electrode.

Figure 22B:
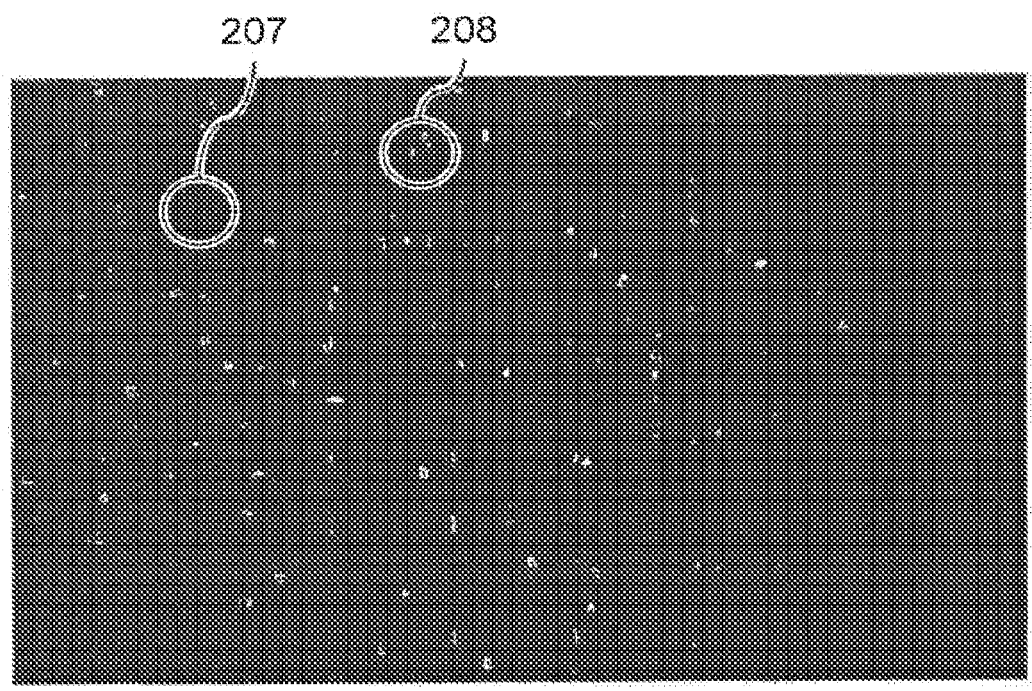

In FIG. 22B, an AC electric field having a frequency of about 500 Hz and an amplitude of about 500 mV peak-to-peak has been generated between the various electrode pairs on the substrate. In addition, a DC field having an amplitude of about −2.5 V has been generated at the removal electrode. This negative polarity DC field helps to manipulate nanowires 208 toward the electrode pairs 207 at the bottom of the flow channel. The alternating current at the electrode pairs begins to align and associate the nanowires with the electrode pairs.

Figure 22C:
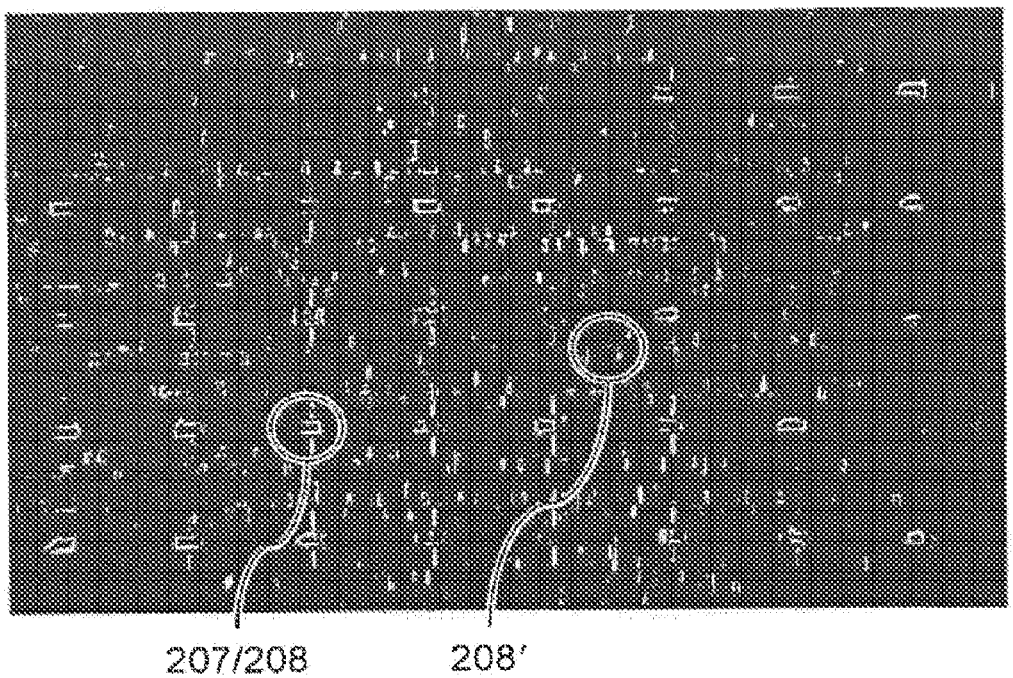

In FIG. 22C, nanowires can be seen to begin to associate between the electrode pairs (207/208) in a very well-aligned manner. Nanowires can also be seen to associate with the bus lines that supply current to the electrode pairs (208'). Both the AC and DC currents are maintained at the same frequencies and amplitudes as in FIG. 22B.

Figure 22D:
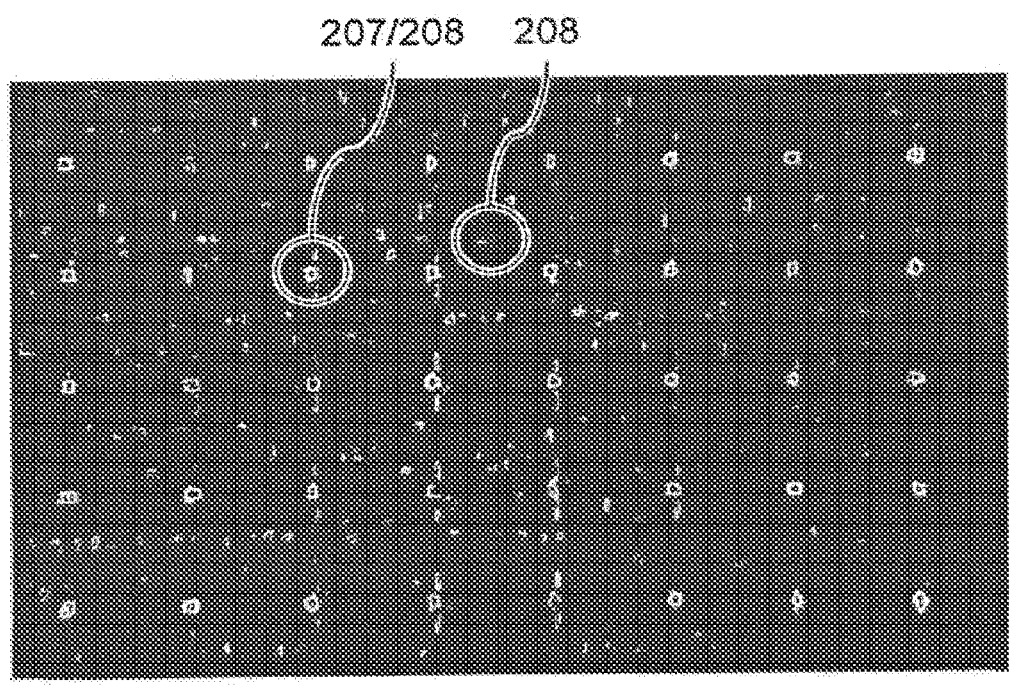

In FIG. 22D, while the AC current is maintained at 500 mV and 500 Hz, the DC current at the removal electrode is switched to about +800 mV. Nanowires 208 that were associated with the bus lines, as well as those weakly associated/misaligned with the electrode pairs are drawn upward in the flow channel, away from the surface of the substrate and the electrode pairs. Aligned, associated nanowires however are still present between the various electrode pairs (207/208).

Figure 22E:
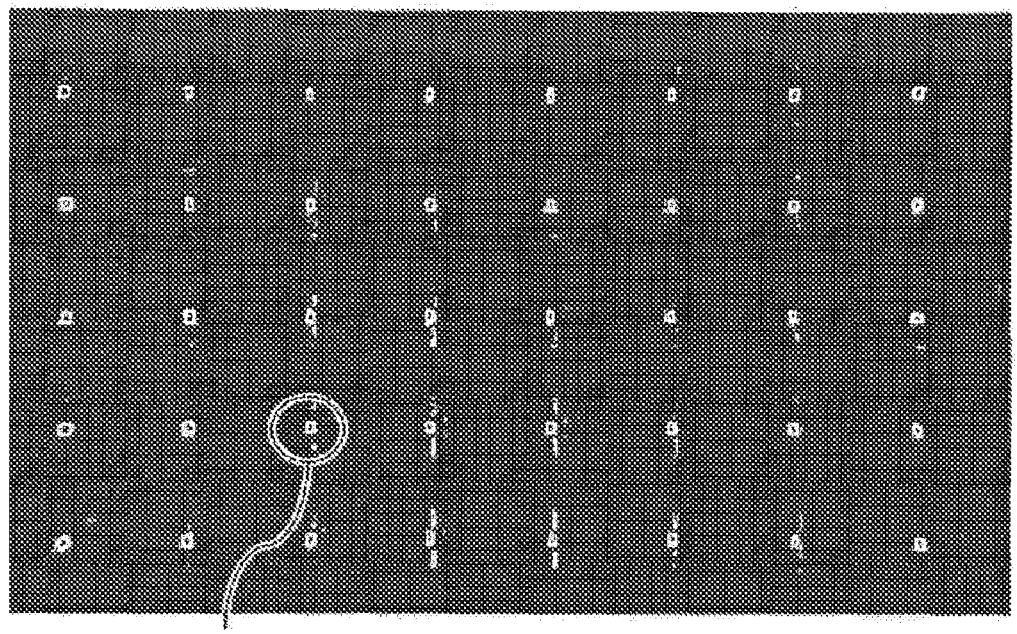

In FIG. 22E, the AC current is maintained at 500 mV and 500 kHz, but the DC current is increased to +2.5 V at the removal electrode. This continues to draw nanowires upward toward the removal electrode, and also helps to maintain them near the center of the flow channel. Nanowires are then flushed away by flowing a solution of IPA. Comparing FIG. 22E to 22D, a large number of nanowires have been removed from the flow channel.

Figure 22F:
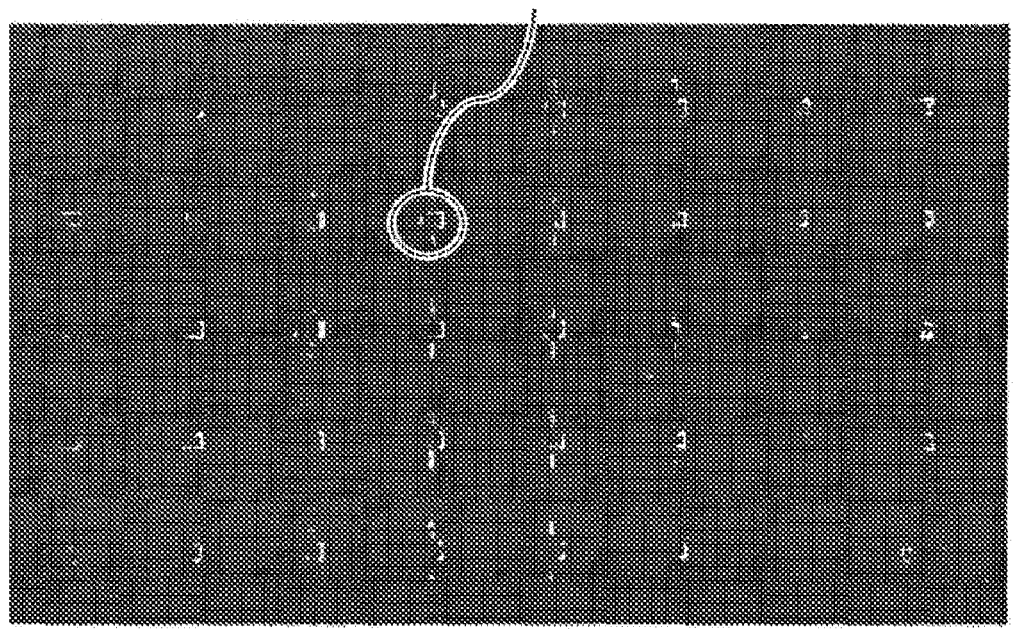

In FIG. 22F, the flow of IPA is stopped and the current at the DC electrode is turned off. The AC current at the electrode pairs is maintained however, continuing to keep the nanowires aligned and associated with the electrode pairs (207/208). Very few, if any, un-associated/misaligned nanowires are present in FIG. 22F. In suitable embodiments, the current between the electrode pairs is then modulated, as described herein, in order to couple/lock the nanowires to the electrode pairs. In further embodiments, the AC field can be modulated and the nanowires coupled to the electrode pairs prior to the generation of a positive DC current at the removal electrode.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are herein incorporated by reference to the same extent as if each individual publication, patent or patent application was specifically and individually indicated to be incorporated by reference.

What is claimed is:

1. A system for positioning nanowires on a substrate, comprising:
   (a) a suspension comprising a plurality of nanowires;
   (b) a substrate comprising one or more electrode pairs; and
   (c) a signal generator for generating an alternating current (AC) electric field between the electrode pairs, and for modulating the AC electric field.

2. The system of claim 1, further comprising means for flowing the suspension comprising a plurality of nanowires over at least one of the electrode pairs.

3. The system of claim 1, further comprising an optical imaging system for visualizing the nanowires.

4. The system of claim 1, comprising a fluid flow control system for controlling fluid flow of the nanowire suspension.

5. The system of claim 4, wherein the flow control system is a fixture adapted to be coupled to an underside of the substrate.

6. The system of claim 1, further comprising one or more field electrodes for manipulating the nanowires in suspension on the substrate.

7. The system of claim 1, wherein the nanowires comprise a core and one or more shell layers.

8. The system of claim 7, wherein the core comprises a semiconductor and at least one of the shell layers comprises a metal.

9. The system of claim 1, further comprising a signal monitoring device for determining the signal at the one or more electrode pairs and means for stopping the AC electric field when the signal attains a pre-set value.

10. The system of claim 1, wherein the substrate comprises one or more metallic elements positioned between electrodes of the electrode pairs.

11. The system of claim 1, wherein a first electrode of an electrode pair comprises a greater nanowire contact surface area than a second electrode of the electrode pair.

12. A system for manipulating nanowires in a solution, comprising:
   (a) one or more electrode sets, each electrode set comprising a first electrode having a first polarity and a second electrode having a second polarity; and
   (b) a signal generator for generating an alternating current (AC) electric field between the first and second electrodes.

13. The system of claim 12, further comprising a system for positioning nanowires on a substrate, comprising:
   (c) a suspension comprising a plurality of nanowires;
   (d) a substrate comprising one or more electrode pairs; and
   (e) a signal generator for generating an alternating current (AC) electric field between the electrode pairs, and for modulating the AC electric field, wherein the substrate is positioned opposite the electrode sets.

14. The system of claim 13, further comprising means for flowing the suspension comprising a plurality of nanowires over at least one of the electrode pairs and over the electrode sets.

15. The system of claim 13, further comprising an optical imaging system for visualizing the nanowires.

16. The system of claim 13, comprising a fluid flow control system for controlling fluid flow of the nanowire suspension.

17. The system of claim 16, wherein the fluid flow control system is a fixture adapted to be coupled to an underside of the substrate.

18. The system of claim 13, wherein the nanowires comprise a core and one or more shell layers.

19. The system of claim 18, wherein the core comprises a semiconductor and at least one of the shell layers comprises a metal.

20. The system of claim 13, further comprising a signal monitoring device for determining the signal at the one or more electrode pairs and means for stopping the AC electric field when the signal attains a pre-set value.

21. The system of claim 13, wherein the substrate comprises one or more metallic elements positioned between electrodes of the electrode pairs.

22. The system of claim 13, wherein a first electrode of an electrode pair comprises a greater nanowire contact surface area than a second electrode of the electrode pair.

23. A system for positioning nanowires on a substrate, comprising:
   (a) a suspension comprising a plurality of nanowires;
   (b) a substrate comprising one or more electrode pairs and one or more nanowire-adhering regions; and
   (c) a signal generator for generating an alternating current (AC) electric field between the electrode pairs, and for modulating the AC electric field.

24. The system of claim 23, further comprising means for flowing the suspension comprising a plurality of nanowires over at least one of the electrode pairs and the one or more nanowire-adhering regions.

25. The system of claim 23, further comprising an optical imaging system for visualizing the nanowires.

26. The system of claim 23, comprising a fluid flow control system for controlling fluid flow of the nanowire suspension.

27. The system of claim 26, wherein the flow control system is a fixture adapted to be coupled to an underside of the substrate.

28. The system of claim 23, further comprising one or more field electrodes for manipulating the nanowires in suspension on the substrate.

29. The system of claim 23, wherein the nanowires comprise a core and one or more shell layers.

30. The system of claim 29, wherein the core comprises a semiconductor and at least one of the shell layers comprises a metal.

31. The system of claim 23, further comprising a signal monitoring device for determining the signal at the one or more electrode pairs and means for stopping the AC electric field when the signal attains a pre-set value.

32. The system of claim 23, wherein the substrate comprises one or more metallic elements positioned between electrodes of the electrode pairs.

33. The system of claim 23, wherein a first electrode of an electrode pair comprises a greater nanowire contact surface area than a second electrode of the electrode pair.

34. The system of claim 23, wherein the nanowire-adhering regions are separated by a distance of between about 1 cm and about 100 cm.

35. The system of claim 23, wherein the nanowire-adhering regions are positively charged.

36. The system of claim 23, wherein the nanowire-adhering regions comprise Al2O3 or a nitride.

* * * * *

UNITED STATES PATENT AND TRADEMARK OFFICE
CERTIFICATE OF CORRECTION

| | | |
|---|---|---|
| PATENT NO. | : 8,252,164 B2 | Page 1 of 1 |
| APPLICATION NO. | : 13/113680 | |
| DATED | : August 28, 2012 | |
| INVENTOR(S) | : Martin et al. | |

It is certified that error appears in the above-identified patent and that said Letters Patent is hereby corrected as shown below:

Title page, please include as item (60), --Provisional application No. 60/857,765, filed on Nov. 9, 2006, provisional application No. 60/924,057, filed on Apr. 27, 2007.--

Signed and Sealed this
Twentieth Day of November, 2012

David J. Kappos
*Director of the United States Patent and Trademark Office*